United States Patent [19]

Nathan et al.

[11] Patent Number: 5,680,073

[45] Date of Patent: Oct. 21, 1997

[54] CONTROLLED SEMICONDUCTOR CAPACITORS

[75] Inventors: Menachem Nathan, Ramat Aviv; Leonid Zolotarevski, Tel Aviv; Olga Zolotarevski, Tel Aviv; German Ashkinazi, Tel Aviv; Boris Meyler, Ramat Gan, all of Israel

[73] Assignee: Ramot University Authority for Applied Research & Industrial Development Ltd., Tel Aviv, Israel

[21] Appl. No.: 381,973

[22] PCT Filed: May 31, 1994

[86] PCT No.: PCT/US94/06144

§ 371 Date: Feb. 6, 1995

§ 102(e) Date: Feb. 6, 1995

[87] PCT Pub. No.: WO94/29960

PCT Pub. Date: Dec. 22, 1994

[30] Foreign Application Priority Data

Jun. 8, 1993 [IL] Israel ............................. 105952

[51] Int. Cl.$^6$ ................. H03K 5/00; H03B 7/12
[52] U.S. Cl. ................. 327/586; 327/493; 327/503; 327/504; 327/583
[58] Field of Search ............... 327/493, 498, 327/499, 500, 502–505, 568, 570, 571, 583–586

[56] References Cited

U.S. PATENT DOCUMENTS

| 2,723,355 | 11/1955 | Graham | 327/504 |
|---|---|---|---|
| 2,917,717 | 1/1959 | Thorsen | 327/504 |
| 3,123,723 | 3/1964 | Wieder | 327/128 |
| 3,162,817 | 12/1964 | MacIntyre | 327/505 |
| 3,167,730 | 1/1965 | Anderson | 327/504 |
| 3,289,065 | 11/1966 | Dehmelt et al. | 327/583 |
| 3,374,366 | 3/1968 | Kleinberg | 327/484 |
| 3,519,330 | 7/1970 | Heilmeier | 327/583 |
| 3,654,498 | 4/1972 | Chapron . | |
| 3,860,915 | 1/1975 | Geier et al. | 327/493 |
| 3,911,298 | 10/1975 | Borsdorf et al. . | |
| 3,943,381 | 3/1976 | Uchidoi | 327/493 |

(List continued on next page.)

FOREIGN PATENT DOCUMENTS

| 001208349 | 1/1966 | Germany | 327/504 |
|---|---|---|---|
| 356002681 | 1/1981 | Japan | 327/493 |

OTHER PUBLICATIONS

Microelectronic Circuits by Sedra/Smith 1991, pp. 96–99, 175–181, 343–345.

Electronic Circuits by Donald L. Schilling 1989, pp. 41–45, 51–54.

The PN Junction Diode Gerold W. Neudeck, Robert F. Pierret, Feb. 1989.

Noise Isolation Switch for Commercial Broadband Power Amplifiers Used in Pulsed NMR (R.E. J Sears.)—Sep. 26, 1980.

*Primary Examiner*—Timothy P. Callahan
*Assistant Examiner*—T. T. Lam
*Attorney, Agent, or Firm*—Mark M. Friedman

[57] ABSTRACT

A controlled capacitor system, which includes a capacitor element (C1) and a forward-biased diode element (D2) connected in series with the capacitor element (C1). The system is such that the diode element (D2) has a capacitance which is less than the capacitance of the capacitance of the capacitor element (C1) when the diode element (D2) is under zero bias. The capacitance of the diode element (D2) is controlled by varying the forward current (I2) through the diode (D2). The forward current (I2) acting to control the capacitance of the diode element is selected such that the capacitance of the diode element (D2) is smaller than the capacitance of the capacitor element (C1) when the current (I2) through the diode element (D2) is below a minimum value. The capacitance of the diode element (D2) is bigger than the capacitance of the capacitor element (C1) when the current (I2) through the diode element (D2) exceeds a maximum value.

13 Claims, 28 Drawing Sheets

U.S. PATENT DOCUMENTS

| | | | |
|---|---|---|---|
| 4,032,802 | 6/1977 | Pan et al. | 307/311 |
| 4,156,838 | 5/1979 | Montague | 327/502 |
| 4,191,899 | 3/1980 | Tomczak et al. | |
| 4,387,386 | 6/1983 | Graver | 357/22 |
| 4,486,722 | 12/1984 | Landt | 327/503 |
| 4,574,201 | 3/1986 | Ohyama et al. | 324/493 |
| 4,638,269 | 1/1987 | Dawson et al. | 333/164 |
| 4,675,628 | 6/1987 | Rosen | 333/164 |
| 4,738,933 | 4/1988 | Richards | 437/15 |
| 4,937,639 | 6/1990 | Yao et al. | |
| 5,148,267 | 9/1992 | Ty Tan et al. | 357/16 |
| 5,166,083 | 11/1992 | Bayraktaroglu | 437/31 |
| 5,343,070 | 8/1994 | Goodrich et al. | 257/594 |

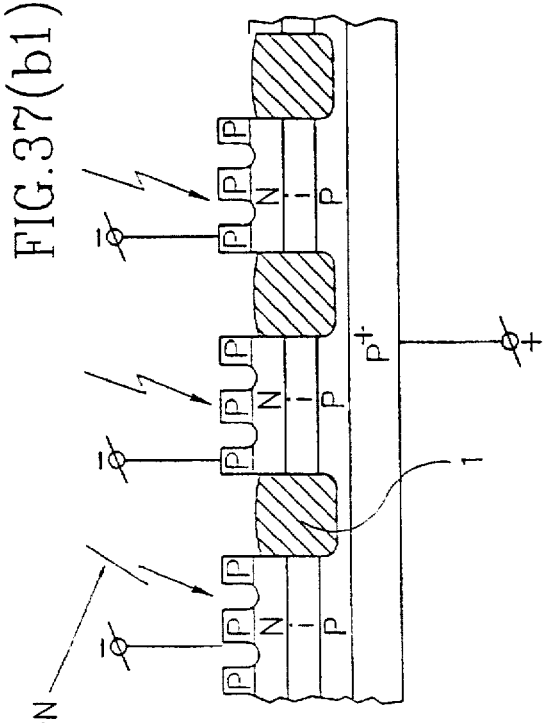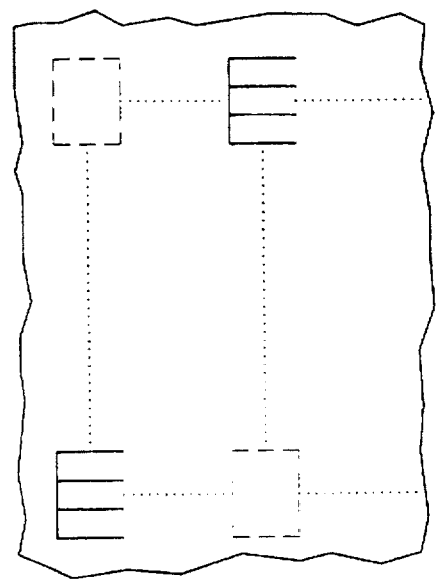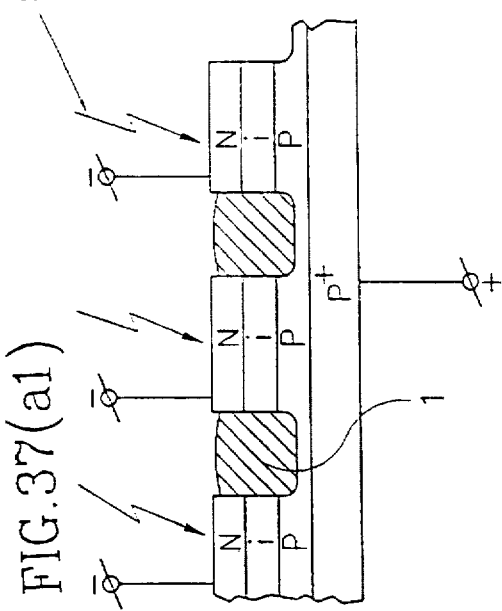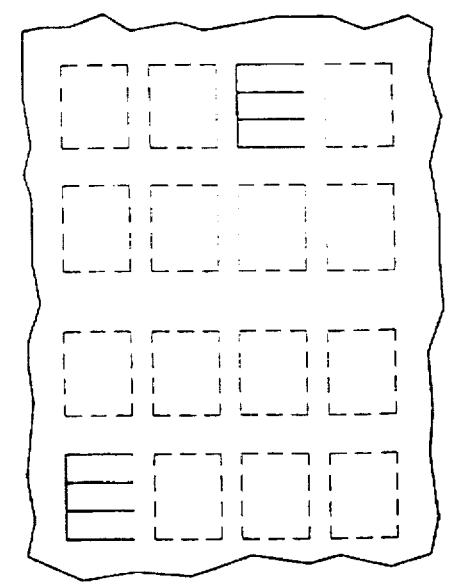

5,680,073

CONTROLLED SEMICONDUCTOR CAPACITORS

FIELD AND BACKGROUND OF THE INVENTION

The present invention relates to semiconductor devices and, more particularly, to a new class of semiconductor devices known as "controlled" semiconductor capacitors (CC's), in which the capacitance can be varied using an external control agent such as current or a form of radiation, such as light.

Various attempts have been made to develop devices which include the high-speed control of a capacitance by an external source. To date, these attempts have been largely unsuccessful.

Well known in the art are varactors, in which the capacitance is controlled by a voltage. However, varactors provide only a partial solution since their basis of operation inherently restricts the range of the maximum to minimum capacitance ratios ($C_{max}/C_{min}$) obtainable in a narrow range of voltage changes, and their operating voltage is relatively low.

Also known are certain novel and rather exotic devices which are based on quantum well technologies. However, the performance of these devices also leaves much to be desired.

There is thus a widely recognized need for, and it would be highly advantageous to have, capacitors in which the capacitance can be changed over a wide range at a fixed applied voltage by the action of external factors, such as current or radiation, and the like, and which will feature performance which significantly exceeds that possible with presently known devices.

SUMMARY OF THE INVENTION

According to the present invention there is provided a controlled capacitor system, comprising: (a) a capacitor element; and (b) a diode element connected in series with the capacitor element, the diode element being forward-biased, the system being further characterized in that: (i) the diode element has a capacitance which is less than the capacitance of the capacitor element when the diode element is under zero bias; (ii) the capacitance of the diode element is controlled by varying the forward current through the diode element; and (iii) the forward current acting to control the capacitance of the diode element is selected such that the capacitance of the diode element is smaller than the capacitance of the capacitor element when the current through the diode element is below a minimum value; and (iv) the capacitance of the diode element is bigger than the capacitance of the capacitor element when the current through the diode element exceeds a maximum value.

According to further features in preferred embodiments of the invention described below, the diode element or capacitor is shunted by a device selected from the group consisting of a variable resistor, a reverse-biased diode, a photodiode, a photoresistor and a radiation sensor.

According to still a further embodiment according to the present invention, the capacitor element is a reverse-biased diode.

According to features of a preferred embodiment of the present invention the diode element is a GaAs P⁺PiN diode fabricated on a P⁺ substrate having a carrier concentration in the i-region of less than $10^{12} cm^{-3}$.

The present invention successfully addresses the shortcomings of the presently known configurations by providing a controlled capacitor system which operates over a wide range of operating parameters and which features performance parameters which are significantly superior to those of presently known devices.

In principle, capacitance control can be effected using various combinations of traditional discrete elements such as semiconductor diodes arranged in suitable electrical circuits. However, the performance parameters of such devices, particularly in silicon, prevent a practical realization of such schemes or lead to schemes which are uneconomical.

According to the present invention, controlled capacitors can be fabricated using various techniques and devices. Preferably, these include using GaAs PiN diodes having a near-fully compensated i-region of controllable width, either alone or in combination with high-voltage GaAs Schottky diodes.

It appears that the most effective use of GaAs is in the context of light- or other radiation-controlled capacitors, which can take advantage of the advantages of its direct zone structure. It should be noted, however, that the principles of design and operation presented here allow development of controlled capacitors based on other semiconductor materials, if their properties and the fabrication technology allow the realization of these principles.

Controlled capacitors according to the present invention represent a new class of semiconductor devices having a wide range of possible applications in both high-power and low-power electronics and electrical engineering.

BRIEF DESCRIPTION OF THE DRAWINGS

The invention is herein described, by way of example only, with reference to the accompanying drawings, wherein:

FIG. 11b shows the equivalent circuit of FIG. 11a;

FIG. 37a shows a matrix design for controlled capacitor arrays with Schottky diodes as $D_1$. The top metal, or top metal and P-layer are etched in a "comb" form to allow penetration of radiation;

FIG. 37b shows a matrix design for controlled capacitor arrays with PN diodes as $D_1$. The top metal, or top metal and P-layer are etched in a "comb" form to allow penetration of radiation;

FIG. 50b shows the V(t) and C(t) dependencies of the scheme of FIG. 50a;

DESCRIPTION OF THE PREFERRED EMBODIMENTS

The present invention is of controlled semiconductor capacitors. Specifically, the present invention is of a family of capacitors whose capacitance can be changes quickly and effectively over wide ranges at a wide-ranging set of operating conditions.

The principles and operation of controlled capacitors according to the present invention may be better understood with reference to the drawings and the accompanying description.

Figure 1A:
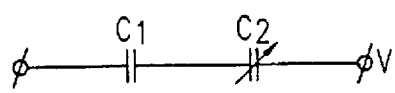
FIG. 1a is a schematic depiction of a series connection of a constant capacitor $C_1$ and a variable capacitor $C_2$.

Shown in FIG. 1a. is a simple circuit which includes two capacitors. The total capacitance, C, of two capacitors $C_1$ and $C_2$ connected in series is given by:

$$1/C = 1/C_1 + 1/C_2 \tag{1}$$

Capacitance $C_2$ can be quickly changed over a wide range of values using one or more influences or agencies. Assume, for the sake of exposition, that the range of variation of the capacitance $C_2$ is such that:

$C_2 < C_1$, whenever the influence is absent (or sufficiently weak)

$C_2 > C_1$, whenever the influence is sufficiently intense.

Figure 1B:
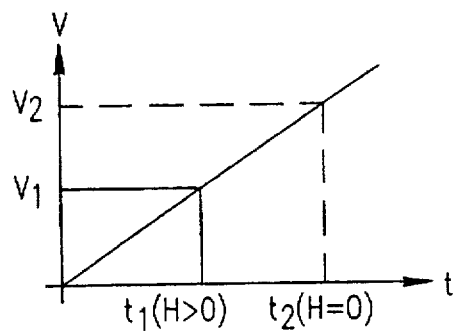
FIG. 1b is a representation of the dependence of the voltage on the capacitor over time. At time $t_1$ a source acts (H>0) to influence the capacitor $C_2$; at $t_2$ the influence ends (H=0)
Figure 2:
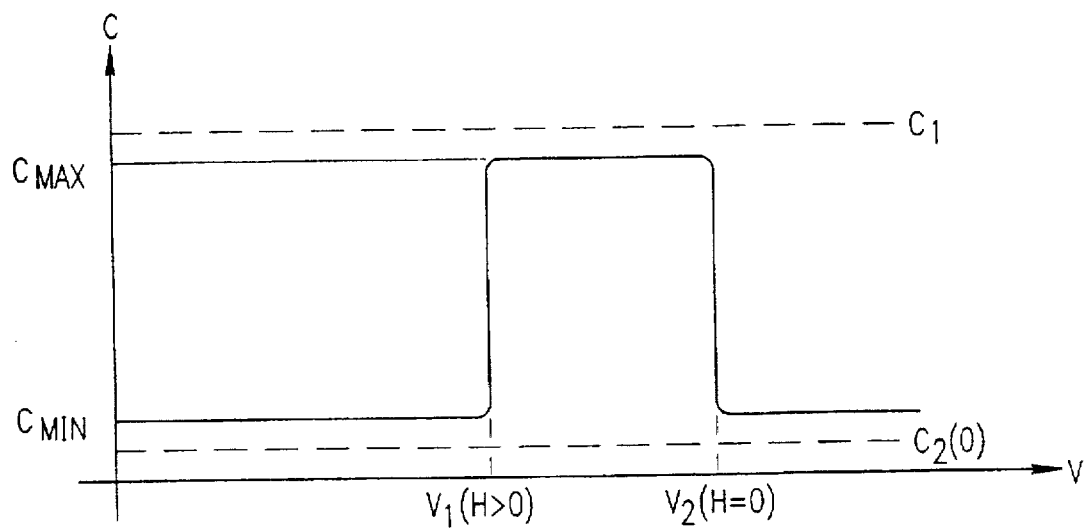
FIG. 2 is a the C-V curve of the scheme in FIG. 1a, which includes a jump in the capacitance at voltage $V_1$, when the external source acts (H>0) to increase the capacitance $C_2$. The influence ends at $V_2$.

Then, if the voltage on the capacitors increases with time as shown in FIG. 1b, and at a certain moment $t_1$ a source having an intensity H acts to influence the capacitor $C_2$, the C-V curve displays a jump of the capacitance at $V=V_1$ (FIG. 2). If $C_2 >> C_1$ then from Equation (1) one obtains that $C_{max} \to C_1$. At the end of the influence ($t_1$) the capacitance returns to the initial value of $C_{min}$ at $V=V_2$, and if $C_2 << C_1$, $C_{min} \to C_2$.

Figure 3A:
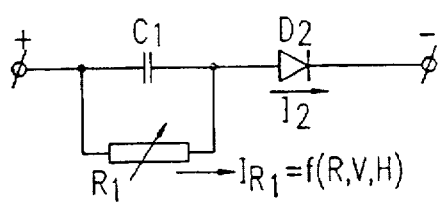
FIG. 3a is a schematic depiction of a series connection of a capacitor $C_1$ and a forward-biased semiconductor diode $D_2$. $C_1$ is shunted with a variable resistor $R_1$.
Figure 3B:
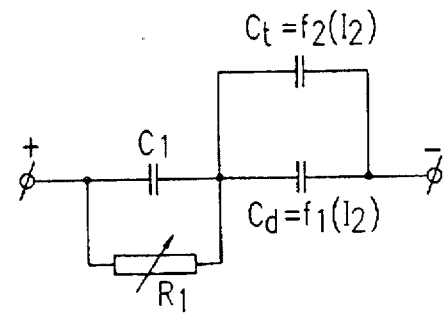
FIG. 3b shows the equivalent circuit of FIG. 3a: $C_f$-depletion capacitance of diode $D_2$. Both are functions of $I_2$, the current through $D_2$.

The above-described concept can be applied to the circuit of FIG. 3a, which is shown equivalently in FIG. 3b. The semiconductor diode $D_2$ in FIG. 3a is forward-biased by the applied voltage and is connected in series with capacitor $C_1$. Capacitor $C_1$ is shunted by a variable resistivity element $R_1$. In such a circuit, when the leakage current of the capacitor is sufficiently small or negligible, the current across diode $D_2$ will be determined mainly by the applied voltage and by the resistivity $R_1$.

A current controlled capacitor (CCC) according to the present invention causes the capacitance of diode $D_2$ to be regulated, or changed, by passing through the diode a forward current which is controlled by the resistivity $R_1$.

The operating principle of CCC's according to the present invention can be better understood with reference to FIG. 3 and the accompanying description.

When the leakage current of the capacitor $C_1$ is zero, the current through diode $D_2$ is given by $$I_2 = [V - V_2(I_2)]/R_1 \qquad (2)$$

where V is the applied external bias, and $V_2(I_2)$ is the forward voltage drop which is determined by the diode I-V characteristics. Remembering that the forward voltage drop on a PN junction or on a metal-semiconductor barrier does not exceed the contact potential $\psi$, which for most practical semiconductors does not exceed 1 V, then, when V>>1 V, the current through the diode is simply, $$I_2 \cong V/R_1 \qquad (3)$$

The equivalent circuit of a PN junction diode is shown in FIG. 3b. It is well known that a PN junction can be represented by two parallel capacitances, namely $C_1$, the "transition" or depletion region capacitance, and $C_d$, the diffusion capacitance. In surface-barrier devices in which the current is of majority carriers only, such as Schottky diodes, the diffusion capacitance is zero.

Figure 4:
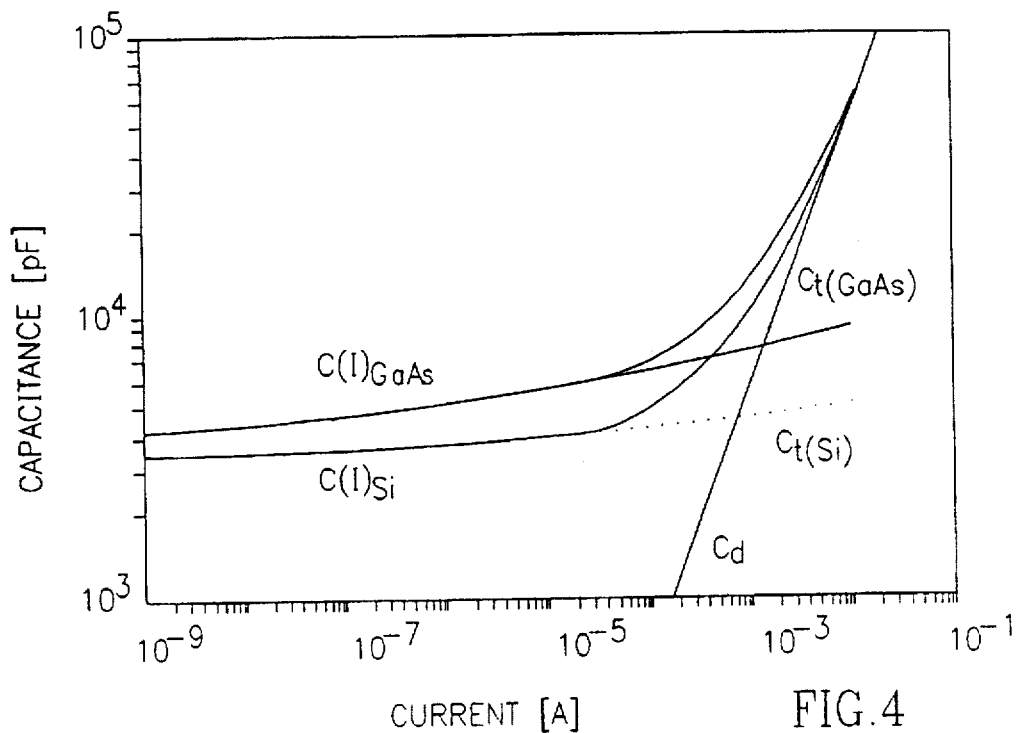
FIG. 4 features the calculated dependencies of the diffusion and depletion capacitances as well as the total capacitance as a function of the current through a GaAs and a Si diode.

The capacitance of a PN diode can be controlled within a wide range by changing the injection of minority carriers with forward current (the diffusion capacitance), and by changing the depletion region width (the depletion capacitance) (FIG. 4).

The diffusion capacitance of a diode $D_2$ is given by;

$$C_d = [A_2 q \tau / kT] j_0 \exp(qV_2/kT) = q \tau I_2/(kT) \qquad (4)$$

where $\tau$ is the lifetime of the carriers, $I_2$ is the current across the diode, and $A_2$ is the PN junction area. This expression is valid if the ratio of the low-doped base thickness, W, to the diffusion length L is greater than 1, i.e., W/L>1. If W/L<<1, a correction factor of W/2L must be introduced, i.e., $$C_d = (q \tau I_2/kT)(W/2L) \qquad (5)$$

Figure 5:
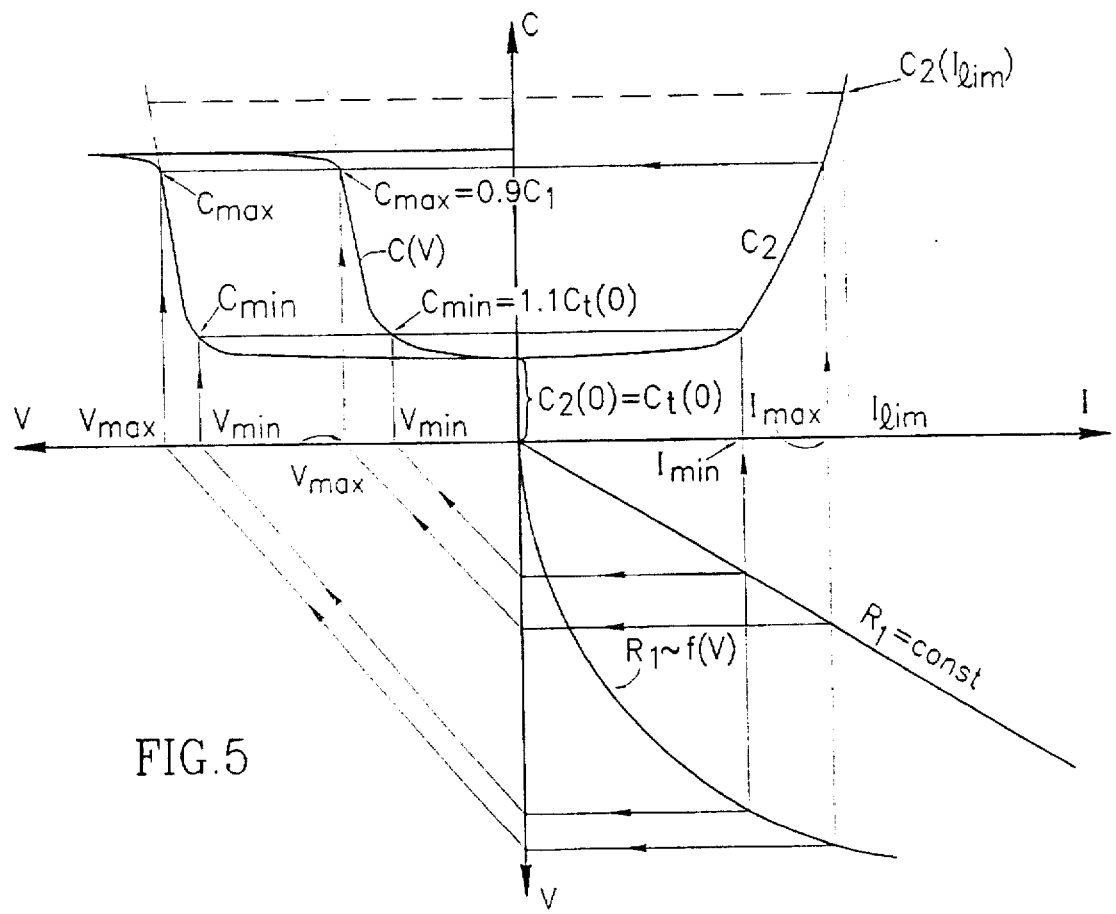
FIG. 5 is a graphic illustration of the C-V characteristics of the circuit shown in FIG. 3 for $R_1$=const and $R_1$=f(V)

The limit value of $C_2(I_{lim})$ shown in FIG. 5 and given in Equations (4) and (5) is determined by low or intermediate injection levels in the low-doped N region of the PN structure (in the case of a diode with an abrupt asymmetric PN junction, $N_a[P]>>N_d[N]$, where $N_a$ and $N_d$ are, respectively, the acceptor concentration in the P region and the donor concentration in the N region) or in the i-region of a PiN structure.

The limit value of the current density can be obtained from the conditions:

$$j_{lim} = (qD_p/L)p(0)_{lim}, \text{ if } W/L>>1, \qquad (6)$$

and $$j_{lim} = [p_{avg}(x) q W]/\tau, \text{ if } W/L<1 \qquad (7)$$

where p(0) is the concentration of injected carriers on the N-side boundary of the PN junction, and $p_{avg}(x)$ is the average concentration of injected carriers over the N-base. Assuming $p(0)_{lim} = N_d$, (or $(N_d - N_a)_i$ in any i-layer) and $p_{avg}(x)_{lim} = N_d$ and inserting into Equations (6,7), one obtains:

$$j_{lim} \cong qD_p N_d/L, \text{ if } W/L>1$$

$$j_{lim} \cong qWN_d/\tau, \text{ if } W/L<1 \qquad (8)$$

Taking $D_p \cong 10$ cm$^2$/sec, which is approximately the value of the diffusion coefficient of holes in low-doped Si and GaAs, $\tau \cong 100$ ns and $L \cong 10^{-3}$ cm, one obtains for W>20–30 µm:

$$j_{lim} \cong 1.6 \times 10^{-2} A/cm^2 \text{ when } N_d \cong 10^{14} cm^{-3}$$

$$j_{lim} \cong 1.6 \times 10^{-4} A/cm^2 \text{ when } N_d \cong 10^{12} cm^{-3}$$

and for W≅10 µm:

$$j_{lim} \cong 1.6 \times 10^{-1} A/cm^2 \text{ when } N_d \cong 10^{14} cm^{-3}$$

$$j_{lim} \cong 1.6 \times 10^{-3} A/cm^2 \text{ when } N_d \cong 10^{12} cm^{-3}$$

Thus, for any combination of parameters within a wide range of W and $N_d$ values, $j_{lim}$ will vary between 0.1 and 160 mA/cm$^2$. The calculation of $C_d$ from Equations (4) and (5) is valid only in the region where the current $I_2$ is lower than $I_{lim}$, i.e., where, $$I_2 \leq A_2 \times j_{lim} \qquad (9)$$

The depletion capacitance for an abrupt asymmetric PN junction ($N_a >> N_d$) can be found from Equation (10):

$$C_{t2} = A_2 \times [\epsilon \epsilon_0 q N_d / 2(\psi - V_2)]^{0.5} \qquad (10)$$

where $\psi$ is the contact potential:

$$\psi = (kT/q) \ln(N_a N_d / n_i^2) \qquad (11)$$

The forward voltage drop on diode $D_2$ is $$V_2 \cong V_j = (kT/q) \ln[(I_2/A_2)/j_0 + 1] \qquad (12)$$

where $V_j$ is the junction potential, and $$j_0 \cong (qD_p P_n)/L = [q(D_p)^{0.5} n_i^2]/[(\tau)^{0.5} N_d]$$

FIG. 4 shows the diffusion and depletion capacitances, as well as the total capacitance ($C_2$) of a GaAs and a Si diode ($N_d = 10^{14}$ cm$^{-3}$, $A_2 = 1$ cm$^2$) plotted against the current through the diode. In a wide current range from $10^{-11}$ to $10^{-4}$ A, the total diode capacitance is determined mainly by the depletion component and changes only slightly. Above current values of about $10^{-4}$ A, the diffusion capacitance begins to dominate, and the total capacitance increases very quickly to the value corresponding to $I_{lim}[C_2(I_{lim})]$.

From Equations (1–12) one obtains the following system of equations describing the dependence of the capacitance on the voltage in the circuit shown in FIG. 3 (if the current through the capacitor $C_1$ is zero):

$$1/C(V) = 1/C_1 + 1/[C_{12}(I_2) + C_{d2}(I_2)]$$

and $$I_2 = (V - V_2)/R_1 \cong V/R_1 \qquad (13)$$

A graphic illustration of the solution of system (13) for $R_1$(V)=const and $R_1$(V)=$V^{-n}$, is shown in FIG. 5. Using it one can explain the operating principle of the current controlled capacitor shown in FIG. 3. One can now determine the values of $C_{max}$ and $C_{min}$ and the corresponding values of $I_{max}$, $I_{min}$, $V_{max}$, $V_{min}$. $(C_{max})/(C_{min})$ and $\Delta C/\Delta V \equiv (C_{max} - C_{min})/(V_{max} - V_{min})$ in FIG. 5. $I_{min}$ and $I_{max}$ are obtained from generally accepted conditions:

$$C(V)_{max} = 0.9 C_1$$

and $$C(V)_{min} = 1.1 C_{f2}(0) \quad (14)$$

where $C_{f2}(0)$ is the capacitance of the diode $D_2$ at zero bias, i.e., when the current through the diode is zero, and $C_1$ is the capacitance of capacitor $C_1$. Inserting these conditions into the first equation of the Equation system (13) we obtain:

$$1/1.1C_{f2}(0) = 1/C_1 + 1/[C_{f2}(I_{min}) + C_{d2}(I_{min})]$$

$$1/0.9C_1 = 1/C_1 + 1/[C_{f2}(I_{max}) + C_{d2}(I_{max})] \quad (15)$$

$I_{min}$ and $I_{max}$ obtained from the solution of Equation system (15) are inserted into the second equation of Equation system (13) yielding $V_{min}$ and $V_{max}$ values:

$$V_{max} = R_1 \times I_{max}$$

and $$V_{min} = R_1 \times I_{min} \quad (16)$$

Using Equations (15) and (16) one can formulate the requirements for the parameters of diode $D_2$, capacitor $C_1$, and resistor $R_1$ (FIG. 3) in order to obtain the optimal values of $C_{max}/C_{min}$, $\Delta C/\Delta V$, $V_{min}$ and $V_{max}$.

FIG. 6 presents qualitatively the C-V characteristics of the circuit shown in FIG. 3 for resistors $R_1$ with various I-V characteristics. These characteristics are next examined in detail. The following points are to be noted.

Figure 6A:
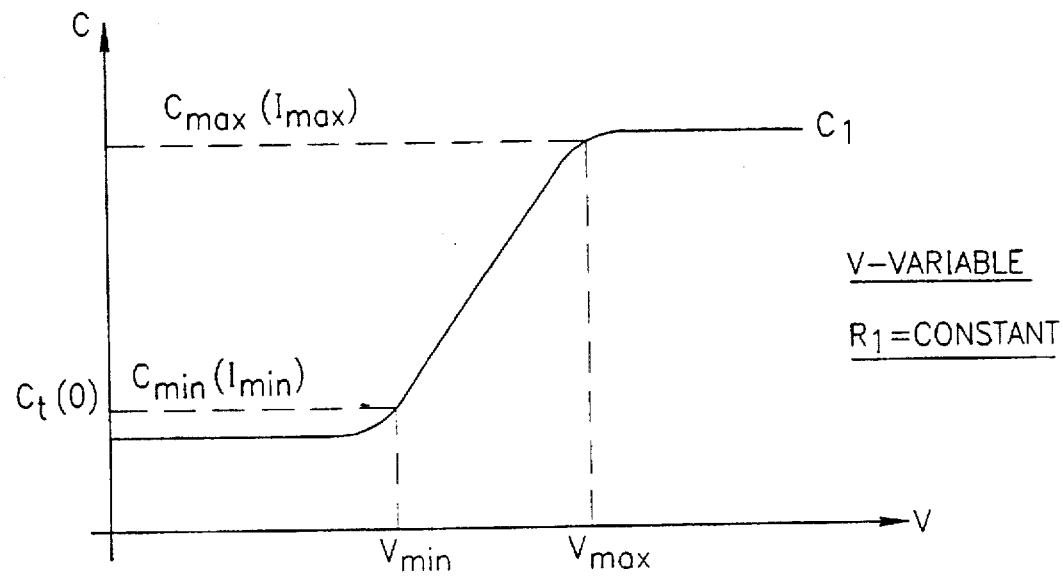
FIG. 6a, 6b, 6c and 6d are graphic illustrations of the C-V characteristics of the circuit shown in FIG. 3 for resistors $R_1$ with various I-V characteristics.

1) $R_1$=const (FIG. 6a). The current through the diode is determined by the voltage V. This case is straightforward. The smaller the resistance $R_1$, the lower will be $V_{max}$ and $V_{min}$, while the slope $\Delta C/\Delta V$ will increase (FIG. 5):

$$\Delta C/\Delta V \equiv (C_{max} - C_{min})/(I_{max} - I_{min}) R_1 \quad (17)$$

The limit value of $C_{max}/C_{min}$ is given by:

$$(C_{max}/C_{min})_{lim} \to C_1/C_2(0) \quad (18)$$

Figure 6B:
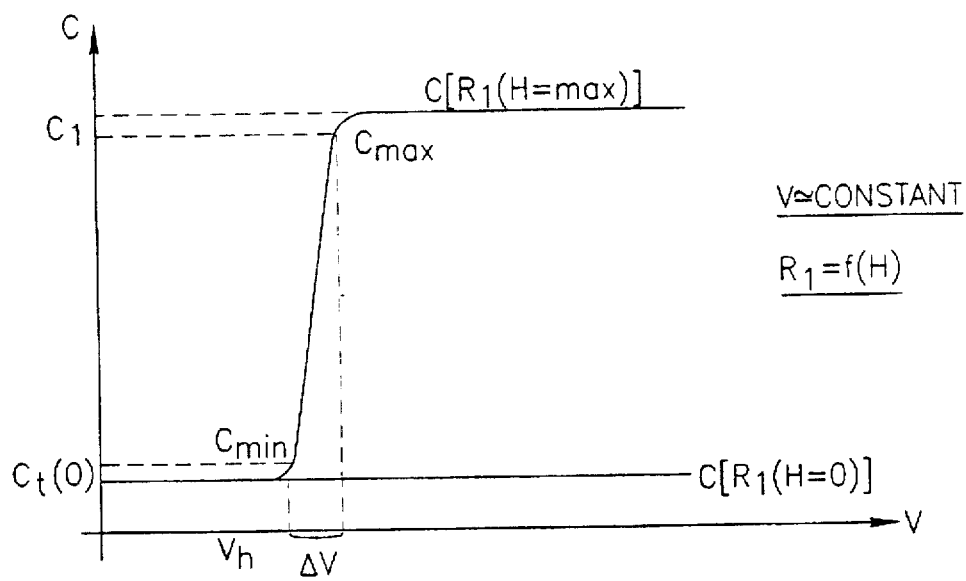

2) V≡constant, while the resistivity of the diode is changed abruptly (FIG. 6b). This case is realized when $R_1$ decreases abruptly because of the influence of external factors (e.g., a photoresistor under the influence of light, the breakdown of a dielectric upon reaching a critical field value, the avalanche breakdown of a PN junction, and the like). The C-V characteristics of such a case is shown in FIG. 6b. When the external influence is absent (H=0), the resistance $R_1$ is large, and the current through the diode, $I_2$, is lower than $I_{min}$ over the entire voltage range. In this case the capacitance of the circuit in FIG. 3 is voltage-independent and is determined by the value of the diode capacitance under zero bias. If now at some voltage $V_H$ an external influence of sufficient intensity $H_{max}$ is applied to the resistor $R_1$ (for example a photoresistor is illuminated), the resistance of $R_1$ will decrease abruptly, and the current through the diode will also increase abruptly to the $I_{max}$ value. In this case a capacitance "jump" superimposed on the C(V) dependence will appear. The slope of the curve $\Delta C/\Delta V$ is:

$$\Delta C/\Delta V \equiv (C_{max} - CC_{min})/[V_2(I_{max}) - V_2(I_{min})] \quad (19)$$

where $V_2(I_{max})$ and $V_2(I_{min})$ are the voltage drops across the diode, corresponding to $I_{max}$ and $I_{min}$, respectively.

It is to be noted that in this example the $\Delta C/\Delta V$ value can be rather large because the $\Delta V$ value can be a small fraction of a volt.

3) $R_1 \neq$const (non-linear resistor)

Figure 6C:
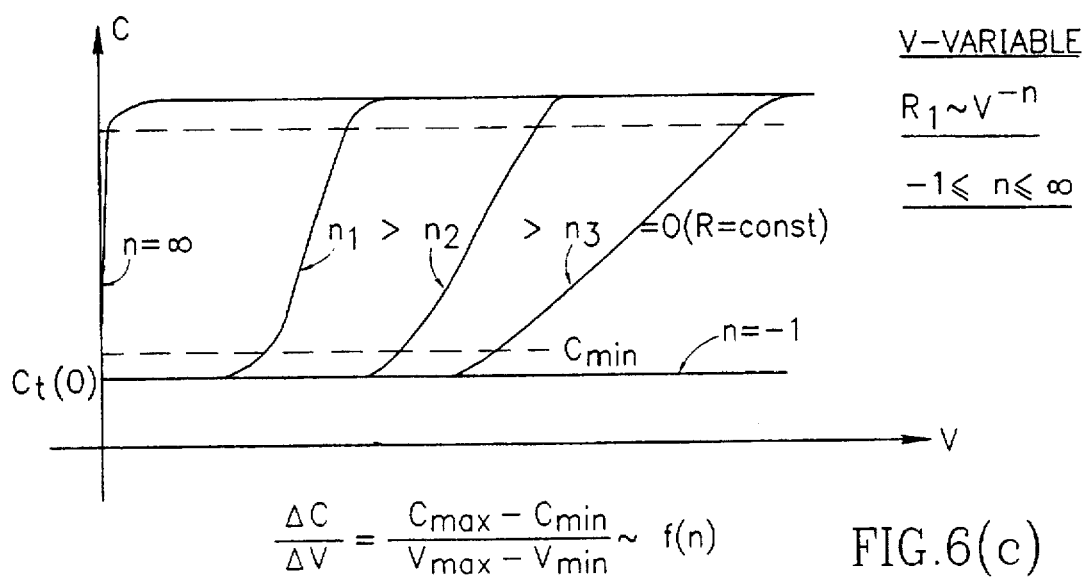
Figure 6D:
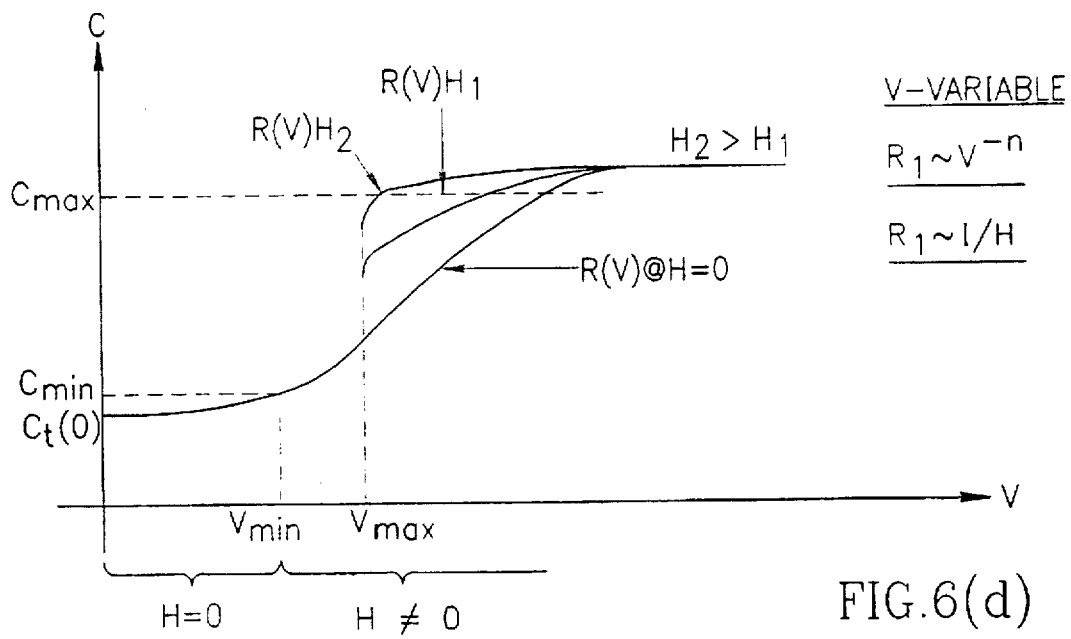

(a) Here $R_1$ is voltage-dependent ($R_1 \sim V^{-n}$, where $-1 < n \leq \psi$) and does not depend on external factors. The current through the diode in this case is $I_2 \sim V^{(1+n)}$ (R=const is a special case, when n=0). As can be seen in FIG. 6c, the threshold voltage and the slope $\Delta C/\Delta V$ depend on the n value. In many applications, $R_n$ can be replaced by a reverse-biased diode.

(b) A "composite" case (FIG. 6d) is obtained when $R_1$ depends on both the voltage ($R \sim V^{-n}$) and on the external factors ($R \sim 1/H$). Such a combined dependence, C(V,H), can be achieved by using as $R_1$ a diode connected in a reverse direction, with the I-V characteristics sensitive to the influence of external radiation.

Figure 7:
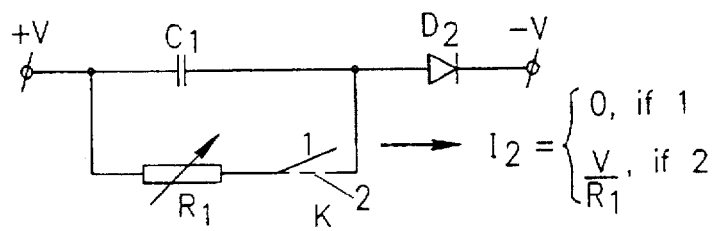
FIG. 7 is a schematic depiction of a hybrid, or non-integrated, or non-monolithic, construction based on a capacitor and a diode connection in series. A switch (K) is used to control the current through the diode.

In an embodiment shown in FIG. 7, a switch can be used to control the current through diode $D_2$. By mining on and off a switch (K) one can control the capacitance of the circuit at a given voltage. It is necessary only that when the switch is "on" (position 2), $I_2 \geq I_{max}$, and when it is "off" (position 1), $I_2 < I_{min}$, that is, the leakage current of the capacitor $C_1$ is not zero.

Figure 8:
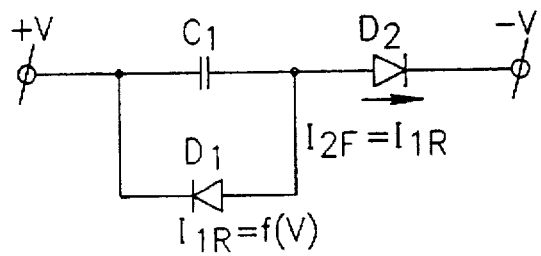
FIG. 8 is a schematic depiction of a hybrid construction using a reverse-biased diode $D_1$ as a resistor $R_1$.

Illustrated in FIG. 8 is the use of a reverse-biased diode $D_1$ as a resistor $R_1$. The current through diode $D_2$ is now determined by the reverse I-V characteristic of diode $D_1$. $D_1$ can be a PN diode or a surface-barrier diode (Schottky diode). The capacitance of $D_1$, $C_{D1}$, is added to the capacitance $C_1$:

$$C_1(V) = C_1 + C_{D1}(V) \quad (20)$$

The reverse current through diode $D_1$ is:

$$I(V) = A_1 \times j_v(V) \times M(V) + I_s(V) \quad (21)$$

where, $A_1$—the area of $D_1$;
$j_v(V)$—the volume component of the reverse current;
$I_s(V)$—the surface leakage current;
M(V)—the avalanche multiplication coefficient:

$$M(V) = 1/[1 - (V/V_{BR})^n] \quad (22)$$

$V_{BR}$—avalanche breakdown voltage; and
n—coefficient determined by the semiconductor material and by the parameters of the rectifying element.

The calculation of the I-V dependence is rather difficult because of the uncertainties in some parameters and components of the reverse current, such as m and $I_s$. It is therefore easier in most cases to use the experimental reverse I-V characteristics for the design and calculation of the current-controlled capacitors.

Figure 9:
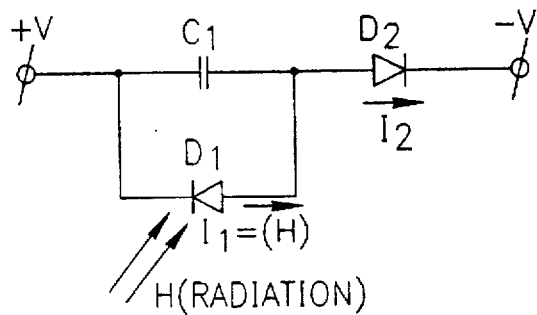
FIG. 9 is a schematic depiction of a construction in which the current through diode $D_2$ which is biased at a fixed voltage, is controlled by the action of an external factor (e.g. light) on the reverse biased diode $D_1$.

Another way to control the current through the diode at a given voltage is to act with an external factor on the reverse part of the I-V characteristic of diode $D_1$ (FIG. 9). The influencing factor may be visible light, infrared or ultraviolet radiation, X-ray or γ radiation, nuclear particle radiation, and the like. Each of these radiations influences the generation-recombination component of the reverse current, sometimes increasing it by many orders of magnitude. The practical implementation can be carried out by selecting an industrial diode or by designing a special diode which will satisfy the following requirements:

(1) the reverse current without external influence is lower than $I_{min}$ over a wide range of applied voltages;

(2) the action of an external influence of intensity H has to increase the reverse current up to $I_{max}$; and (3) a high sensitivity, i.e., a maximum value of $(I_{max}-I_{min})/H_{max}$ has to be obtained by the smallest possible $H_{max}$ value which corresponds to $I_{max}$.

Figure 10:
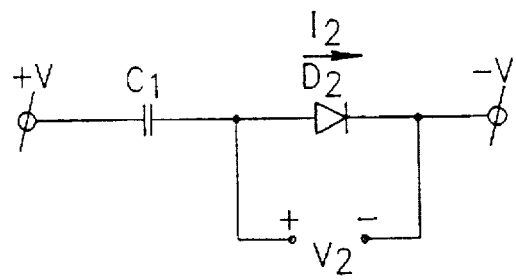
FIG. 10 is a schematic depiction of a hybrid construction used to control the current through diode $D_2$ by a separate source $V_2$.

FIG. 10 illustrates the regulation of the current through diode $D_2$ using a separate source ($V_2$). The control of the current through diode $D_2$ in the range from $I_{min}$ to $I_{max}$, and consequently the control of $C_{min}$ and $C_{max}$, is possible through the use of a separate source ($V_2$) with a voltage from zero to about 1 V.

A controlled capacitor system according to the present invention is characterized in that:

1. The system includes a series connection of a forward-biased semiconductor diode and a capacitor.
2. The value of the capacitance of the capacitor connected in series with the diode exceeds the capacitance of the diode under zero bias, i.e., the "zero capacitance".
3. The capacitance of the diode is controlled by controlling the forward current through the diode.
4. The range of the forward current control is selected in such a way that if the current through the diode is less than $I_{min}$, the capacitance of the diode is lower than the capacitance of the capacitor connected in series, ($C_2<C_1$), and if the current is higher than $I_{max}$ the diode capacitance is higher than $C_1$, i.e., $C_2>C_1$.

Figure 11A:
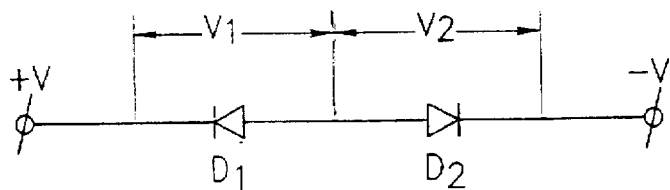
FIG. 11a shows two diodes connected in series in opposite directions to each other ("back-to-back")
Figure 11B:
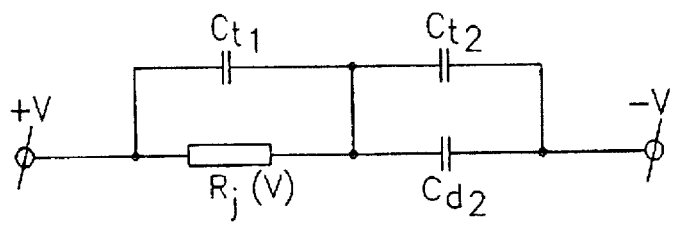

The connection of two diodes in series and in an opposite direction to each other ("back to back") and their equivalent circuit is illustrated in FIG. 11. $C_{t1}$ is the depletion capacitance of the diode, and $R_j$ is the differential resistivity of the reverse I-V characteristic of this diode. An important point is that both $C_{t1}$ and $R_j$ are voltage-dependent. $C_{t2}$ and $C_{d2}$ are the depletion and diffusion capacitances, respectively, of diode $D_2$. The system of expressions used to describe the circuit is:

$$1/C(V)=1/C_{t1}+1/(C_{t2}+C_{d2})$$

$$C_{t1}(V)=A_1(q\epsilon\epsilon_0 N_{d1}/2[\psi_1+(V-V_2)])^{0.5}$$

$$C_{t2}(V)=A_2[(q\epsilon\epsilon_0 N_{d2})/2(\psi_2-V_2)]^{0.5}$$

$$\psi_1=(kT/q)\ln[N_{a1}N_{d1}/(n_i)^2]$$

$$\psi_2=(kT/q)\ln[N_{a2}N_{d2}/(n_i)^2] \quad (23)$$

$$C_{d2}=qtI/(kT)$$

$$V_2=(kT/q)\ln[(I/A_2)/j_{o2}+1]$$

$$j_{o2}=qD_p p_n/L=q(D_p)^{0.5}(n_i)^2/[(\tau)^{0.5}N_{d2}]$$

$$I=A_1\times j_r(V-V_2)+I_s$$

For simplification the assumption is made that $V>>V_2$, so that $V-V_2\cong V$ and $\psi_1+V-V_2\cong V$.

From the previous analysis it follows that the necessary condition for obtaining the value of $C_{max}$ at voltage $V_{max}$ is that the capacitance of diode $D_1$ at $V_{max}$ be greater than the capacitance of diode $D_2$ under zero bias (I=0 or $V_2=0$) i.e., $$C_{t1}(V_{max})>C_{t2}(0) \quad (24)$$

If one sets a definite value for the term $C_{t1}(V_{max})/C_{t2}(0)$, one can calculate certain diode parameters and obtain the voltage range. From system (23) one obtains:

$$C_{t1}(V_{max})/C_{t2}(0)=A_1/A_2[N_{d1}\psi_2/(N_{d2}V_{max})]^{0.5} \quad (25)$$

where $V_{max}$ is lower than the breakdown voltage of diode $D_1$, $V_{BR1}$, i.e., $V_{max}<V_{BR1}$. From Equation (25) one can reach some interesting conclusions. One can assume, for example, that $V_{max}=100$ V, $C_{t1}(100)/C_{t2}(0)=10$ and $\psi_2\cong 1$. The maximum concentration $N_{d1}$ can be obtained from the condition $V_{max}<V_{BR1}$. Calculations made using expressions show that in this case $N_{d1}\leq(2-3)\times10^{15}$ cm$^{-3}$. From Equation (25) it follows that if $N_{d1}=N_{d2}$ then the ratio of the areas $A_1/A_2$ has to be about 100, i.e., the area of the PN junction of diode $D_1$ has to be about 100 times larger than that of diode $D_2$. The ratio will be smaller if $N_{d1}>N_{d2}$, but there is a limit imposed by the fact that modern semiconductor technology permits production of low-doped Si and GaAs layers with a minimum concentration of about $10^{13}-10^{14}$ cm$^{-3}$. For the "best" case when $N_{d2}\cong10^{13}$ cm$^{-3}$, i.e., $N_{d1}/N_{d2}\cong100$, the area ratio $A_1/A_2$ of diodes $D_1$ and $D_2$ will be about 10.

This analysis shows that even the design of a circuit with a relatively low voltage of 100 V and with a low effective ratio of diode areas of 10–100, stretches the ability of modern technology.

To increase the voltage and to decrease the ratio $A_1/A_2$ it is necessary to decrease the donor concentration in the base regions of both diodes. For example, for $A_1/A_2=10$ and at $V_{max}=1000$ V, the concentrations $N_{d1}$ and $N_{d2}$ have to be $10^{14}$ and $10^{11}$ cm$^{-3}$, respectively.

An especially interesting case occurs when $A_1/A_2=1$. The calculation shows that at 100 V ($N_{d1}\cong(2-3)\times10^{15}$ cm$^{-3}$) the concentration $N_{d2}\cong(2-3)\times10^{11}$ cm$^{-3}$. The structure includes a series connection of a GaAs Schottky diode as $D_1$, and of a GaAs PiN diode as $D_2$. The donor concentration in the base region of the Schottky diode $N_{d1}$ is about $(2-3)\times10^{15}$ cm$^{-3}$, and the concentration $N_{d2}$ in the i-region of the PiN diode is less than $5\times10^{11}$ cm$^{-3}$.

Figure 12:
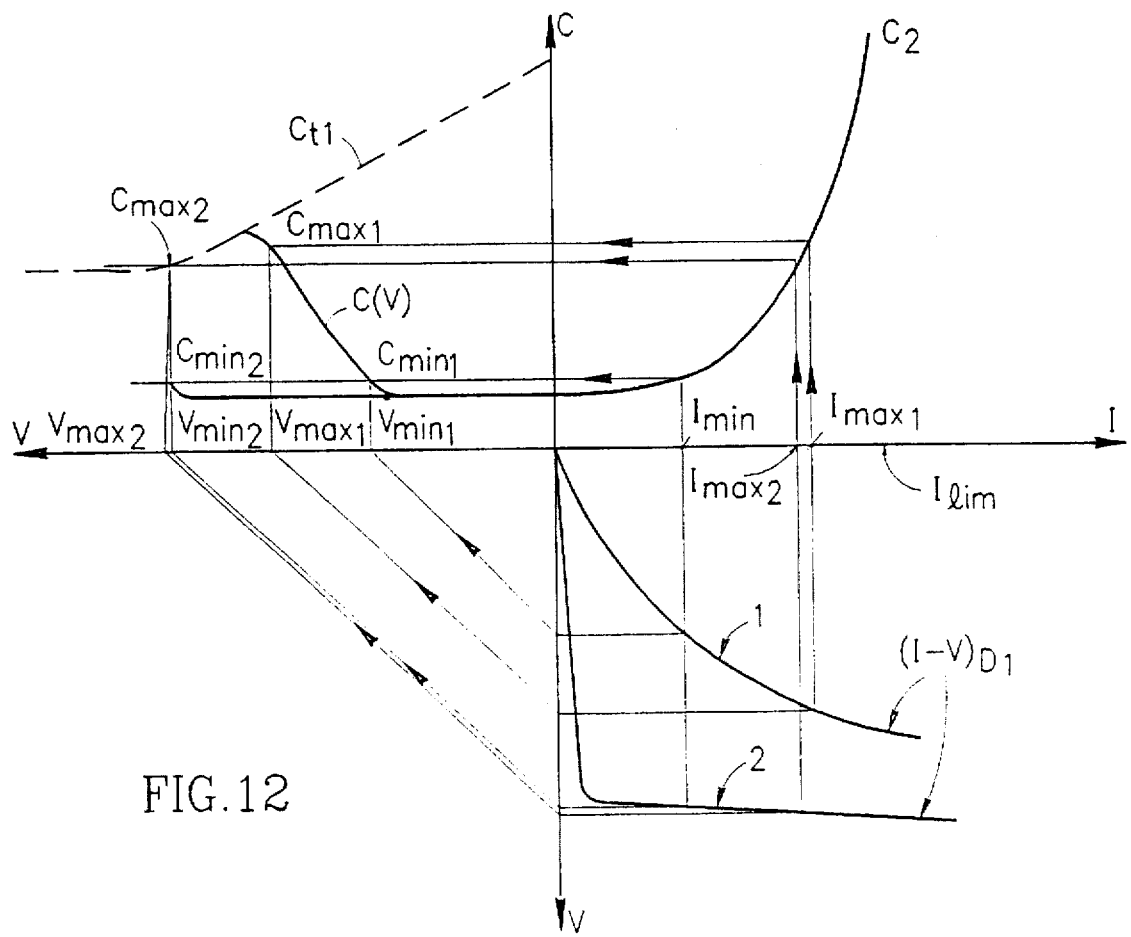
FIG. 12 is a graphic illustration of the C-V characteristics in a current controlled capacitor, or CCC, for two typical reverse I-V characteristics of a diode $D_1$: (1) a "soft" characteristic and (2) a "hard" characteristic.

Equation system (23) allows the calculation of the parameters of controlled capacitors and to design diodes for use as in such controlled capacitor devices. FIG. 12 demonstrates an example of a grapho-analytic calculation of a C-V characteristic for two typical reverse I-V characteristics of a diode $D_1$: for a "soft" characteristic (1), and for a "hard" one (2), in which the $I_{min}$ value is reached only at the start of the avalanche multiplication. $V_{min}$ and the slope $\Delta C/\Delta V$ are smaller for the diode with the "soft" I-V characteristic than for the "hard" one. It is clear from the previous analysis that the smaller the differential resistivity of the reverse I-V curve of diode $D_1$, the higher will be the slope $\Delta C/\Delta V$. The maximum slope can be obtained when the switching condition (i.e., when $I=I_{min}$), is reached at avalanche breakdown, where the slope of the I-V characteristic is maximum. The $I_{min}$ value is the same for both the "soft" and the "hard" diodes $D_1$, because their $C_{min}$ values coincide. This is clear and is a conclusion from the expressions describing the theoretical model of this capacitor. The $I_{max}$ values are different and $I_{max1}>I_{max2}$. This is also in agreement with the model, but needs some qualitative explanation. The difference between the $I_{max}$ values is due to the difference in the $C_{max}$ values. This difference is due to the decrease of the capacitance of diode $D_1$ with increasing applied voltage. In FIG. 12 one clearly sees that for $C_{t1}=$ const, $C_{max1}=C_{max2}$ and $I_{max1}=I_{max2}$. To increase $C_{max}/C_{min}$ at a given voltage, the diode $D_1$ has to be chosen with some higher "zero capacitance" and also with a weaker dependence of $C_{t2}$ on V. At the same time $I_{max}$ has to be lower than $I_{lim}$.

It is well known that the irradiation of a PN junction with visible light or with other kinds of radiation generates excess electron-hole pairs, the number of which, which can significantly exceed the equilibrium concentration, depends on the parameters of the radiation and of the PN junction. In a reverse-biased PN junction, radiation can increase the generation recombination current by many orders of magnitude.

This process makes it possible to design and fabricate a capacitor which is controlled by light or other forms of radiation. In fact, the result is still a current controlled capacitor, as described above, with the control current being changed through the agency of incident radiation. In the case of a current controlled capacitor described above the reverse current of diode $D_1$ was independent of all external influences except temperature and the "dark" I-V characteristics were completely determined by the construction and nature of the diode. In contrast, in the case of the light, or radiation, controlled capacitor, one can control the I-V characteristics of diode $D_1$ through a rather wide range by irradiation, and therefore control the capacitance of the device. The power of the radiation needed for the control is rather small.

Figure 13:
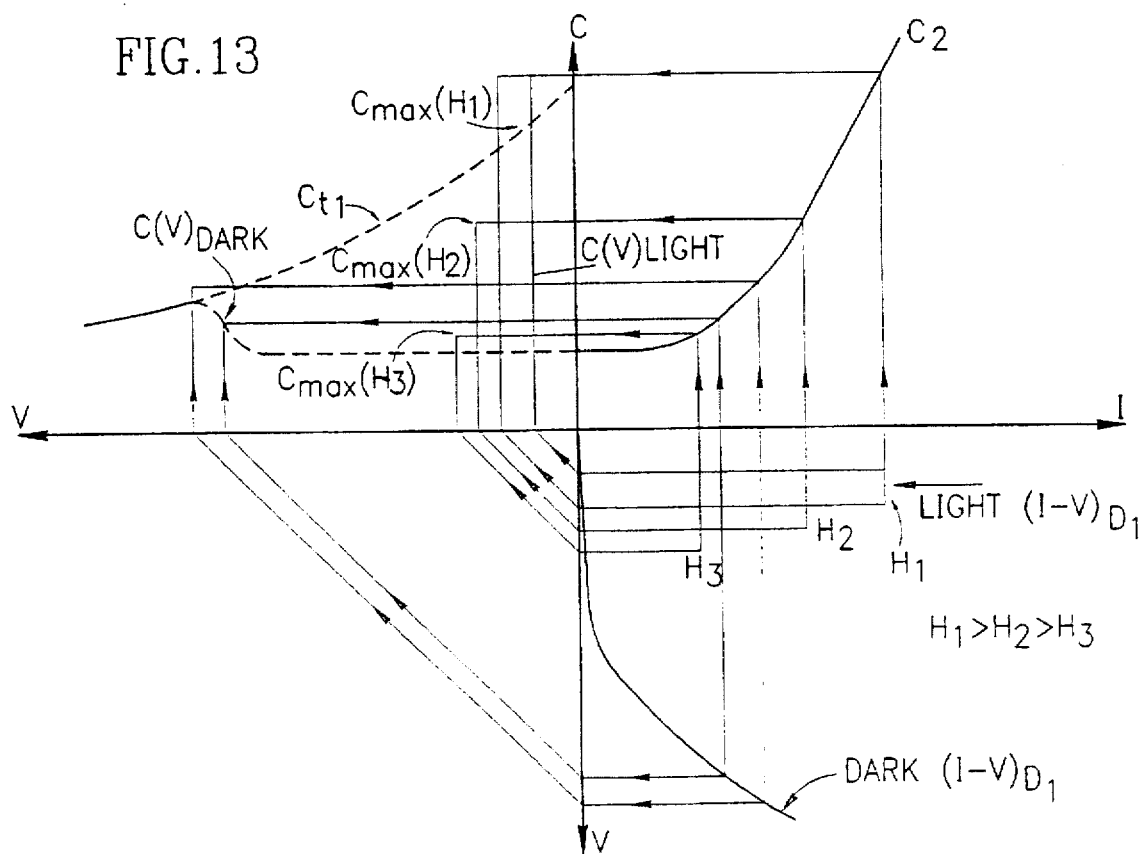
FIG. 13 is a graphic illustration of the C-V characteristics dependence on light irradiation. The reverse I-V characteristic of diode $D_1$ is controlled by light irradiation. This is an embodiment of a light controlled capacitor or LCC. H=intensity of light.

FIG. 13 illustrates the grapho-analytical calculation of the C(V) dependence on irradiation. $C(V)_{min}$ is determined by the "dark" reverse I-V characteristics of diode $D_1$, and $C(V)_{max}$ is determined by the reverse current of diode $D_1$ under irradiation. The more intense the radiation, the higher $C(V)_{max}$. For a sufficiently high intensity (high reverse current), the $C_{max}$ value is, as in the case of current controlled capacitance, limited by the depletion capacitance of diode $D_1[C_{z1}(V)]$.

In alternative embodiments according to the present invention it is possible to fabricate hybrid devices which include two diode devices connected in series. In the construction of two diodes connected in series the control of the capacitance of diode $D_2$ is provided by the reverse I-V characteristics of diode $D_1$ (FIG. 11a). The conditions $C_1(0) \gg C_2(0)$ and $I(V_{min})_1 \leq I_{min.2}$ have to be fulfilled. The lower the reverse current of diode $D_1$, i.e., the higher its differential resistivity ($\Delta V/\Delta I$) and the higher $V_{min}$. $V_{min}$ is limited by the breakdown voltage of diode $D_1$: $V_{min} \leq V_{BR1}$.

As diodes $D_1$ and $D_2$, one could use, for example, the usual silicon diodes, but, as explained above, these diodes suffer from the drawback that a rather high ratio of areas $A_1/A_2$ (about 100 or higher) is required, and that they have rather high reverse currents. The high $A_1/A_2$ ratio requirement can be reduced by using as diode $D_2$ a GaAs PiN diode with a carrier concentration in the i-region which is much lower than that in the N region of diode $D_1$. In this case, both $C_{min}$ and $C_{max}/C_{min}$ can be changed by changing $A_2$ and/or the thickness of the i-region.

As diode $D_1$ one may use Schottky diodes, PN diodes or PiN diodes. Schottky diodes have a larger zero capacitance, but a rather low reverse voltage. For example, silicon Schottky diodes are mostly designed with reverse voltages below 60V. The reverse current of such diodes is rather high, about tens or hundreds of microamperes, which decreases $V_{min}$ significantly, to a few volts or tenths of a volt, therefore making them unusable in certain applications.

More attractive is the use of GaAs Schottky diodes, which can now be fabricated with a reverse voltage of 200–300 V and with reverse currents below one microampere. The common disadvantage of all Schottky diodes is a strong dependence of the capacitance of the reverse-biased diode on the applied voltage (FIG. 14):

$$C(V)_{D1} \cong C(0)_{D1} V^{-\frac{1}{2}} \quad (26)$$

Therefore, at an applied bias of only 100 V the capacitance of a Schottky diode decreases by about 10 times from its zero-voltage value.

PN junction diodes can be fabricated with significantly higher reverse voltage and lower reverse currents than those of Schottky diodes. It is possible also to fabricate diodes with a linear doping profile and consequently with a weaker C(V) dependence (FIG. 14):

$$C(V)_{D1} \cong C(0)_{D1} V^{-\frac{1}{3}} \quad (27)$$

Figure 14:
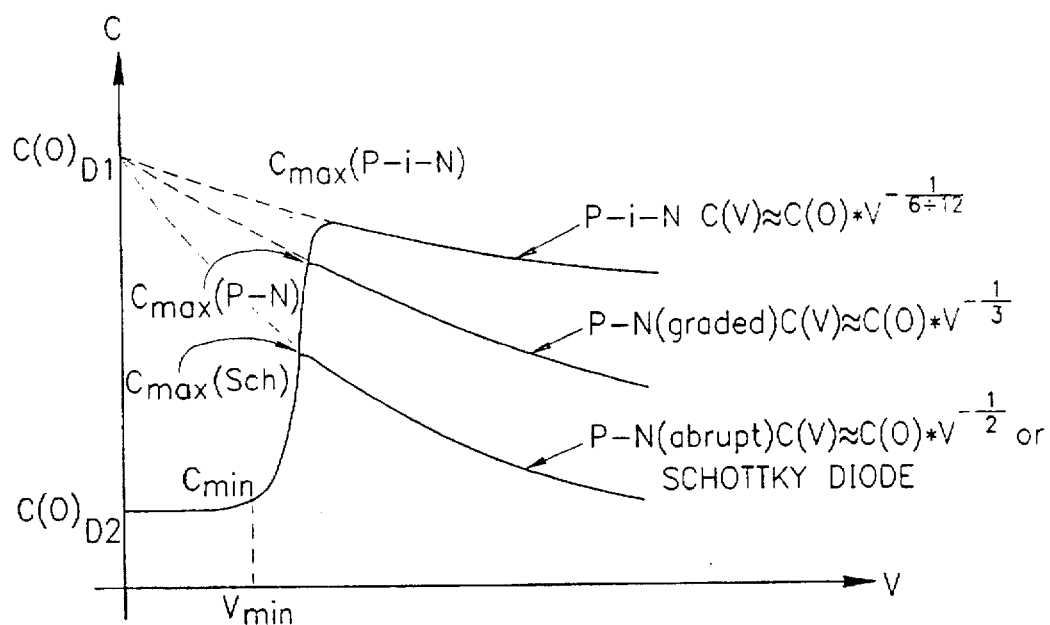
FIG. 14 is a graphic illustration of the CCC C-V characteristics as a function of the capacitance characteristics of the reverse-biased diode $D_1$.

The most promising device for use as diode $D_1$ is a GaAs PiN diode. In this case, $$C(V)_{D1} \cong C(0)_{D1} V^{-1/k} \quad (28)$$

where k=6–12 (FIG. 14).

When a PiN diode is, in addition, used as diode $D_2$, the $C_{max}/C_{min}$ value can be obtained from the relationship:

$$C_{max}/C_{min} \cong C(0)_{D1}/C(0)_{D2} \cong A_{D1} W_{i2}/A_{D2} W_{i1} \quad (29)$$

and the $C(0)_{d1}$ and $C(0)_{D2}$ values from:

$$C(0)_{D1} = \epsilon \epsilon_0 A_{D1}/W_{i1} \text{ (for GaAs } C(0)_{D1} = 10^{-12} A_{D1}/W_{i1})$$

$$C(0)_{D2} = \epsilon \epsilon_0 A_{D2}/W_{i2} \text{ (for GaAs } C(0)_{D2} = 10^{-12} A_{D2}/W_{i2})$$

where $A_{D1}$ and $A_{D2}$ are the areas of the PiN diodes, and $W_{i1}$ and $W_{i2}$ are the thicknesses of their respective i-regions. A detailed model of a device with a GaAs PiN diode as diode $D_2$ is presented below.

The simple series connection of two diodes shown in FIG. 11 does not allow the control of $V_{min}$ because its value is determined mostly by the parameters of diodes $D_1$ and $D_2$ and, in particular, mainly by the reverse I-V characteristics of diode $D_1$. If the diodes are fabricated in a package which protects the rectifying elements from any external influence, the temperature will be the only factor which can influence $V_{min}$. It is well known that the reverse current grows exponentially with temperature, so the $V_{min}$ stability will be determined mainly by the temperature stability of the reverse I-V characteristics of diode $D_1$.

Figure 15:
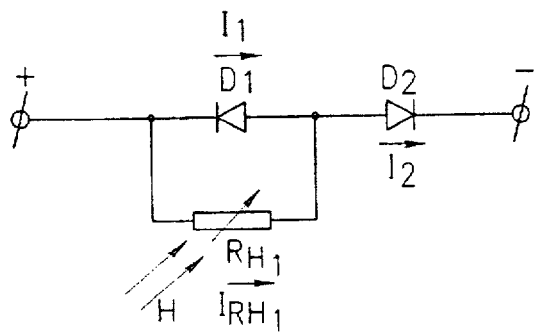
FIG. 15 shows an LCC construction variant, where diode $D_1$ is shunted by a photoresistor $R_{H1}$.
Figure 16:
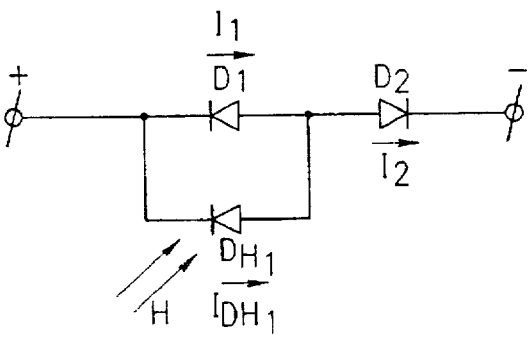
FIG. 16 is an LCC construction variant where diode $D_1$ is shunted by a photodiode $D_{H1}$.

Much more attractive is the control of C(V) by external factors, for example, by light. Possible construction variants are shown in FIGS. 15 and 16, where the diode $D_1$ is shunted by a light sensor, for example, by a photoresistor or by a photodiode.

Figure 17:
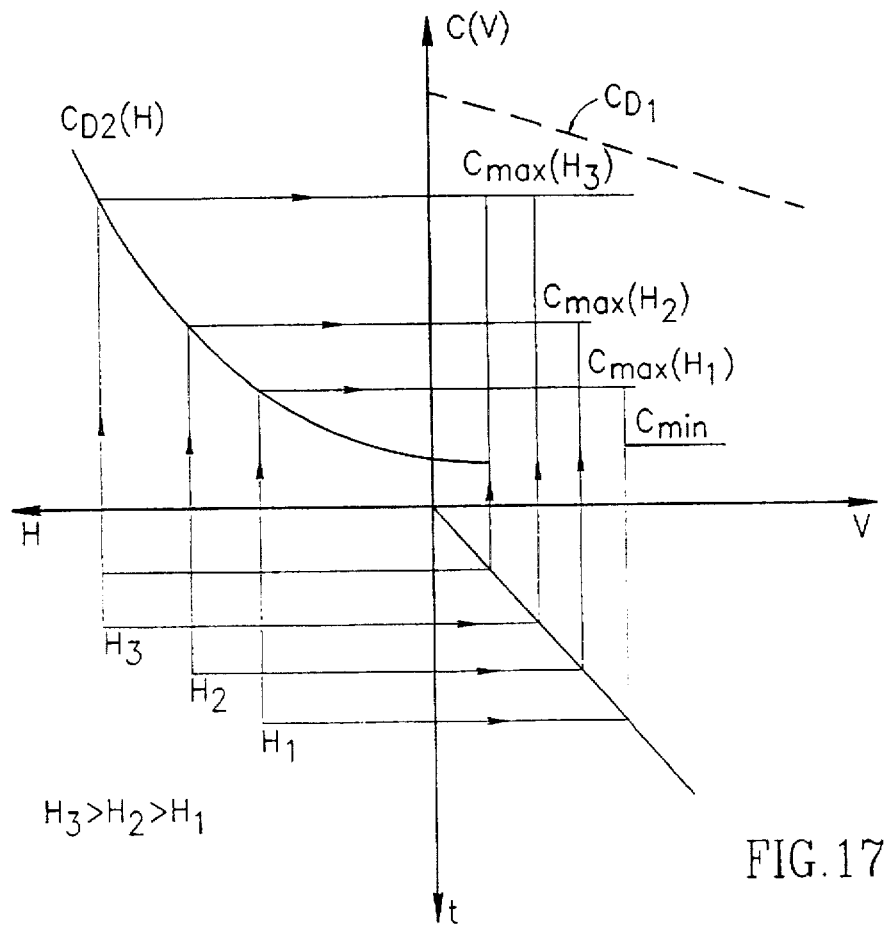
FIG. 17 is a graphic illustration of the dependence of the C-V characteristics of the circuits shown in FIGS. 15 and 16 on light intensity (H)

If one chooses diodes $D_1$ and $D_2$ and photoresistor $R_{H1}$ or photodiode $D_{H1}$ so that without illumination the current through diode $D_2$ is lower than $I_{min}$ over the entire-voltage range, while under illumination the current is higher than $I_{min}$, then it is possible to control the capacitance of the circuit by illumination (FIG. 17). By selecting the moment of the light impulse relative to the V(t) characteristic, and the intensity of illumination, one can control the $V_{min}$ and $C_{max}/C_{min}$ values.

Figure 18:
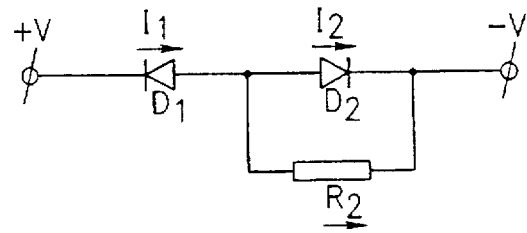
FIG. 18 is a CCC construction variant, where it is possible to decrease the current through diode $D_2$ by a shunt resistor $R_2$.

As mentioned above, the main condition for $V_{min} > 0$ is that the value of the current through diode $D_2$ be lower than $I_{min}$ at $V_{D1} < V_{min}$. This condition is rather difficult to obtain in a reversely-biased diode $D_1$. If the reverse current of diode $D_1$ is higher than $I_{min}$, it is possible to change the current through $D_2$ by a shunt resistor $R_2$ (FIG. 18), which is selected so that the current through $D_2$ up to an applied voltage $V_{min}$ will be lower than $I_{min}$. A lower $R_2$ value leads to a smaller current through diode $D_2$ and to a higher $V_{min}$.

Figure 19:
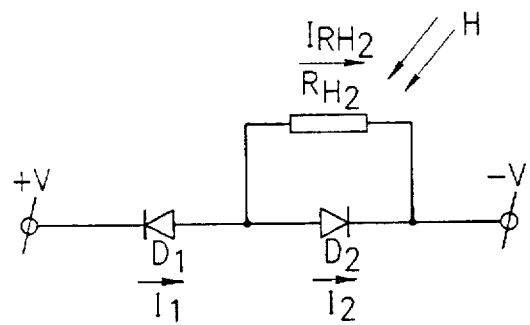
FIG. 19 is an LCC construction variant, where it is possible to decrease the current through diode $D_2$ by a shunt photoresistor $R_{H2}$.
Figure 20:
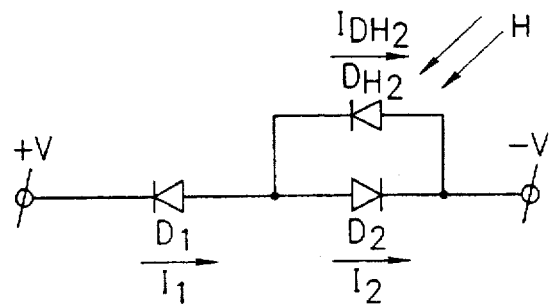
FIG. 20 is an LCC construction variant, where it is possible to decrease the current through diode $D_2$ by a shunt photodiode $D_{H2}$.
Figure 21:
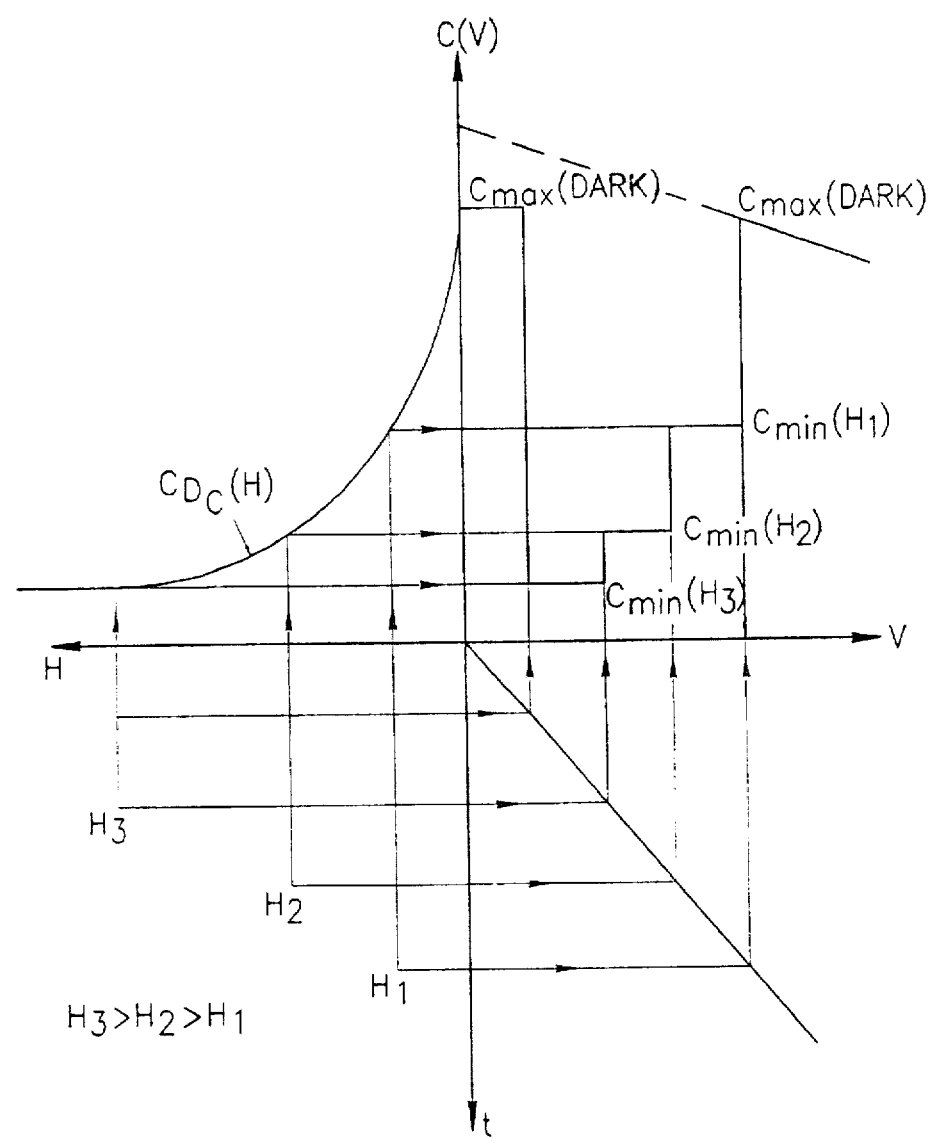
FIG. 21 is a graphic illustration of the C-V characteristics for the circuits shown in FIGS. 19 and 20 on light intensity (H)

Using a photoresistor ($R_{H2}$) or a photodiode ($D_{H2}$) as a resistor $R_2$ (FIGS. 19, 20), it is possible to control the $C_{max}/C_{min}$ value by illumination. In this type of circuit, in contrast with that of FIG. 17, an increase in the illumination intensity will decrease the current through diode $D_2$ and consequently the capacitance. If, without illumination, the current through $D_2$ is $I_{max}$ and the capacitance is $C_{max}$, then under illumination of an intensity $H_{max}$, the current through $D_2$ will decrease to $I_{min}$, and consequently C(0) will decrease to $C_{min}$ (FIG. 21).

In a preferred embodiment according to the present invention, a controlled capacitor is based on a GaAs PiN diode and a Schottky diode or, alternatively, on two GaAs PiN diodes. State-of-the-art technologies (MBE, MOCVD, and the like) make it possible to fabricate PiN silicon diodes having i-layer doping concentrations of not less than (1–5) $\times 10^{13}$ cm$^{-3}$, and GaAs diodes with a doping concentration of not less than $10^{14}$ cm$^{-3}$ in an i-layer of a few microns in thickness.

It was shown above that the doping concentration is the main determinant of the $C_{min}$ and $C_{max}(V)/C_{min}(V)$ values. To achieve acceptable values of $C_{max}/C_{min}$ in diodes having a relatively high carrier concentration in the low-doped region, a rather high ratio of junction cross-section areas $A_1/A_2$ of diodes $D_1$ and $D_2$ is required, which constitutes a major drawback in many applications.

In our copending PCT application (PCT/US94/06144, filed 31 May 1994), which is incorporated by reference in its entirety for all purposes as if fully set forth herein, is disclosed a novel GaAs PiN layer growth technology which makes it possible to fabricate diode structures having a carrier concentration in the i-region $(N_d-N_a)_i$ of less than $5\times 10^{11}$ cm$^{-3}$. At the same time, the i-region thickness can be controlled from about 3 to 100 µm. These structures open up new possibilities for the design of controlled capacitors according to the present invention.

Figure 22:
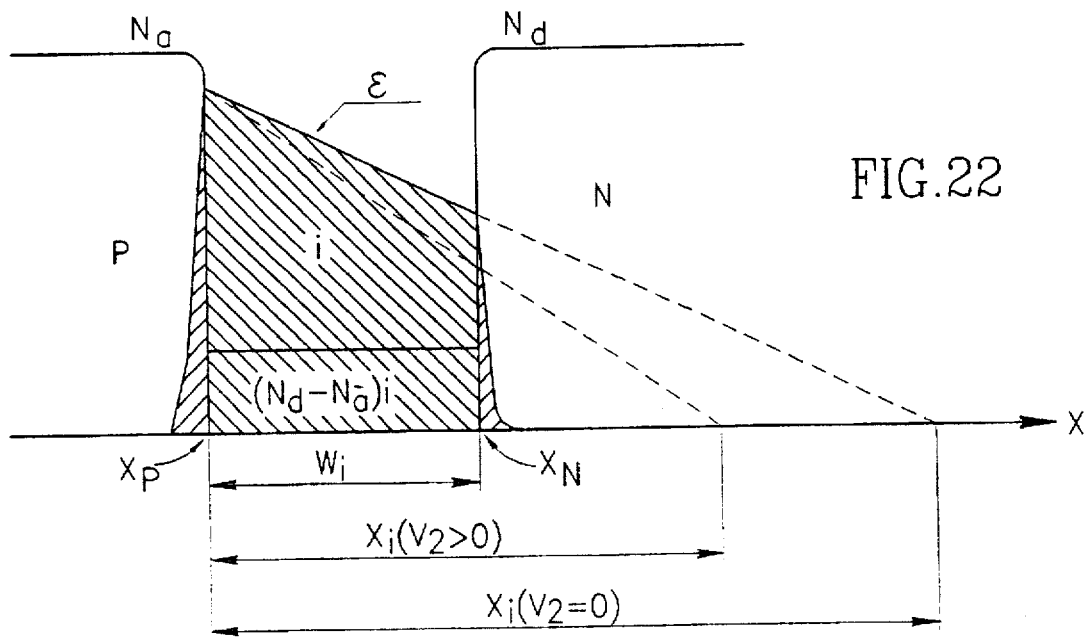
FIG. 22 shows an electric field (E) distribution and depletion region propagation in a PiN structure with a near-fully compensated $W_i$-wide i-region.

A sketch of the electric field distribution and of the depletion layer propagation in a PiN structure with a near-fully compensated $W_i$-wide i-layer is shown in FIG. 22. If $(N_d-N_a)_i$ is sufficiently small, the calculated thickness of the depletion region in the i-region, $x_i$, under zero bias is much larger than $W_i$. In this case the value of the capacitance $C_t$ under zero bias is determined mainly by $W_i$. The assumption is made that in these PiN structures the P-i and i-N junctions are abrupt and that $N_a$ and $N_d$ in the P and N regions, respectively, are much higher than $(N_d-N_a)_i$. These assumptions allow one to neglect the expansion of the depletion region into the P and N regions under reverse bias ($x_P$ and $x_N$ in FIG. 22). Under small forward bias the calculated depletion width $x_i(V_2)$ decreases (but still remains larger than $W_i$), however the changes are very small. From the forward bias value corresponding to $x_i \cong W_i$, $C_t$ begins to grow because the width of the depletion region is still not bound by the i-region. For this type of PiN diodes, $C_t$ is given by Equation (30a,b):

$$C_t(V)=C_t(W_i)=\epsilon\epsilon_0 A/W_b \text{ when } x_i(V)>W_i \quad (30a)$$

$$C_t(V)=C_t(x_i)=\epsilon\epsilon_0 A/x_i(V), \text{ when } x_i(V)<W_i \quad (30b)$$

where $$x_i(V)=[2\epsilon\epsilon_0(\psi-V)/q(N_d-N_a)_i]^{0.5} \quad (30c)$$

Figure 23:
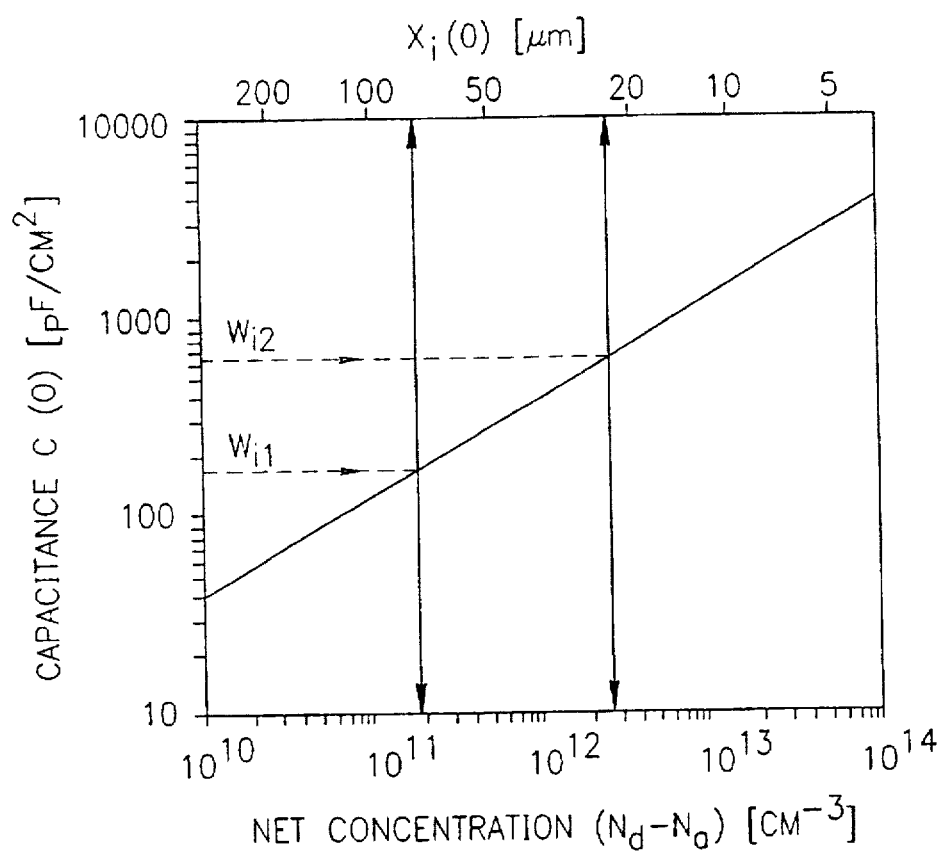
FIG. 23 shows the dependence of the depletion capacitance of the GaAs PiN structure under zero bias, $C_i(0)$, on the net carrier concentration $(N_d-N_a)_i$ in the i-region. $x_i(0)$ is the depletion width under zero bias.

From Equations (30a–c) and experimental measurements of $C_t(0)$, one can extract $W_i$ and estimate the maximum $(N_d-N_a)_i$ value. FIG. 23 shows the dependence of $C_t(0)$ on $(N_d-N_a)_i$, calculated by using Equations (30b,c) at zero bias (V=0) and at room temperature (T=300K). The dotted lines show experimentally measured $C_t(0)$ values of two diodes with different $W_i$ ($W_{i,1} \cong 70$ µm, $W_{i,2} \cong 17$ µm). This plot shows that the calculated $x_i(0)$ values corresponding to the measured $C_t(0)$ are close to the measured $W_i$ values, and that the condition $C_t(0)_{exp}=C_t(0)_{calc}$ will be fulfilled for $(N_d-N_a)_i \cong 2.5\times 20^{11}$ cm$^{-3}$ for $W_{i,1}$ and for about $4\times 10^{12}$ cm$^{-3}$ for $W_{i,2}$.

Because $(N_d-N_a)_i$ is, in principle, independent of $W_i$ one can conclude that:

(1) for $W_{i,1}<W_i<W_{i,2}$, (in the above case up to about 70 µm) the maximum concentration in the i-region is below $5\times 10^{11}$ cm$^{-3}$;

(2) from Equations (30b,c) one obtains that $x_i(0)_{max} \geq 70$ µm for $(N_d-N_a)_i \leq 5\times 10^{11}$ cm$^{-3}$;

(3) for all $W_i \leq x_i(0)_{max}$ the $W_i$ value can be obtained from the expression:

$$W_i \cong \epsilon\epsilon_0 A/C_t(0)_{exp} \quad (31)$$

Figure 24:
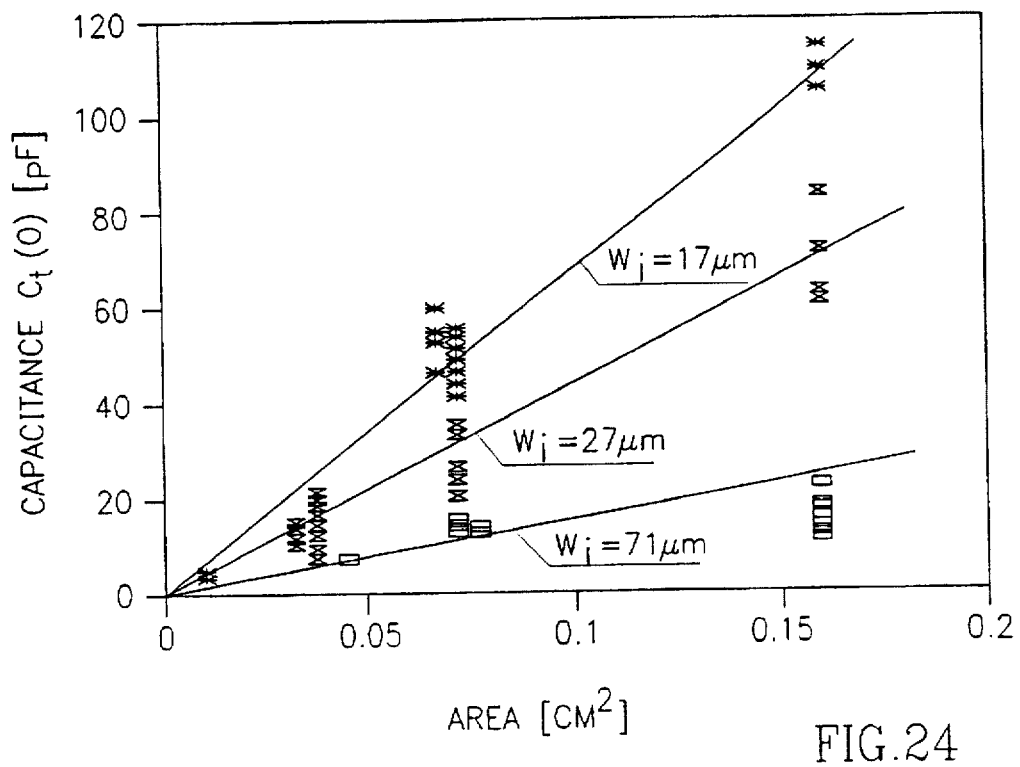
FIG. 24 shows the experimentally determined dependence of the depletion capacitance at zero bias, $C_1(0)$, on diode areas, for three GaAs PiN diode sets, each set having a different $W_i$.

FIG. 24 illustrates the measured dependence of $C_t(0)$ on PiN diode areas for three diode sets, each set having a different $W_i$. Within each set $W_i$ is constant. The lines represent a regression fit according to the dependence $C_t(0)$ ~A (Equation 30a). Inserting the regression parameters into Equations (31) one obtains $W_i$ values of 71, 27 and 17 µm, which are close to thicknesses measured by other methods. This result supports the validity of both the condition $x_i(0)>W_i$ and the assumption that $(N_d-N_a)_i$ is independent of $W_i$.

A very important practical conclusion from these measurements is that the ability to grow thick (up to 100 µm) PiN layers with such a low $(N_d-N_a)_i$ allows the fabrication of diodes with a relatively large (about 1 mm$^2$) area but with a very small (1 pF and smaller) capacitance. This is very important for the design of high-frequency semiconductor capacitors, because one can use special high-frequency packages and thus easily avoid the normal stray capacitance due to connections. At the same time the fabrication technology of these small-capacitance structures is much easier than that in existing technologies for making low-capacitance silicon structures.

In an analogous way, the diffusion capacitance of a GaAs PiN structure is given by:

$$C_d=q\tau I/kT \text{ for } W_i/L>1 \quad (32a)$$

$$C_d=(q\tau I/kT)\times W_i/2L \text{ for } W_i/L<<1 \quad (32b)$$

where $\tau$ is the carrier lifetime, and L is the diffusion length. These equations are valid up to a maximum current density of about $10^{-1}$ A/cm$^2$ when $(N_d-N_a)_i$ is about $5\times 10^{11}$ cm$^{-3}$.

The total capacitance of a diode is given by:

$$C(I)=C_t(V_2)+C_d(I) \quad (33)$$

where $C_t(V_2)$ is the depletion capacitance under forward bias, Equations (30), and $$V_2=(kT/q)ln[(I/A)/j_0+1]$$

and $$j^0=q(D_i)^{0.5}p_i/(\tau_i)^{0.5}$$

where $D_i$, $p_i$ and $\tau_i$ are, respectively, the diffusivity, equilibrium hole concentration and hole lifetime respectively in the i-layer.

Figure 25:
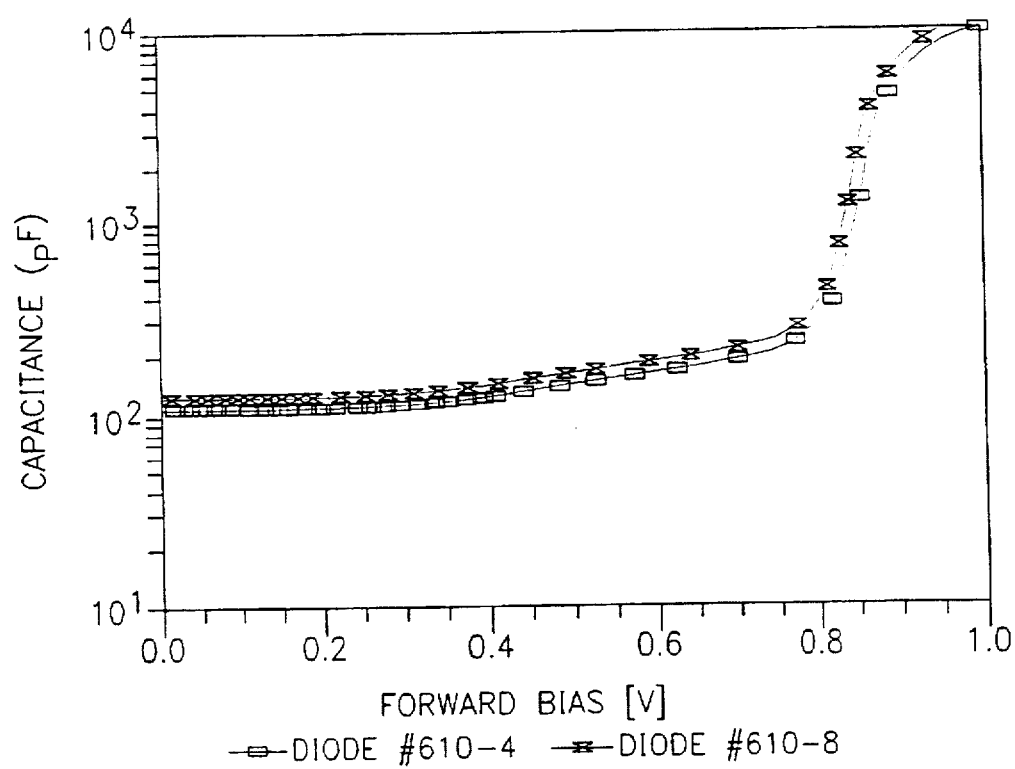
FIG. 25 shows the experimentally determined dependence of the total GaAs PiN diode capacitance, C(V), on forward bias. ($W_i \cong 20$ µm, A=0.3 cm$^2$)
Figure 26:
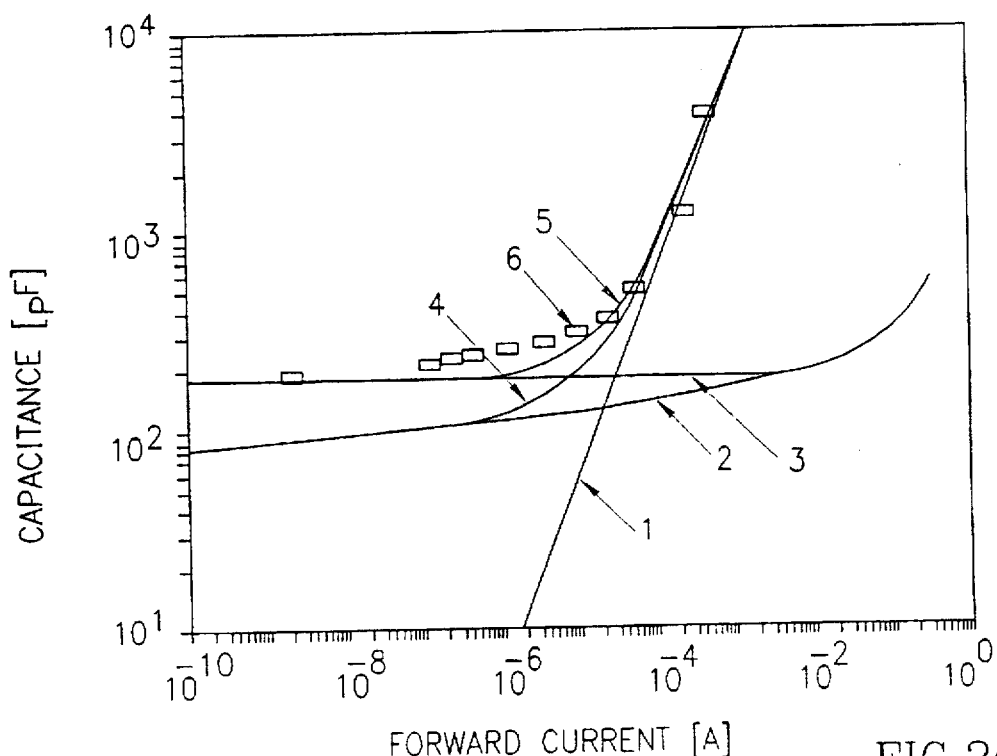
FIG. 26 shows the calculated dependence of the total GaAs PiN diode capacitance, C(I), and its components on the forward current (for an area of 0.3 cm$^2$): 1—diffusion capacitance, $C_d$; 2—depletion capacitance $C_t$ for the case when the i-region width $W_i$ is greater than the depletion region width $x_i(V)$; 3—depletion capacitance for the case when $W_i=20$ µm; 4—total capacitance for $W_i>x_i(V)$; 5—total capacitance for $W_i=20$ µm; 6—experimental C(I) dependence.

FIG. 25 shows the measured dependence of the total PiN diode capacitance C(I) on forward bias, and FIG. 26 shows the calculated dependence of C(I) and its components on the forward current (for an area of 0.3 cm$^2$). The diffusion component $C_d$ is given by curve 1; the depletion component $C_1$ was calculated for two conditions: (a) - for $W_i>x_i(V)$ (curve 2), and (b) - for $W_i=20$ µm (curve 3).

For condition (a), C(I) (curve 4) is determined mainly by $C_t$ up to a certain current, and grows only slowly with increasing current. Above I=$I_{min}$(I≅$10^{-6}$ A), C(I) increases much faster, and the dependence becomes almost linear due to the dominance of $C_d$ (curve 1). For condition (b) $C_t$ is independent of the current (curve 3) up to ~$10^{-3}$ A, and should be calculated from (30a); C(I) (curve 5) is then given by:

$$C(I) = C_r(W_i) + C_d(I) \quad (34)$$

For illustration, curve 6 in FIG. 26 shows the experimental C(I) dependence of a PiN structure with parameters similar to those used in the calculation. The curve was obtained by converting V values into I values using a measured I-V characteristic. There is an excellent fit with the theoretical "case (b)" curve.

Diode $D_1$ can be a diode with an abrupt PN junction, a linearly graded PN junction, a PiN diode or a Schottky diode. The total capacitance of the two diodes in series C(V) is calculated using Equations (23), (30) and (33). For $W_i < x_i(V)$ (see Equation (34)), $$1/C(V) = 1/C_1(V) + 1/C_2(V) = 1/C_{r1}(V) + 1/[C_{r2}(W_i) + C_{d2}(I)] \quad (35)$$

One can discuss as an example the calculation of the capacitance of a controlled capacitor consisting of a GaAs PiN diode $D_2$ and a reversely connected diode $D_1$.

1) Assuming as a main condition:

$$C_{r1}(V) = mC_{r2}(0) \text{ where } m>1 \quad (36a)$$

In this case in Equation (35) $C_2(0) = C_{r2}(W_i)$, i.e., $$C_{r1}(V) = mC_{r2}(W_i) \quad (36b)$$

The multiplier m can be chosen arbitrarily starting with the suggested ratio $C_{max}/C_{min}$ at a given bias.

2) $C(V)_{min}$ is obtained from the condition that at $I_{min}$, $C_{d2} < C_{r2}$, i.e., $$C_{d2}(I_{min}) = \alpha \times C_{r2}(W_i), \text{ where } 0.2 \leq \alpha \leq 1 \quad (37)$$

From Equations (35), (36b) and (37) it follows that:

$$C(V)_{min} = [m(1+\alpha)/(1+\alpha+m)]C_{r2}(W_i) \quad (38)$$

Taking m=10 and $\alpha$=0.2 one obtains $C(V)_{min} = 1.1\ C_{r2}(W_i)$.

3) $I_{min}$ is obtained from Equation (37) by inserting the respective values of $C_{d2}(I_{min})$ and $C_{r2}(W_i)$ into Equations (30a) and (32a):

$$qI_{min}/kT = \alpha(\epsilon\epsilon_0 A_2)/W_i$$

or $$I_{min} = \alpha(kT/q)(\epsilon\epsilon_0 A_2)/(\tau W_i) \quad (39)$$

Equation (39) shows that $I_{min}$ decreases when $\tau$ and/or $W_i$ increase. For a PiN diode with parameters: $W_i$=20 µm, $\tau$=150 ns, $A_2$=0.1 cm$^2$, m=10 and $\alpha$=0.2, $I_{min}$=1.6×10$^{-6}$ and $C(V)_{min}$=60 pF.

4) $C(V)_{max}$ is determined by the condition that the total capacitance of diode $D_2$ has to be much greater than the depletion capacitance of diode $D_1$ at a given bias:

$$C_{d2}(I_{max}) + C_{r2}(W_i) \gg C_{r1}(V), \text{ i.e., } C_{d2}(I_{max}) + C_{r2}(W_i) = \beta C_{r1}(V), \text{ where } \beta \gg 1 \quad (40)$$

From Equations (35), (36b) and (40) one gets:

$$C(V)_{max} = [m\beta/(1+\beta)]C_{r2}(W_i) \quad (41)$$

Assuming $\beta$=10 and m=10, one obtains $C(V)_{max} \cong 9\ C_{r2}(W_i)$, and for the above example $C(V)_{max} \cong 480$ pF.

5) $I_{max}$ can be extracted from Equations (36b) and (40): $C_{d2}(I_{max}) + C_{r2}(W_i) = \beta mC_{r2}(W_i)$ $$(qI_{max})/kT = (\beta m-1)C_{r2}(W_i)$$

$$I_{max} = (\beta m-1)(kT/q)(\epsilon\epsilon_0 A_2)/\tau W_i$$

and since $\beta m \gg 1$ $$I_{max} \cong \beta m(kT/q)(\epsilon\epsilon_0 A_2)/\tau W_i \quad (42)$$

By comparing Equations (39) and (42), it can be seen that $I_{max}$ and $I_{min}$ are related through $\alpha$, $\beta$ and m:

$$I_{max} = (\beta m/\alpha)I_{min} \quad (43)$$

For $\alpha$=0.2, $\beta$=10 and m=10 and for the diode parameters chosen above, one gets $I_{max} \cong 10^{-3}$ A, and $j_{max} = I_{max}/A_2 \cong 10^{-2}$ A/cm$^2$ which is below the $j_{lim}$ value for the diffusion capacitance.

6) $V_{min}$ and $V_{max}$ are obtained from the reverse I-V characteristic of diode $D_1$, inserting the $I_{min}$ and $I_{max}$ values:

$$I_{min} = A_1 \times j(V_{min}) \quad (44a)$$

$$I_{max} = A_1 \times j(V_{max}) \quad (44b)$$

Figure 27A:
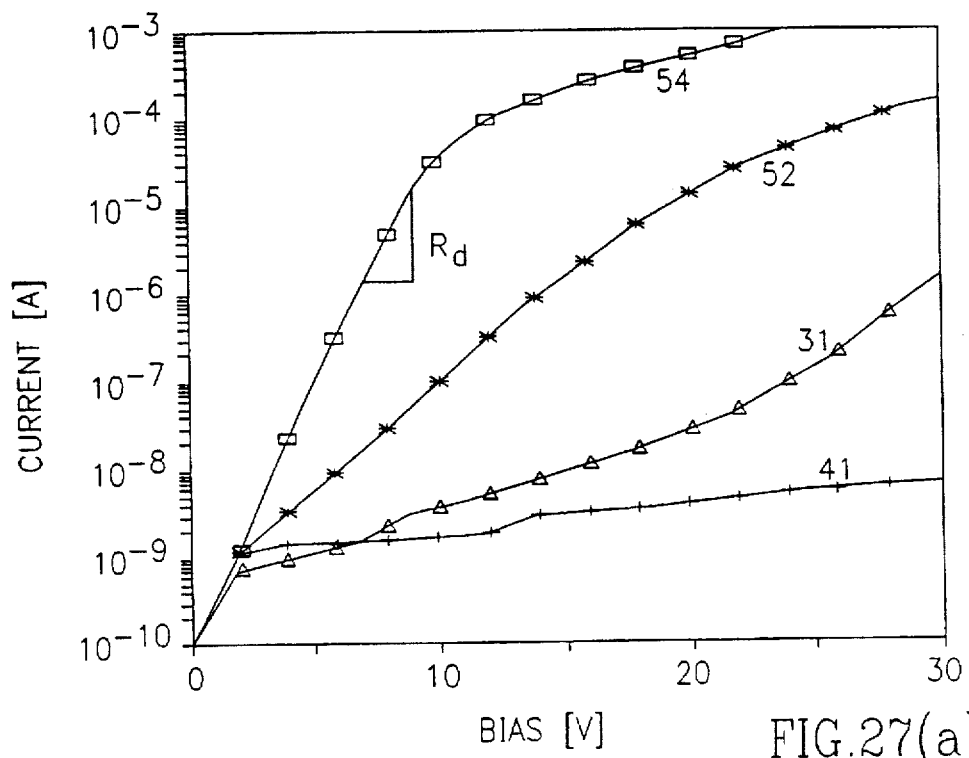
FIG. 27a shows experimental I-V characteristics of four capacitors (#31, 41, 52 and 54) with different $R_d$ of the reverse-biased diode $D_1$ (in this integrated, or monolithic, embodiment a Schottky diode, $D_1$, and a PiN diode, $D_2$, are fabricated on the same single crystal GaAs substrate)
Figure 27B:
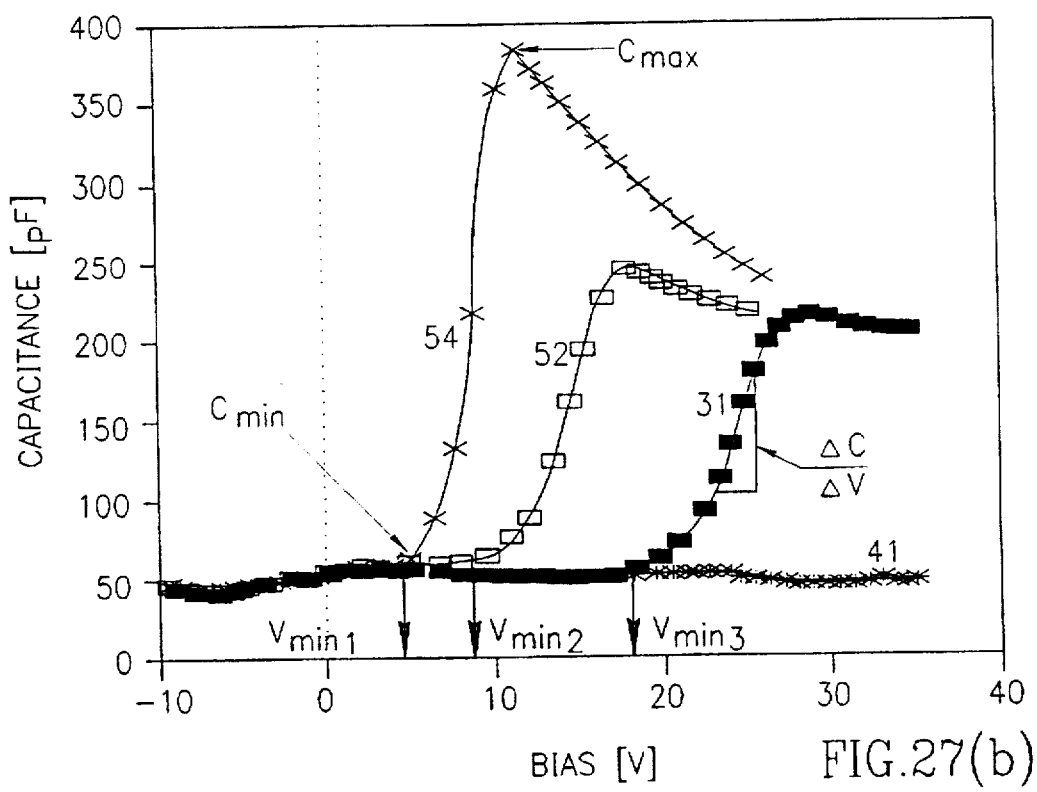
FIG. 27b is an illustration of the dependence of $V_{min}$ and $\Delta C/\Delta V$ on $R_d$ and shows experimental C-V curves of four capacitors (#31, 41, 52 and 54). The figure shows clearly the increase in $V_{min}$ and the decrease in $\Delta C/\Delta V$ when $R_d$ increases.

FIG. 27a shows examples of experimental I-V characteristics of different diodes $D_1$ with different values of differential resistivity $R_d$ in the $V_{min}$-$V_{max}$ range; FIG. 27b shows the measured C-V characteristics of the same capacitors. The $V_{min}$ value is dependent on the differential resistivity at $V > V_{min}$, and as a first approximation can be written:

$$V_{min} = V_{max} - (I_{max} - I_{min})R_d \quad (45)$$

From Equation (45) it follows that the smaller is $R_d$, the closer is $V_{min}$ to $V_{max}$. Considering that $I_{max} \gg I_{min}$, one gets:

$$V_{min} = V_{max} - I_{max}R_d \quad (46)$$

or:

$$\Delta V = I_{max}R_d \quad (47)$$

Now $$\Delta C/\Delta V = [C(V)_{max} - C(V)_{min}]/(V_{max} - V_{min}) \quad (48)$$

and using Equation (47)

$$\Delta C/\Delta V = [C(V)_{max} - C(V)_{min}]/I_{max}R_d \quad (49)$$

Equation (49) shows that the slope of the C(V) characteristic increases with decreasing $R_d$. It was mentioned above that it is possible to control the size of the reverse current in diode $D_1$ between $I_{min}$ and $I_{max}$ through the influence of radiation at $V < V_{min}$. In this case the reverse current will depend on the intensity and the energy of radiation, and on the design and parameters of $D_1$ (FIG. 28).

As the source of radiation which leads to the growth of the reverse current by the generation of electron-hole pairs one can use visible infrared or ultraviolet light, γ- or X-rays, nuclear radiation, etc. Generation of electron-hole pairs, can also be induced by increasing the temperature of diode $D_1$. Controlled capacitors can therefore be very attractive candidates for sensors of radiation or temperate. From a radiation sensitivity viewpoint, the most effective con, oiled capacitors will be composed of diodes made from semiconductors with a direct zone structure, particularly GaAs.

7) The parameters of diode $D_1$ are obtainable from (see Equations (26),(27),(28)):

$$C_{r1}(V) = C_{r1}(0) \times (V_{max})^{-1/k} \quad (50)$$

where k=2 for abrupt PN junctions, k=3 for graded ones, and k>3 for PiN structures.

Inserting the $C_{r1}(V)$ value from Equations (36b) into Equation (50) one obtains the expected value of $C_{r1}(0)$:

$$C_{f1}(0) = mC_{f2}(W_i) \times (V_{max})^{1/k} \quad (51)$$

Equation (51) shows that the expected "zero" capacitance of diode $D_1$ increases when k decreases. If a PiN diode is used as diode $D_1$ then:

$$C_{f1}(0) \equiv C_{f1}(W_{i,1}) = (\epsilon\epsilon_0 A_1)/W_{i,1} \quad (52)$$

and combining Equations (51) and (52), $$(A_1/A_2)(W_{i,2}/W_{i,1}) = m \times (V_{max})^{1/k}, \text{ where } k \cong 6-12 \quad (53)$$

When a Schottky diode or a diode with an abrupt PN junction is used as diode $D_1$, $$C_{f1}(0) \equiv A_1[q\epsilon\epsilon_0 N_1/(2\psi)]^{0.5} \quad (54)$$

and from Equations (51) and (54), $$A_1[q\epsilon\epsilon_0 N_1/2\psi]^{0.5} = (m\epsilon\epsilon_0 A_2/W_{i,1}) \times (V_{max})^{1/k}$$

or $$(A_1 W_{i,2}/A_2) \times [qN_1/(2\epsilon\epsilon_0 \psi)]^{0.5} = m \times (V_{max})^{1/k} \quad (55)$$

The assumption is made in all the calculations that $\psi = 1$ V.

Equations (53) and (55) make it possible to calculate the parameters of diode $D_1$ ($A_1$, $W_{i,1}$, $N_1$), starting with the previously assumed or calculated parameters of diode $D_2$: $W_{i,2}$, $A_2$, m and $V_{max}$. During calculation one need merely keep the $N_1$ and $W_{i,1}$ values in a range which guaranties that the breakdown voltage of diode $D_1$ is higher than $V_{max}$, i.e., $V_{BR,1} \geq V_{max}$. For our example, ($D_1$-Schottky diode; $D_2$-PiN diode with m=10, $W_{i,1}$=20 μm, $A_2$=0.1 cm²) and for $V_{max}$= 100 V, one obtains $N_1$=2×10¹⁵ cm⁻³ ($V_{BR} \cong 140$ V>$V_{max}$) and an area $A_1 \cong 0.4$ cm².

Table 1 gives calculated parameters of a GaAs controlled capacitor composed of a Schottky diode under reverse bias as $D_1$, and of a PiN diode under forward bias as $D_2$, connected in series.

TABLE 1

| Schottky diode ($D_1$) parameters | |
|---|---|
| $A_1$ | 0.1 cm² |
| C(0) | 3900 pF |
| $N_d$ | 2 × 10¹⁵ cm⁻³ |
| $I_{min}$ | 2 × 10⁻⁶ A |
| $I_{max}$ | 10⁻³ A |
| PiN diode ($D_2$) parameters | |
| $W_i$ | 2 × 10⁻³ cm |
| $(N_d-N_a)_i$ | <2 × 10¹¹ cm⁻³ |
| $A_2$ | 0.1 cm² |
| $C_i(W_i)$ | 50 pF |
| Main parameters of the capacitor | |
| $C_{min}$ | 60 pF |
| $C_{max}$ | 500 pF |
| $C_{max}/C_{min}$ | 8.3 |
| $V_{max}$ | 50 V |

Figure 29A:
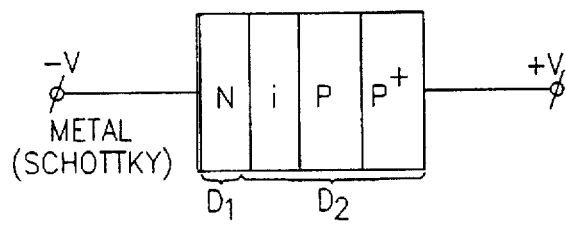
FIG. 29a shows an integrated construction of a controlled capacitor: $D_1$ is a Schottky diode with full-area contact.
Figure 29B:
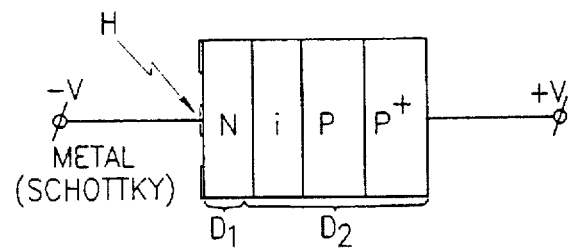
FIG. 29b shows an integrated construction of a controlled capacitor: $D_1$ is a Schottky diode with "windows" in the metal contact.

Controlled capacitors according to the present invention may be fabricated in integrated form. The construction of such a controlled capacitor composed of a Schottky diode as diode $D_1$, and of a forward biased PiN diode as a diode $D_2$ is illustrated in FIG. 29. What follows is a brief description of the fabrication steps.

Metallic layers are deposited on an epitaxially grown P⁺PiN structure having a defined i-region thickness, creating an ohmic contact with a specific contact resistivity of about $10^{-6}$–$10^{-7}$ ohm×cm² on the highly-doped P⁺substrate, and a Schottky barrier on the low-doped ($\cong 5 \times 10^{15}$ cm⁻³) N-layer. The breakdown voltage of such a Schottky barrier is about 40–70 V. The Schottky barrier is reverse-biased and the PiN diode is forward-biased. The reverse current of the Schottky diode is composed of volume and surface components. The surface component can be reduced by special treatment and protection of the side surface.

Figure 30:
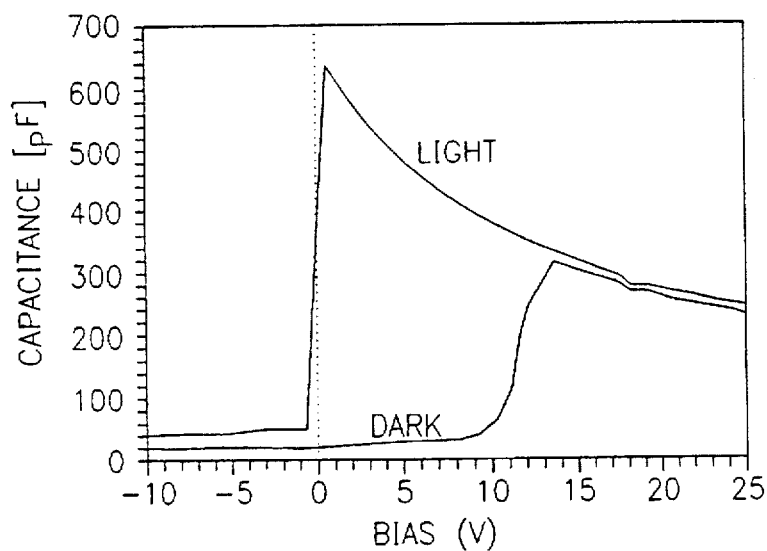
FIG. 30 shows experimentally determined C-V characteristics of an integrated GaAs LCC as shown in FIG. 29a under illumination ("light") and without illumination ("dark"). The areas of the Schottky diode $A_1$ and the PiN diode $A_2$ are 3'3 mm$^2$. $W_i$ in $D_2$ is 20 µm.
Figure 31:
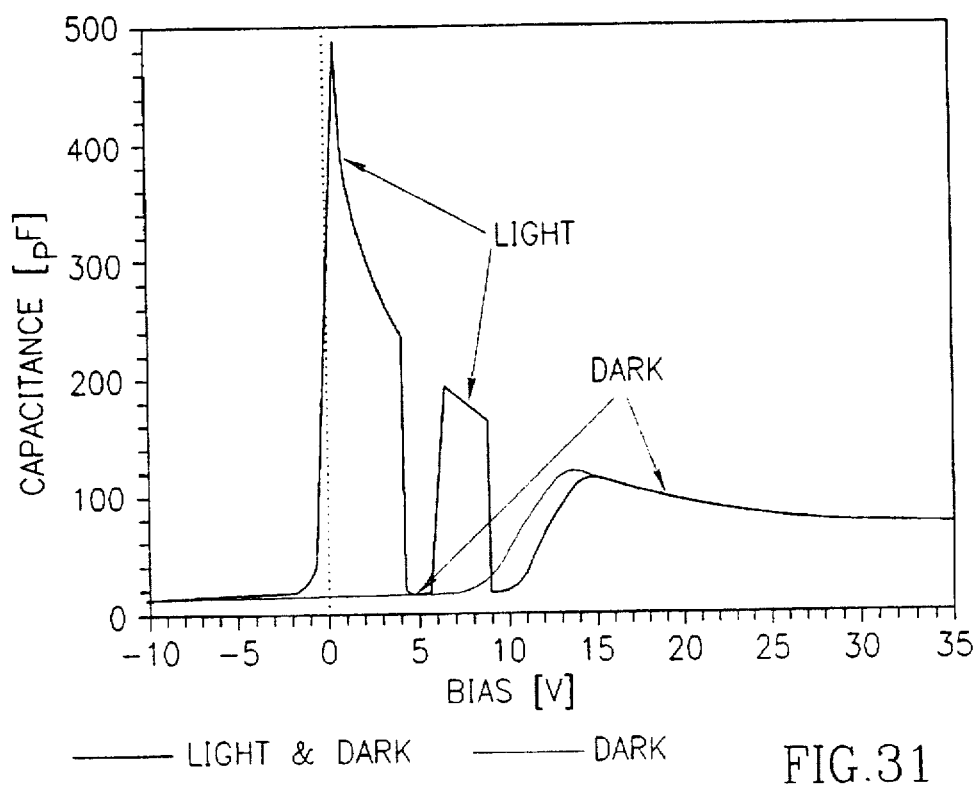
FIG. 31 shows experimentally determined C-V characteristics of an integrated GaAs LCC as shown in FIG. 29a under pulse illumination ("light" and "dark") and without illumination ("dark"). $D_1$ and $D_2$ diode areas are 2×2 mm$^2$. $W_i$ in $D_2$ is 30 µm.

The $C_{min}$ value is controlled by the thickness of the i-region of the PiN diode and by the cross-section area (equal in both $D_1$ and $D_2$, i.e., $A_1 = A_2$). FIGS. 30–31 demonstrate experimental Schottky diode I-V and C-V characteristics of such structures having different $W_i$ and A.

Figure 32A:
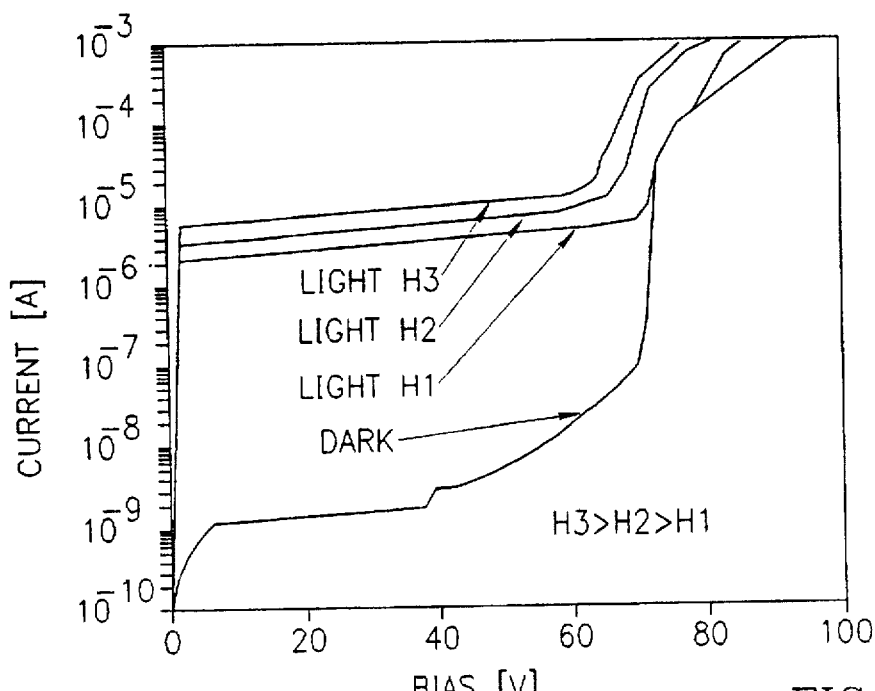
FIG. 32a shows the experimentally determined I-V characteristics of a GaAs LCC with integrated construction (as in FIG. 29a) under different illumination intensities. $A_1=A_2=$ 3×3 mm$^2$.
Figure 32B:
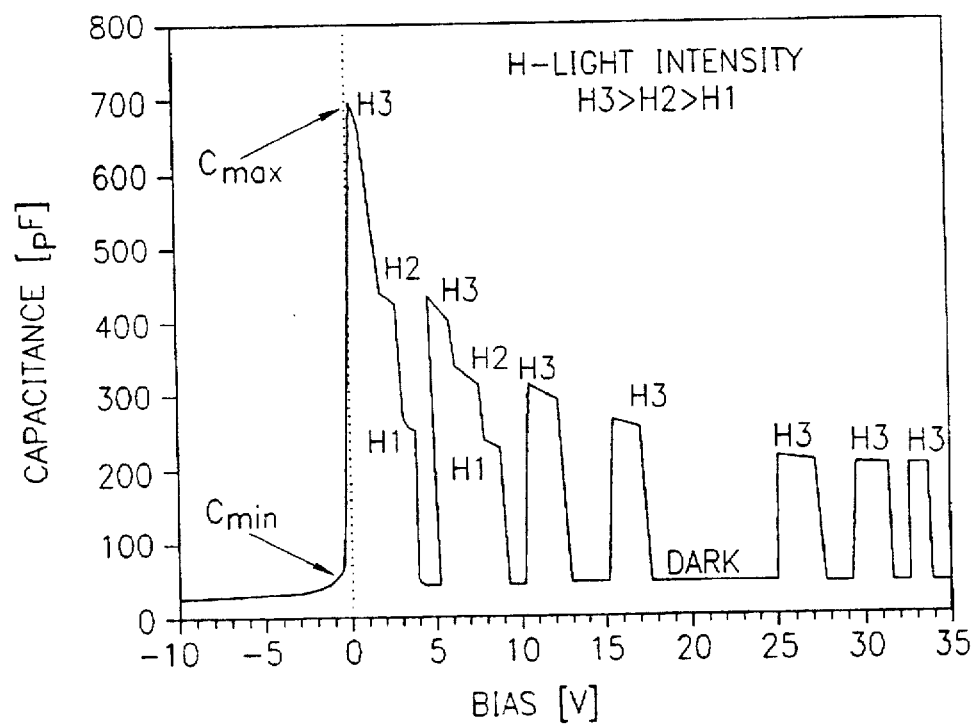
FIG. 32b shows the experimentally determined C-V characteristics of a GaAs LCC with integrated construction (as in FIG. 29a) under different illumination intensities. $A_1=A_2=$ 3×3 mm$^2$.

The light control can be provided by direct irradiation of the side surface of the Schottky diode. The current generated by light in the near-surface region is high enough for capacitance control. FIG. 32(a) shows experimental C-V characteristics of a light controlled capacitor (LCC) under various light intensities ($H_1 < H_2 < H_3$). A regular microscope illumination lamp was used as a light source, and voltage changes led to different light intensities. FIG. 32(b) shows the dependence of the reverse current of the Schottky diode on light intensity. To improve the light action effectiveness, light penetration through the Schottky barrier area is provided by etching the metallization, so that the contact has the shape of a metal grid or "fingers".

Figure 33A:
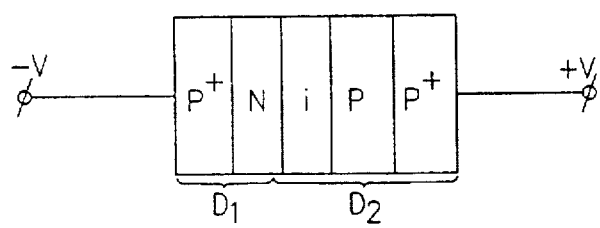
FIG. 33a shows another possible integrated construction of a controlled capacitor. $D_1$ is a PN diode with full-area ohmic contact.
Figure 33B:
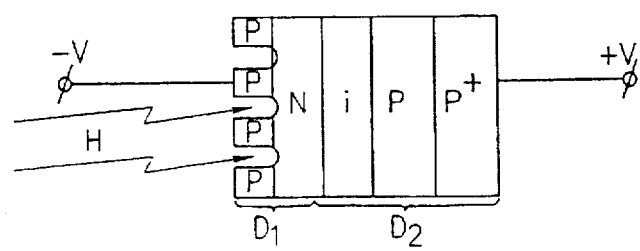
FIG. 33b shows another possible integrated construction of a controlled capacitor. $D_1$ is a PN diode with "windows" etched into the ohmic contact and the P-layer down to the N-layer.

Another variant of an integrated controlled capacitor design is based on the P⁺PiNP⁺ structure shown in FIG. 33, which includes a back-to-back connection of a P⁺N and a PiN diode. The P⁺N junction ($D_1$) can be made by an acceptor atom, such as Zn, diffusion into the N region of a GaAs P⁺PiN structure, or by the epitaxial growth of a P⁺-layer, for example by methods such as LPE, CVD, MBE or MOCVD, on N. Using diffusion, it is possible to get a more linear junction with a higher breakdown voltage of diode $D_1$. Etching the metallization and the P-layer in $D_1$ to open windows will improve the efficiency of light control.

Figure 34:
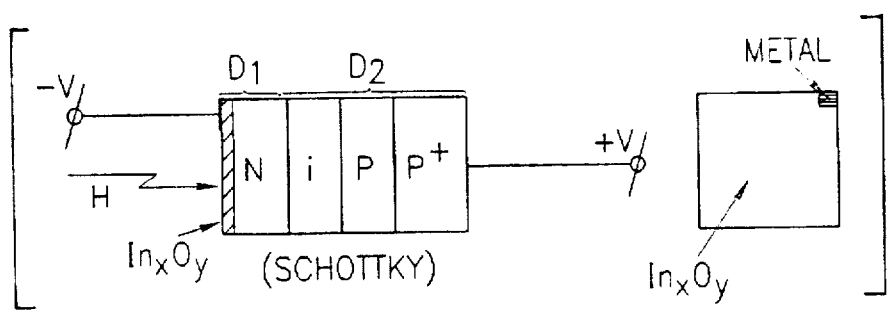
FIG. 34 shows an integrated construction of a controlled capacitor which uses a transparent layer (in this case $In_xO_y$) as the Schottky barrier for diode $D_1$. A corner metal pad provides the ohmic contact to the transparent barrier.
Figure 35:
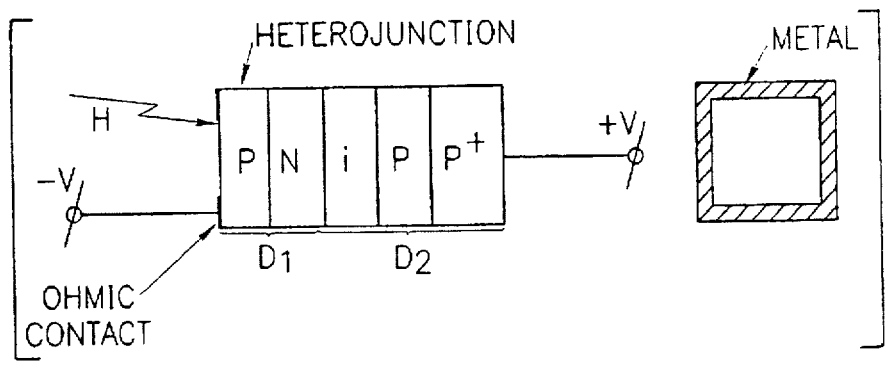
FIG. 35 shows an integrated construction of a controlled capacitor with a PN heterojunction as diode $D_1$. A window is etched in the top metal contact to allow penetration of radiation.

Instead of a P⁺-layer in $D_1$, one can form a transparent, conductive, Schottky barrier, using oxides such as $SnO_x$, $InO_x$ and $In_xSn_yO_z$ (FIG. 34). This variant creates a Schottky diode ($D_1$) in reverse bias connected to the forward-biased PiN ($D_2$) diode. Another variant uses a PN heterojunction in $D_1$ (FIG. 35). The use of a semiconductor with a wider band gap, such as GaAsP or GaAlAs, as the P-layer of diode $D_1$, widens the range of usable wavelengths and reduces the absorption in the P region, thereby improving the light sensitivity of the capacitor.

Figure 36A:
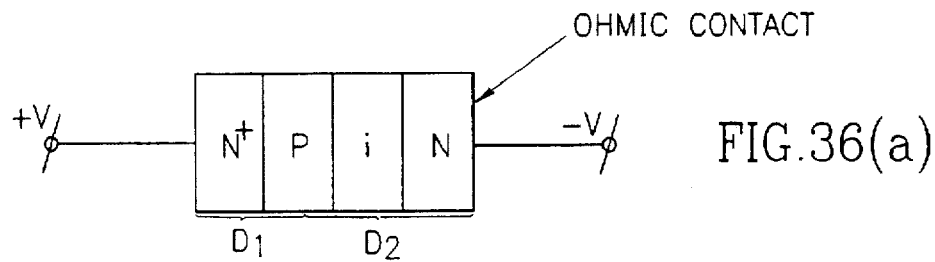
FIG. 36a shows an integrated construction of a controlled capacitor fabricated on a N$^+$ substrate with an ohmic contact to the N-layer.
Figure 36B:
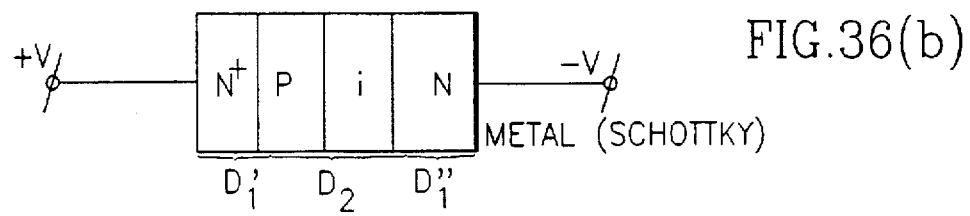
FIG. 36b shows an integrated construction of a controlled capacitor fabricated on a N$^+$ substrate with a Schottky barrier to the N-layer.

The controlled capacitor can also be fabricated on a N⁺ substrate (FIG. 36). First, a PiN layered structure is grown, e.g., by LPE. Either an ohmic contact or a Schottky barrier is then deposited on the N-layer. In the first construction (FIG. 36(a)), the characteristic of the capacitor is determined by the reverse I-V characteristics of the N⁺P junction. In the second (FIG. 36(b)) the N⁺P($D_1'$) and the Schottky ($D_1''$) diodes are both reverse-biased, and connected in series, and therefore the voltage held by $D_1' + D_1''$ is larger than in the first case (FIG. 36(a)).

Controlled capacitors can also be designed in the form of a matrix arrangement, as shown in FIG. 37. The structure is separated into elementary cells, each of which includes a forward-biased PiN diode in series with a reverse-biased Schottky diode (FIG. 37(a)) or a reverse-biased PN junction. (FIG. 37(b)). For light control, windows are etched in the metallization of each cell. In general, all the previously discussed variants (FIGS. 29, 33–36) can be realized in a matrix form. The main advantage of such a form is the added possibility of controlling the capacitance of a separate cell, or of a group of cells, by appropriate irradiation.

Figure 38:
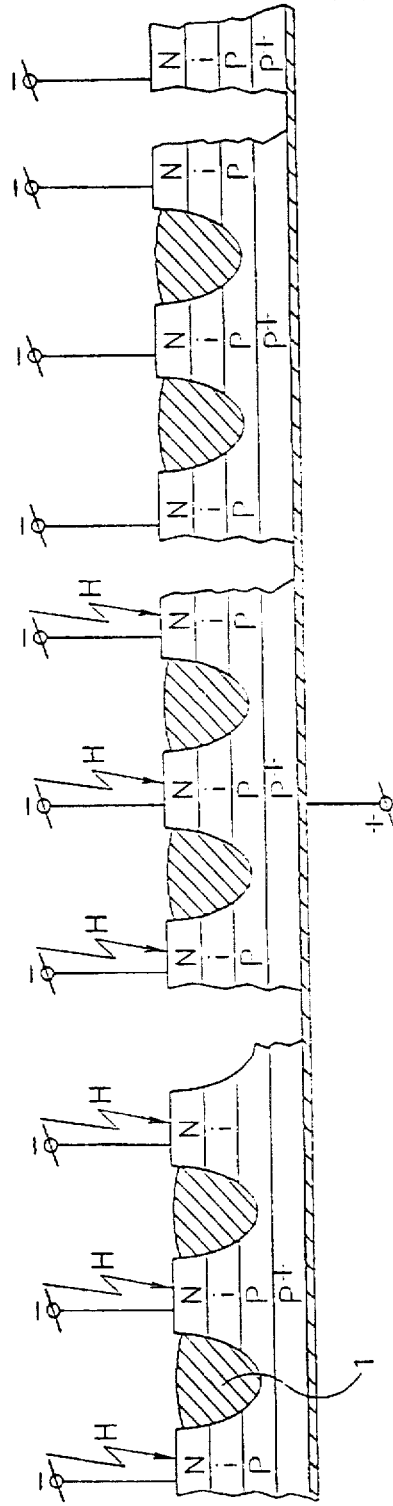
FIG. 38 shows a parallel connection of many arrays as in FIG. 37 on a common metallic anode.
Figure 38A:
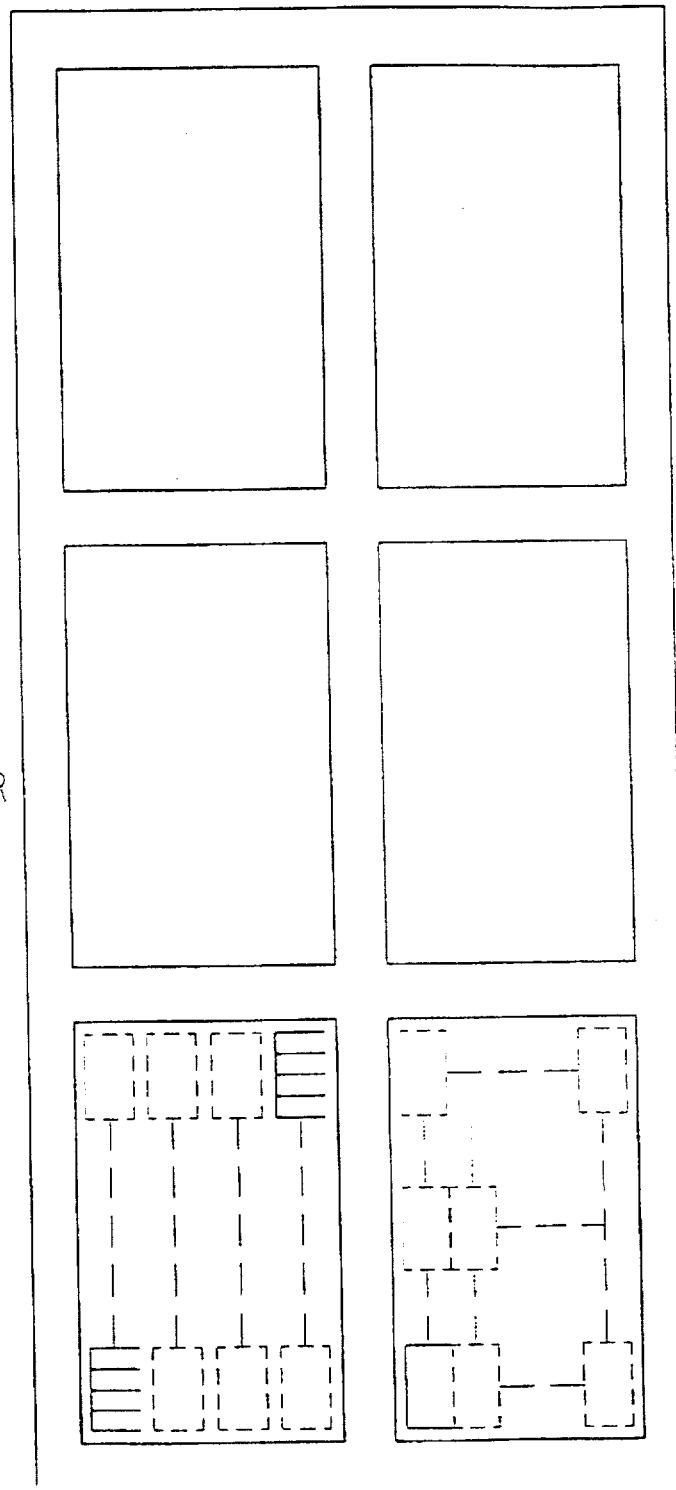

A matrix form can also be used to obtain large values of capacitance ($C_{min}$). For this purpose the cells of the matrix must be connected in parallel with the common cathode. A further increase in the total capacitance may be achieved by the parallel connection of a number of matrices to a common metallic anode (FIG. 38). In this way one can design a controlled capacitor having relatively high $C_{min}$ and $C_{max}$.

Figure 39A:
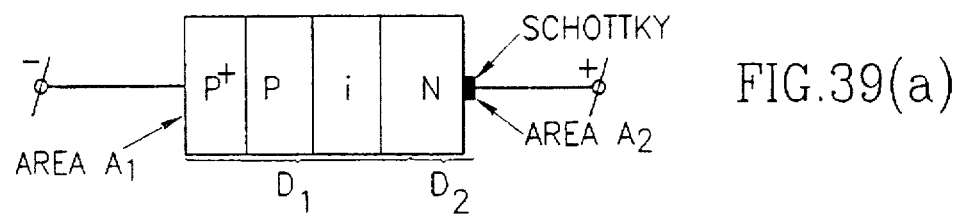
FIG. 39a and 39b show an inverted controlled capacitor construction, i.e., a design with a forward-biased Schottky diode as $D_2$, and a reverse-biased PiN diode as $D_1$.
Figure 39B:
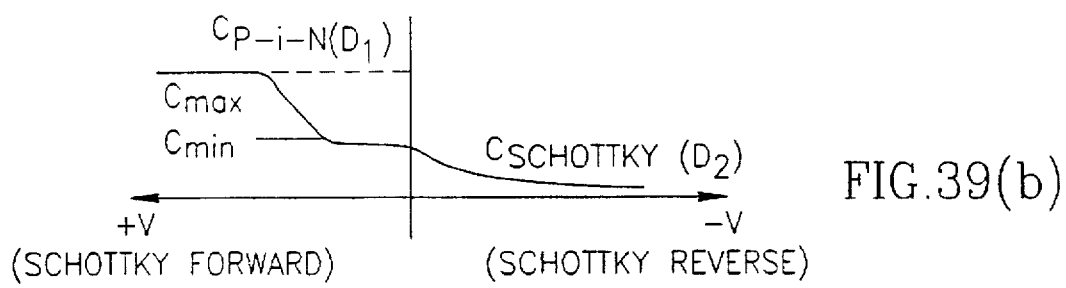

One can also consider an inverted construction (FIG. 39), i.e., a design having a forward-biased Schottky diode as $D_2$ and a reverse-biased PiN diode as $D_1$. From the previous analysis it follows that a condition for $C_{max}/C_{min} > 1$ is that $C_{PiN}(V) > C_{Sch}(0)$. For this construction a system of equations can be written in the form $$C(V) = [C_{PiN}(W_i) \times C_{t,Sch}(V_2)] / [C_{PiN}(W_i) + C_{t,Sch}(V_2)]$$

$$V_2 = (kT/q)\ln[I_{PiN}/(J_{0,Sch}A_2) + 1] \quad (55)$$

$$I_{PiN} = A_1 \times j_1(V)$$

This is in principle a different situation than the one encountered before where the capacitance of a forward-biased Schottky diode was controlled by the reverse current of a PiN diode. In this circuit, the diffusion capacitance is absent, and all C(V) changes are caused by the changes in the depletion capacitance of the forward-biased Schottky diode. The advantage of this circuit is high operation rates, because the relaxation time of the depletion capacitance is less than 1 ns, as shown below. In addition, $V_{min}$ for this construction will be higher because of the high breakdown voltage of PiN diodes, and the reverse current can be significantly lower than $I_{min}$ up to high biases.

One can estimate the ratio of the areas $A_1/A_2$. When $$C_{PiN} \cong (\epsilon\epsilon_0 A_1)/W_i \cong 10^{-12} A_1/W_i$$

and $$C_{Sch}(0) = A_2(q\epsilon\epsilon_0 N_d/2\psi)^{0.5} = 2.7 \times 10^{-16} A_2(N_d)^{0.5} \text{ and } \psi = 1$$

then $$C_{PiN}/C_{Sch}(0) = 4 \times 10^3 /[W_i(N_d)^{0.5}] \times A_1/A_2 \quad (56)$$

Figure 40:
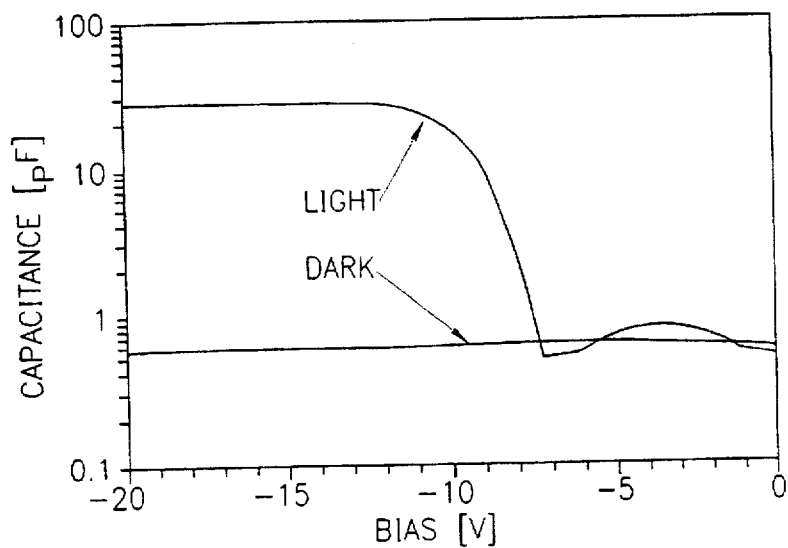
FIG. 40 shows experimentally determined C-V characteristics of the inverted construction with a dot barrier contact to the low-doped N-layer of a GaAs PiN diode structure of 2×2 mm² area ($A_2 << A_1$) and $W_i$=20 μm.

The ratio $C_{PiN}/C_{Sch}(0)$ increases with decreasing $W_i$ and/or $N_d$, and by increasing $A_1/A_2$. Assuming $C_{PiN}/C_{Sch}(0) = 10$, $N_d = 5 \times 10^{15}$ cm$^{-3}$ and $W_i = 20$ μm, one obtains $A_1/A_2 \cong 350$, i.e., the area of the Schottky barrier has to be about 350 times smaller than that of the PiN diode. This remit was obtained experimentally with a dot barrier contact to the low-doped ($\cong 5 \times 10^{15}$ cm$^{-3}$) N base of a PiN diode structure with an area of $3 \times 3$ mm$^2$ (FIG. 40).

Figure 41A:
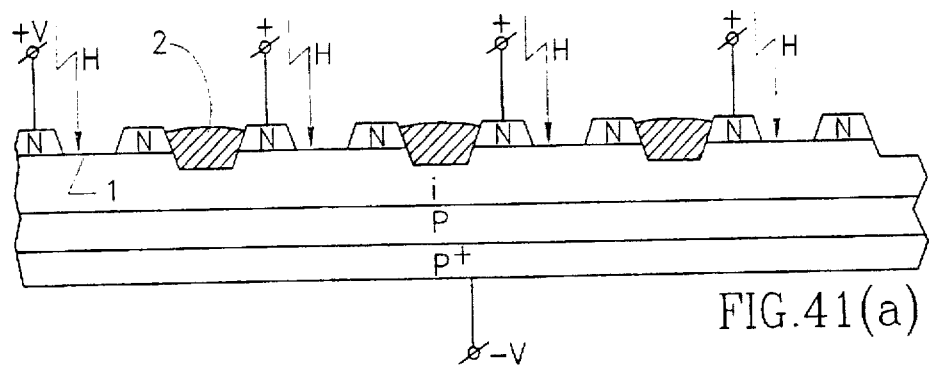
FIG. 41 shows an inverted matrix construction with a reverse-biased common PiN diode $D_1$. (1)—"windows"; (2)—dielectric compound.
Figure 41B:
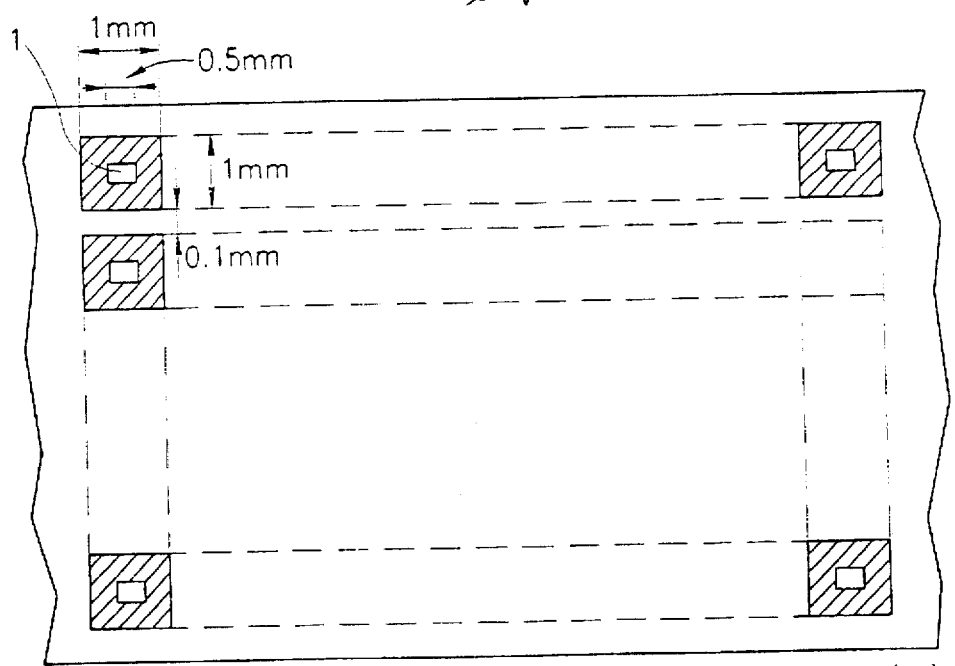

One of the interesting applications of such a configuration is as a high-voltage, high speed, light-controlled capacitance matrix, the design of which is shown in FIG. 41. The reverse-biased PiN structure is a common diode $D_1$ for hundreds of forward-biased Schottky diodes. Windows (1) through the N-layer are etched down to the i-region. Some windows are then filled by an opaque dielectric compound (2) to electrically isolate the diodes, and to protect the spaces between the matrix elements from light. The light absorbed in a window (1) generates electron-hole pairs in the i-region which leads to the growth of the reverse current $I_{rev}$ of the PiN diode and consequently to the growth of the capacitance of the matrix cell through which the current is passed.

If the "dark" reverse current of the PiN diode in the matrix is lower than $I_{min}$, then by irradiation of the same cell, it is possible to raise the capacitance of this cell up to the capacitance of the PiN structure, that is, up to the capacitance of the entire matrix. If the matrix (i.e., PiN diode) area is $A_i = 10$ cm$^2$, the area of a single cell (that is, a Schottky diode) has to be smaller than 1000 mm$^2$/350 $\cong$ 3 mm$^2$ (see calculation above). Starting with the dimensions given in FIG. 41, one obtains $A_2 = 0.75$ mm$^2$, $C_{Sch}(0) \cong 150$ pF and $C_{PiN} \cong 5000$ pF, i.e., $C_{PiN}/C_{Sch}(0) \cong 35$.

The most difficult technological problem in the fabrication of such a matrix is to ensure the homogeneous distribution of the reverse current among all the cells, and to guarantee an $I_{rev}$ value below $I_{min}$ for each cell.

Figures 42A, 42B:
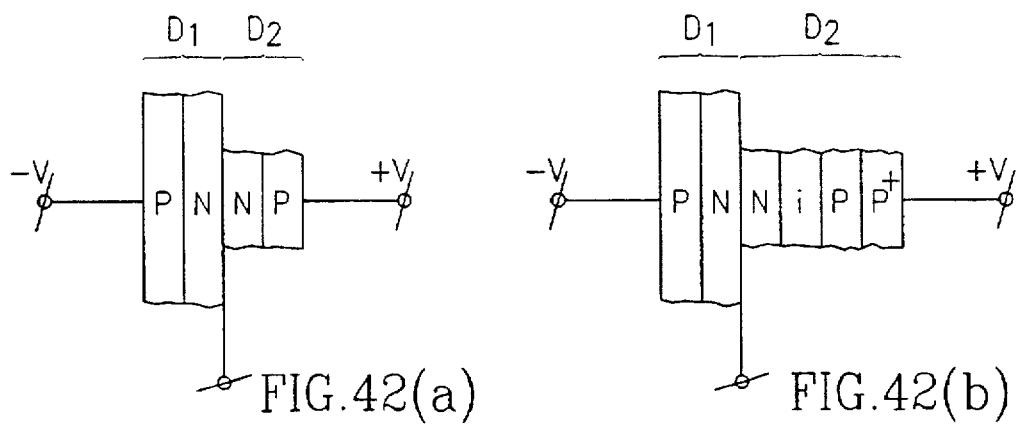
FIG. 42a shows a hybrid construction, i.e., separate back-to-back $D_1$ and $D_2$ diodes, of a controlled capacitor comprising two PN diodes as $D_1$ and $D_2$ with equal or with different areas. In this illustration, the diodes are "glued" together by a conductive medium.
FIG. 42b shows a hybrid construction, i.e., separate back-to-back $D_1$ and $D_2$ diodes, of a controlled capacitor comprising a PN diode as $D_1$ and a PiN diode as $D_2$, the diodes may have equal or different areas. In this illustration, the diodes are "glued" together by a conductive medium.
Figure 43A:
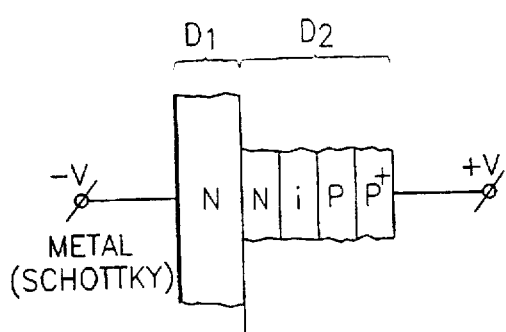
FIG. 43a shows a hybrid construction of a controlled capacitor including a reverse-biased Schottky diode and forward-biased PiN diode with equal or different areas, and with full-area Schottky contact.
Figure 43B:
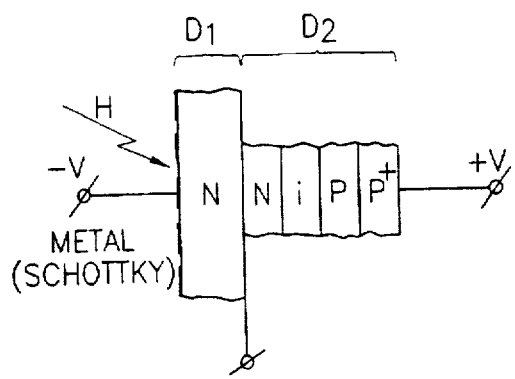
FIG. 43b shows a hybrid construction of a controlled capacitor including a reverse-biased Schottky diode and forward-biased PiN diode with equal or different areas and with "windows" in the Schottky contact.
Figure 44A:
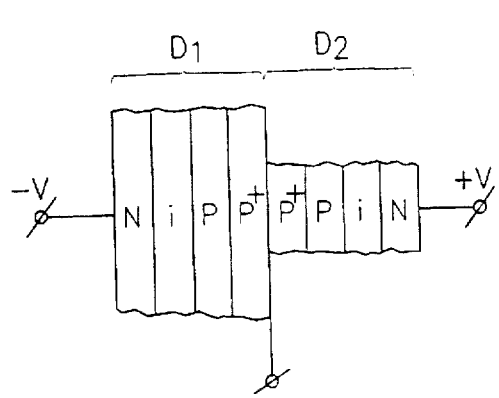
FIG. 44a shows a hybrid construction of a controlled capacitor including two back-to-back PiN diodes with equal or different areas; full-area ohmic contact to the N-layer of the reverse-biased diode.
Figure 44B:
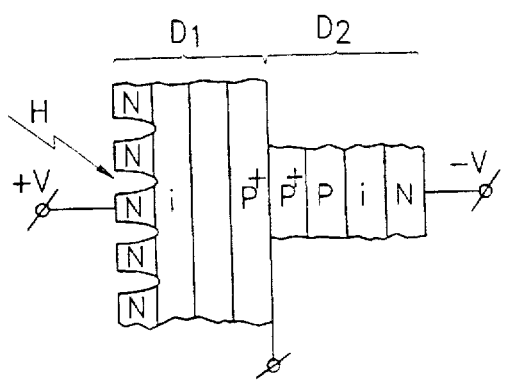
FIG. 44b shows a hybrid construction of a controlled capacitor including two back-to-back PiN diodes with equal or different areas and with "windows" in the ohmic contact and the N-layer of the reverse-biased diode.

A hybrid design of a controlled capacitor (that is, separate back-to-back $D_1$ and $D_2$ diodes) is preferable when it is necessary to connect two diodes having different areas, or whenever it is impossible technologically to fulfill the $I_{min}$ and $V_{min}$ conditions using an integrated design. A hybrid design also enables electrical connection to the "middle point" between the diodes, which can be useful for some applications, and/or connection of sensors or other current regulation elements for capacitance control. In a hybrid construction the elements can be connected by a conductive glue or by soldering. A few illustrative examples of CCC's and LCC's in a hybrid design are shown in FIGS. 42, 43 and 44.

Figure 45A:
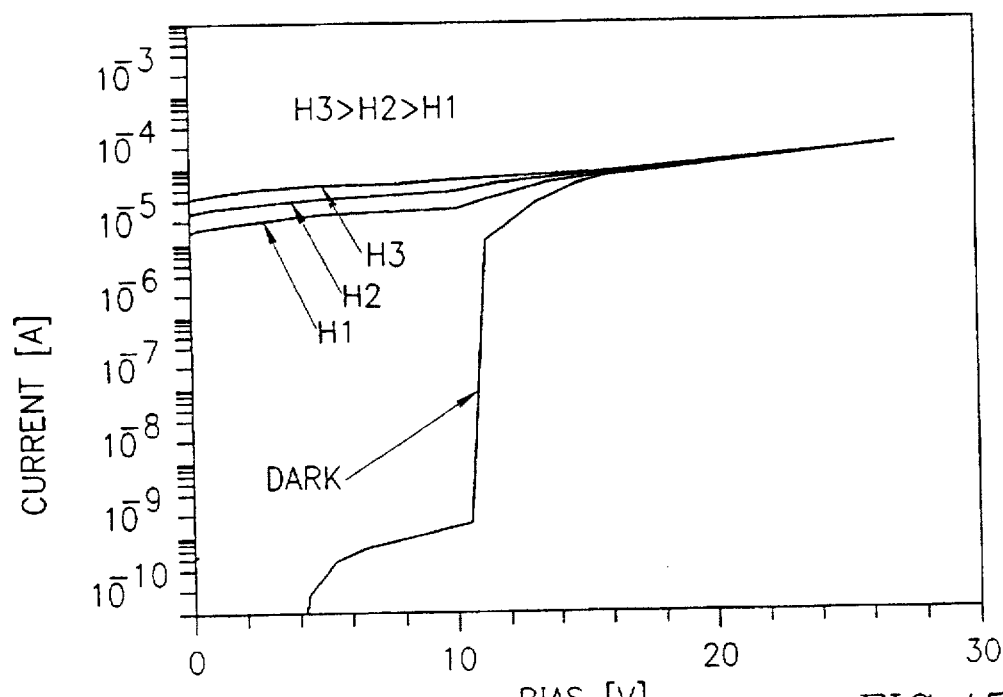
FIG. 45a shows experimentally determined I-V characteristics of a GaAs Schottky diode of 3×3 mm² area with a comb-shaped barrier metallization of 0.04 cm² active area $A_1$ (area of Schottky barrier). H - light intensity.
Figure 45B:
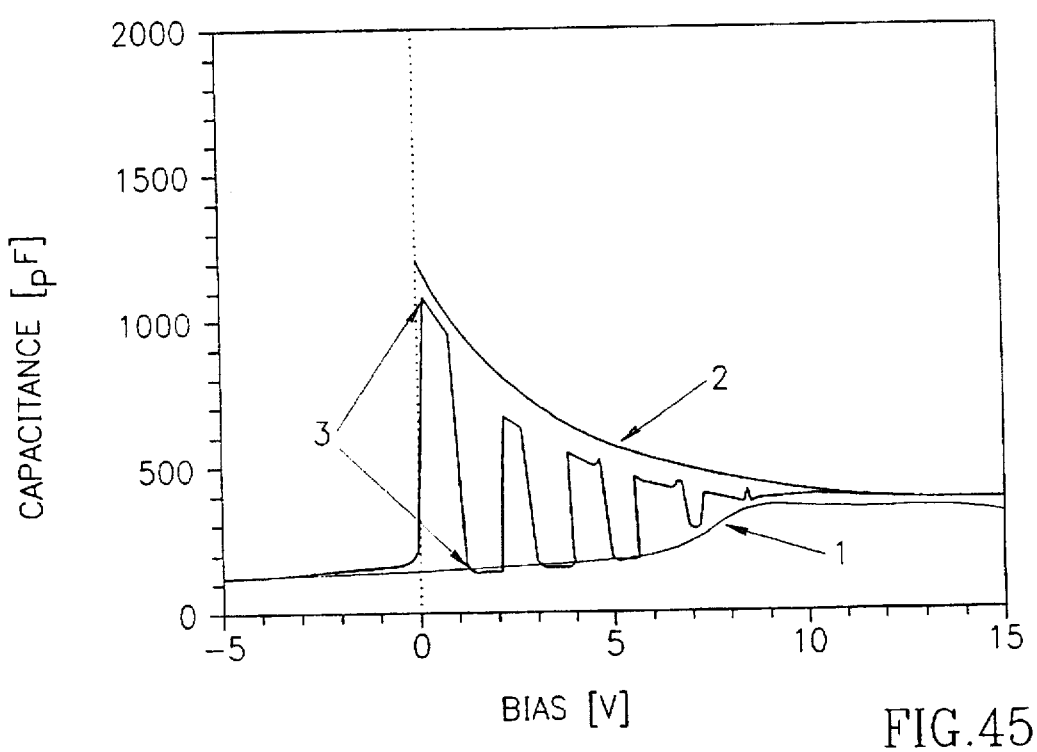
FIG. 45b shows experimentally determined C-V characteristics of a hybrid LCC composed of a Schottky diode as in FIG. 44a, and of a GaAs PiN diode of 0.36 cm² area and $W_i$=20 μm: 1 —"dark" C-V of the LCC; 2 —"dark" C-V of the Schottky diode; 3 —the capacitance of the LCC is changing between (1) and (2) when illumination is switched on and off.

FIG. 45(a) shows the reverse I-V characteristics of a Schottky diode of $3 \times 3$ mm$^2$ area with a comb-shaped barrier metallization of an active area $A_1$ of 0.04 cm$^2$. The base doping concentration is about $(1-2) \times 10^{16}$ cm$^{-3}$ and the breakdown voltage about 30 V. Light irradiation by a microscopic light source increases the "dark" reverse current by up to four orders of magnitude. FIG. 45(b) shows the measured C-V characteristics of a hybrid LCC composed of this Schottky diode and of a PiN diode with a 0.36 cm$^2$ area and $W_i = 20$ μm. Curve 1 is the "dark" C-V of the LCC, curve 2 is the "dark" C-V of the Schottky diode, and curve 3 shows how the LCC capacitance switches between these two when the light is switched on and off.

Figure 46A:
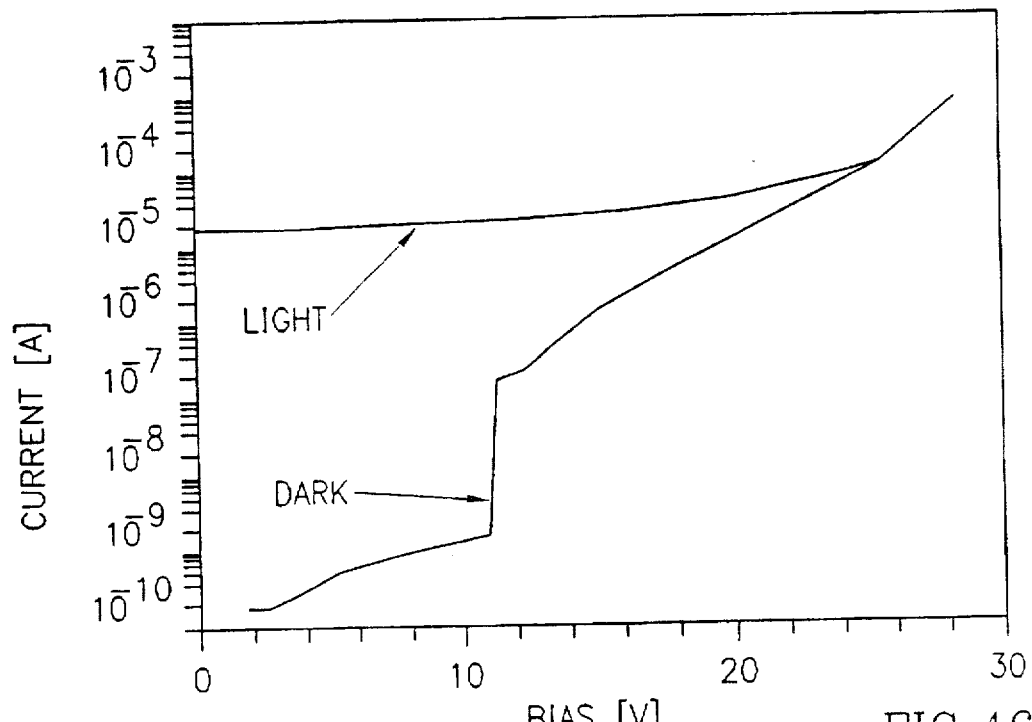
FIG. 46a shows the I-V characteristics of a similar GaAs Schottky diode to that of FIG. 45a but with an active Schottky diode area of about 0.07 cm².
Figure 46B:
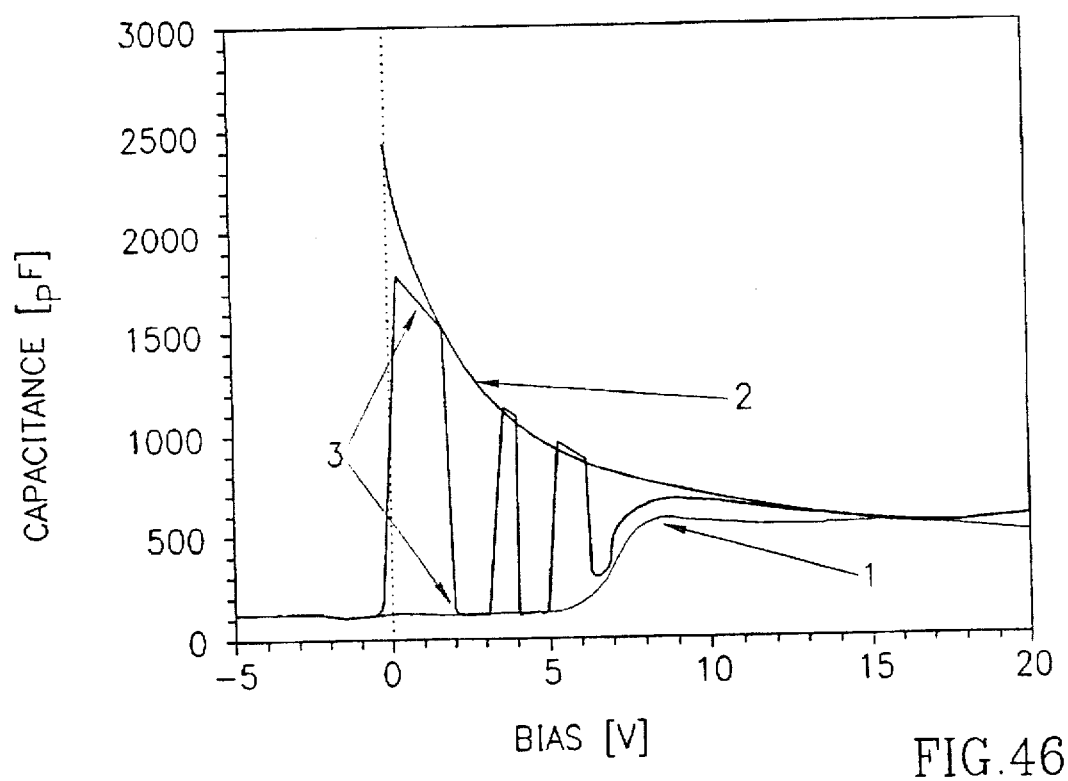
FIG. 46b shows the C-V characteristics of a similar LCC to that of FIG. 45b but with an active Schottky diode area of about 0.07 cm². As a result, the $C_{max}$ values are also higher than in FIG. 45.

FIGS. 46(a) and 46(b) show I-V and C-V characteristics of a similar LCC, but having an active area of the Schottky diode of about 0.07 cm$^2$, and therefore $C_{max}$ values also higher than in FIG. 45.

Figure 47A:
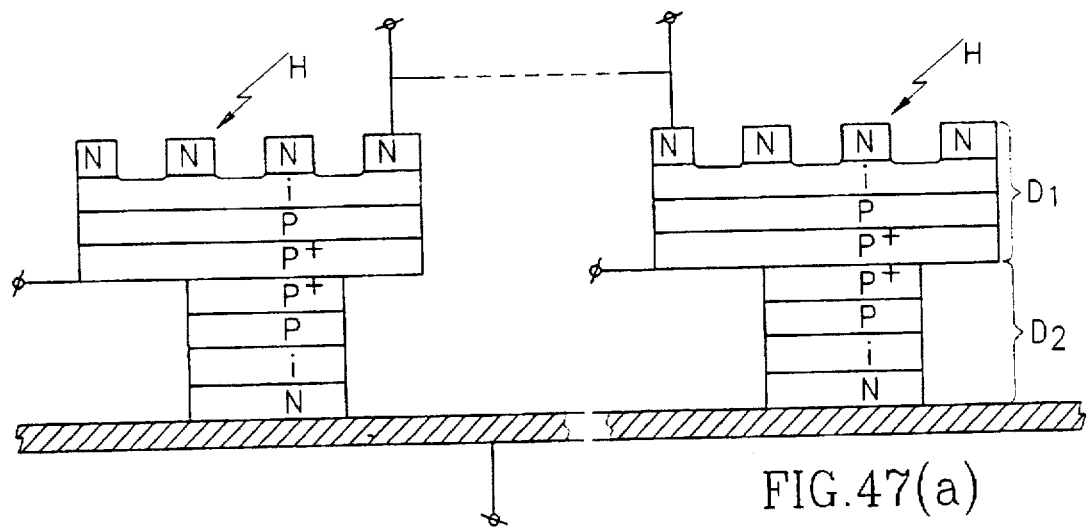
FIG. 47a shows the parallel connection of many hybrid controlled capacitors on a common metal anode. $D_1$ —reverse-biased PiN diodes with a "comb" shape etched top contact and N-layer, $D_2$—forward-biased PiN diodes.
Figure 47B:
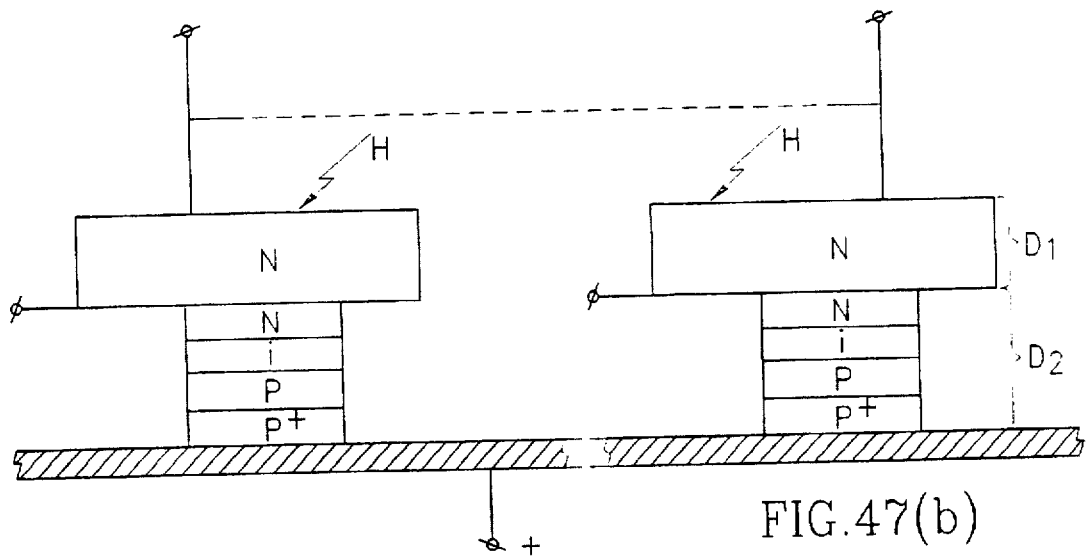
FIG. 47b shows the parallel connection of many hybrid controlled capacitors on a common metal anode. $D_1$—reverse-biased Schottky diodes with a "comb" shape etched metal barrier, $D_2$—forward-biased PiN diodes.
Figure 47C:
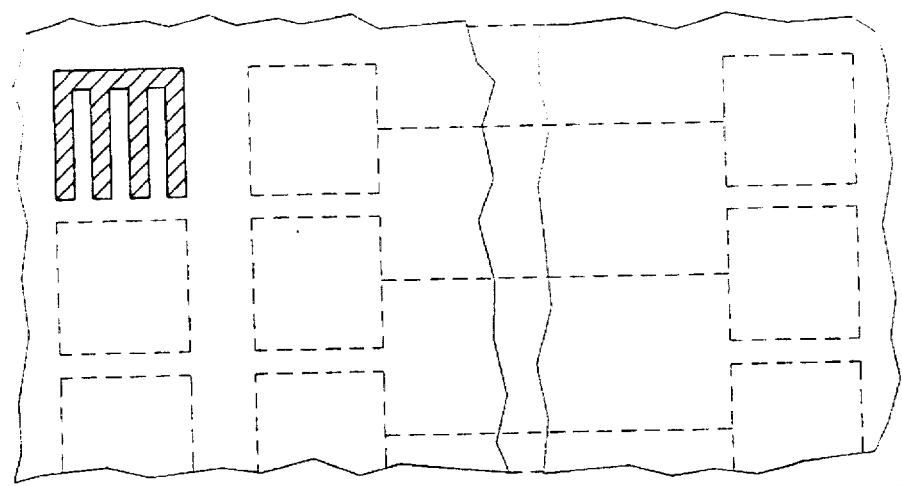
FIG. 47c shows the parallel connection of many hybrid controlled capacitors on a common metal anode. Top view of the structures in FIGS. 47a and 47b.

The hybrid construction is the only one possible for application in high power converters, where large capacitances have to be controlled at high voltages. In this case a number of capacitors are connected in parallel, as shown in FIG. 47.

The dynamic characteristics of a controlled capacitor are determined mainly by the time constants of the loading and unloading of the various capacitances in the device. One can estimate the operation rate of a controlled capacitor composed of two "back to back" diodes connected in series. The time constant of such a capacitor is determined to a first approximation by two components: 1) $\tau_{c,R} \cong RC_t$, the loading (unloading) constant of the depletion region capacitance, where R is the series resistance of the contacts and of ohmic resistances of various regions of the structure; and 2) the loading (unloading) constant of the diffusion capacitance $\tau_d$.

R can be written as $$R = \Sigma_k(\rho_k l_k/A_k) + \Sigma_s(\rho_s/A_s) \quad (57)$$

where $\rho_k$ represents the ohmic resistivities of the layers of the semiconductor structure, $l_k$ represents their thicknesses, $\rho_s$ is the specific contact resistivity [ohm×cm$^2$], $A_k$ are the areas of the layers and $A_s$ are the areas of the contacts.

The $\tau_{C,R}$ value for a GaAs PiN diode connected in series with a reverse-biased diode can be estimated from the following arguments. Assuming that: (1) diodes $D_1$ and $D_2$ have equal areas; and (2) contact resistivities can be neglected, one obtains:

$$\tau_{C_tR} = R(C_{max} - C_{min}) \cong mC(W_i)\Sigma_k(\rho_k l_k/A)$$

or $$\tau_{C_tR} \cong (m\epsilon\epsilon_0/W_i)\Sigma_k\rho_k l_k \quad (58)$$

The time constant for a Schottky diode connected to a PiN diode in a integrated construction (FIG. 29) is:

$$\tau_{C_tR} = m\epsilon\epsilon_0/(W_i q)[l_N/(\mu_N n_N) + l_p/(\mu_p p_p)] \quad (59)$$

Assuming that $l_N = l_p = 100$ μm, $n_N \cong p_p = 10^{15}$ cm$^{-3}$, $\mu_n = 8000$ V/cm$^2$s, $\mu_p = 400$ V/cm$^2$s, m(V)≅10 and $W_i = 20$ μm one obtains $\tau_{C_tR} \cong 10^{-9}$ s=1 ns. If diodes $D_1$ and $D_2$ have equal areas, from Equations (58) and (59) it follows that $\tau_{C_tR}$ is independent of the diodes area.

Figure 48A:
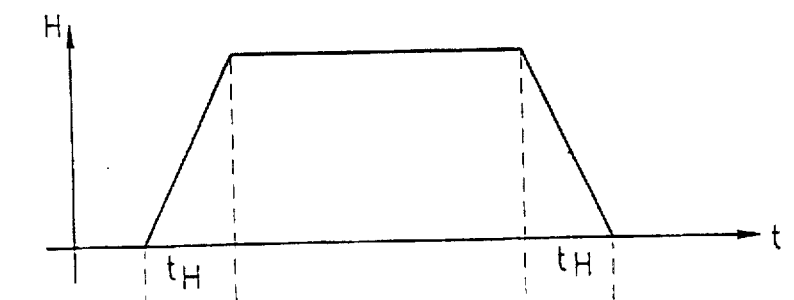
FIG. 48 is a schematic depiction of the dependencies of the illumination, the current through diode $D_1$ and the capacitance with time.
Figure 48B:
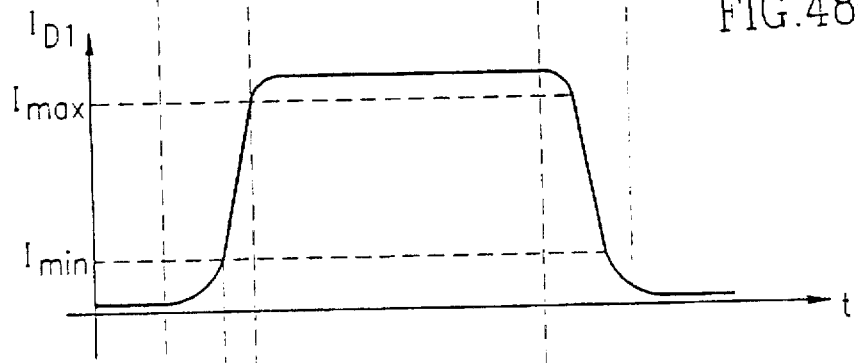
Figure 48C:
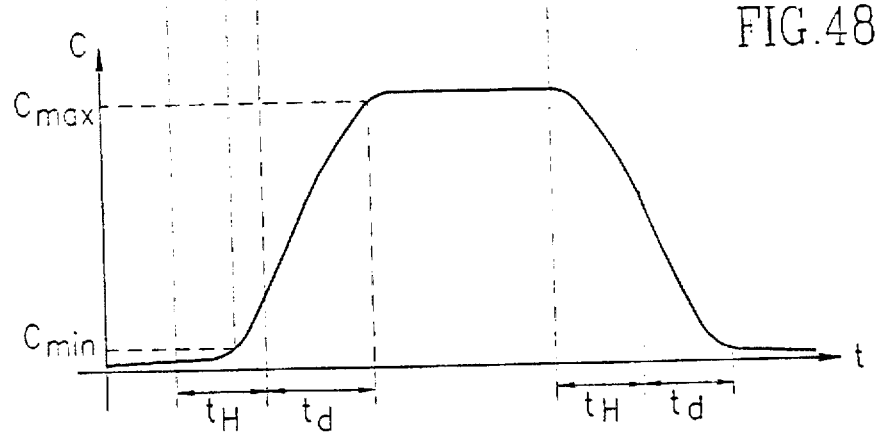

$\tau_d$ can be obtained to a first approximation from:

$$W_i^2/(2D)|_{W_iL<1} \leq \tau_d < \tau_i|_{W_iL>1} \quad (60)$$

where $\tau_i$ is the carrier lifetime in the i-region of the PiN diode. Assuming that $\tau_i \cong 150$ ns and $W_i$ is in a range between 5 and 100 μ, one obtains a $\tau_d$ value between 10 and 150 ns. Comparing the two relaxation times (time constants) one sees that the relaxation of the diffusion capacitance is the slower process. The relaxation time depends also on the frequency of the controlling light source. This is shown qualitatively in FIG. 48. The faster is the current reaction of diode $D_i$ to the irradiation change, the closer will be the relaxation time to the value determined by the time constant of the diffusion capacitance $\tau_d$. From a maximum operation rate viewpoint, the requirement for the frequency of the light source, such as light diodes, lasers, and the like, can be formulated from the condition that the time constant of the light intensity rise $\tau_H$ ($\sim t_H$) be much smaller than $\tau_d$ ($\cong t_d$). If, for example, $\tau_H \cong 0.1 \rho_d$, then 1 ns ≤ $\tau_H$ ≤ 15 ns.

Figure 49:
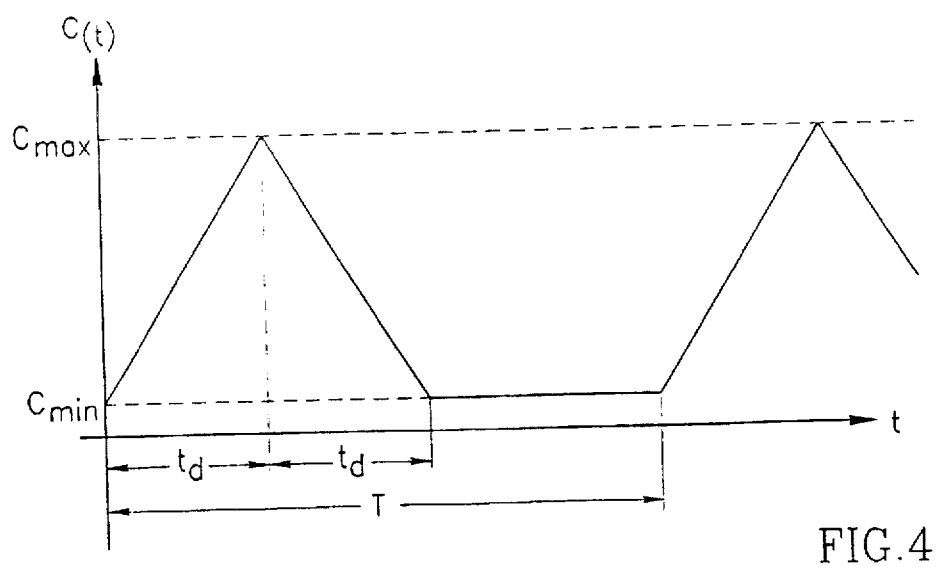
FIG. 49 is a depiction of the time dependence of capacitance when the unloading time is determined mainly by $\tau_d$.

The energy accumulated in a capacitor by the charging is $$\Delta C \times V^2/2 [J]$$

where $\Delta C = C_{max} - C_{min}$. The power returned to an external load R during unloading is:

$$P \cong \Delta C \times V^2/(4t_{RC})$$

where $t_{RC}$ is the unloading time of the capacitor to an R, ($t_{RC} \cong R\Delta C + \tau_d$). If $R\Delta C << \tau_d$, then the unloading time is determined mainly by $\tau_d$ (FIG. 49). The limit power of the capacitor unloading is:

$$P_{lim} = \Delta C \times V^2/4t_c \quad (61)$$

The power averaged over a period (see FIG. 49) is:

$$P_{av} = \Delta C \times V^2/4T \cong \Delta C \times (V^2/4)f$$

where f is the frequency and T is the period of the signal. In the limit case $T_{min} \cong 2 t_d$, and $$P_{av,lim} = \Delta C \times V^2/8t_d = \Delta C \times (V^2/4)f_{max} \quad (62)$$

where $f_{max} \cong 1/(2t_d)$. For $t_d \cong 100$ ns, $f_{max} = 5$ MHz.

Figure 50A:
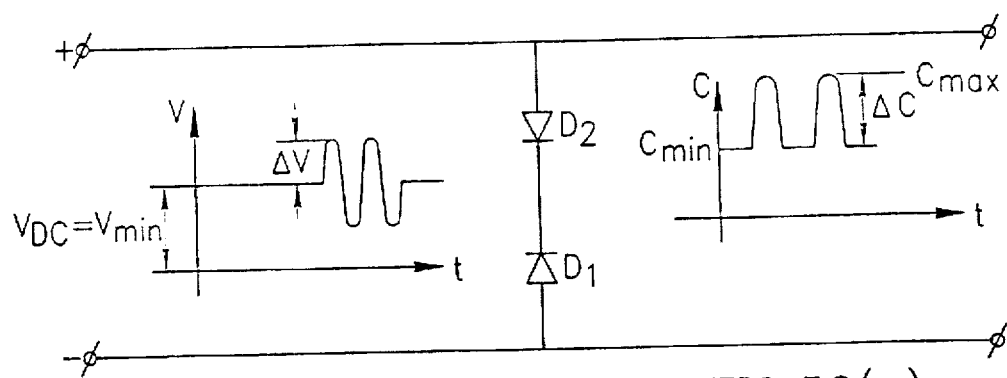
FIG. 50a is a suggested scheme for a CCC-based alternating voltage-to-alternating capacitance converter.
Figure 50B:
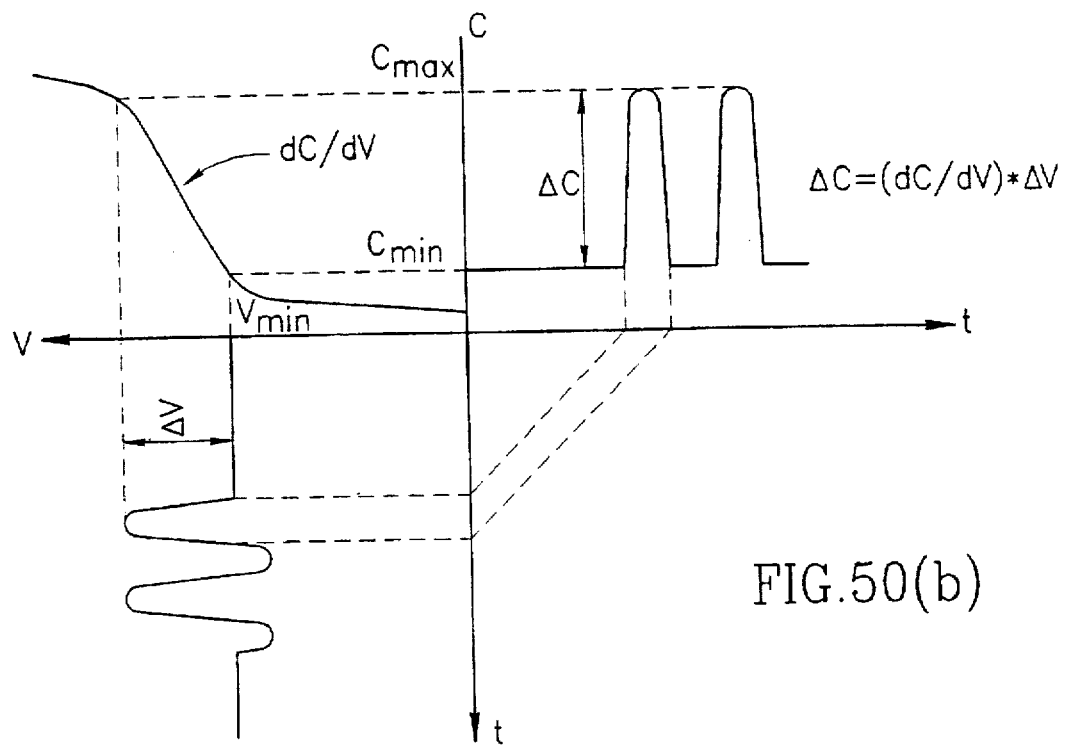

Devices according to the present invention may find application in a wide variety of applications, all of which are intended to fall within the scope of the present invention. Three possible areas of controlled capacitor applications are: (1) LCR contours and amplifiers; (2) sensors and detectors; and (3) power converters. FIG. 50 demonstrates an idea for converting an alternating voltage into an alternating capacitance. Because $$\Delta C \cong dC/dV \times \Delta V,$$

the higher the slope of the C-V characteristic dC/dV, the smaller has to be the ΔV value to obtain the expected ΔC.

$$\Delta C_{max} = (C_{max} - C_{min}) \cong dC/dV \times \Delta V_{max}$$

$\Delta C_{max}$ and dC/dV are the parameters of a controlled capacitor.

Figure 51A:
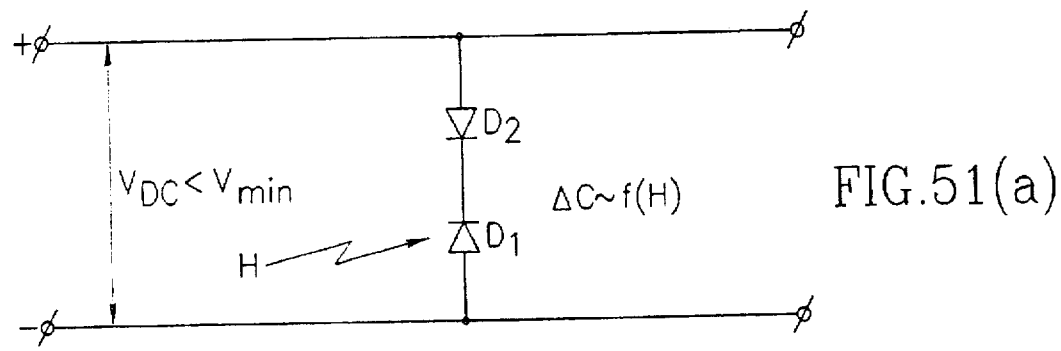
FIG. 51a depicts using an LCC to convert a radiation pulse into a capacitance pulse without a special receiver of radiation ($D_1$ is itself radiation sensitive)
Figure 51B:
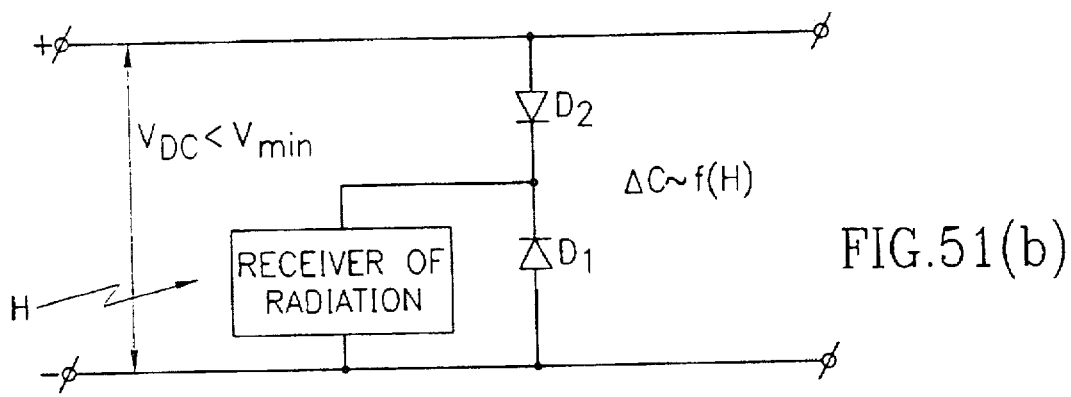
FIG. 51b depicts using an LCC to convert a radiation pulse into a capacitance pulse with a special receiver of radiation (such as a photodiode, photoresistor, etc.)
Figure 51C:
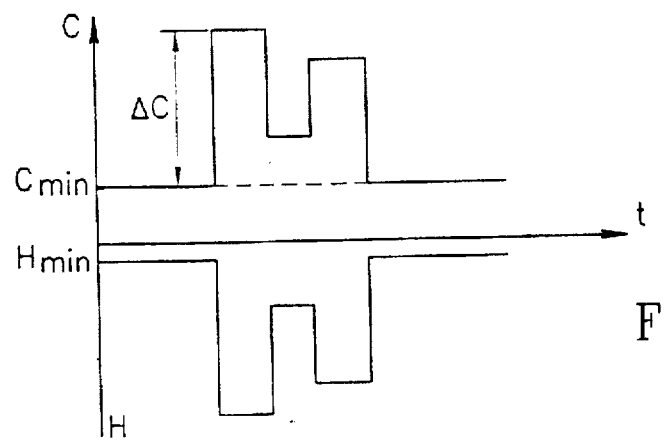
FIG. 51c depicts the time dependence of the radiation and the capacitance using an LCC to convert a radiation pulse into a capacitance pulse.

FIG. 51 shows two different circuits using an LCC. The grog of the capacitance as a result of irradiation takes place practically under a constant bias on the controlled capacitor, because ΔV≅0.2–0.4 V. $\Delta C = C - C_{min}$ is proportional to $H - H_{min} = \Delta H$, where H is the intensity of radiation. $\Delta C_{max} \cong C_{max} - C_{min} \sim \Delta H_{max}$. The slope of a characteristic is $$dC/dV \cong \Delta c/\Delta V \sim \Delta H$$

$$(dC/dV)_{max} \cong C_{max}/\Delta V \sim \Delta H_{max}$$

Figure 28C:
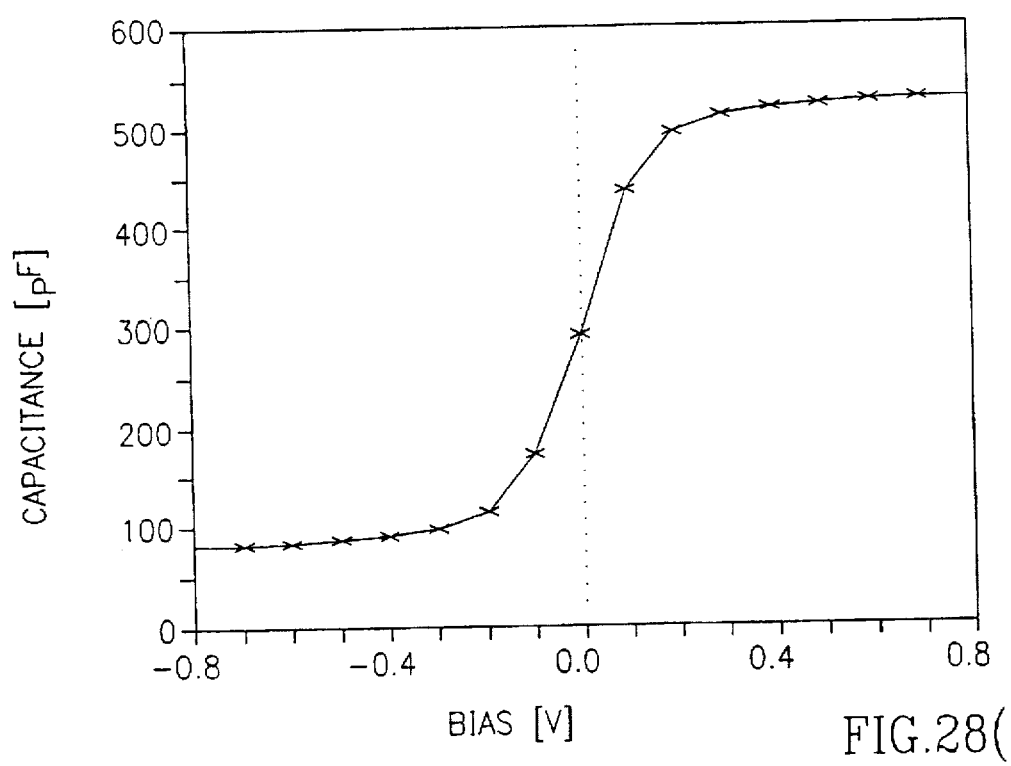
FIG. 28c shows a more detailed view of the C-V characteristics of the same LCC around zero bias.
Figure 28A:
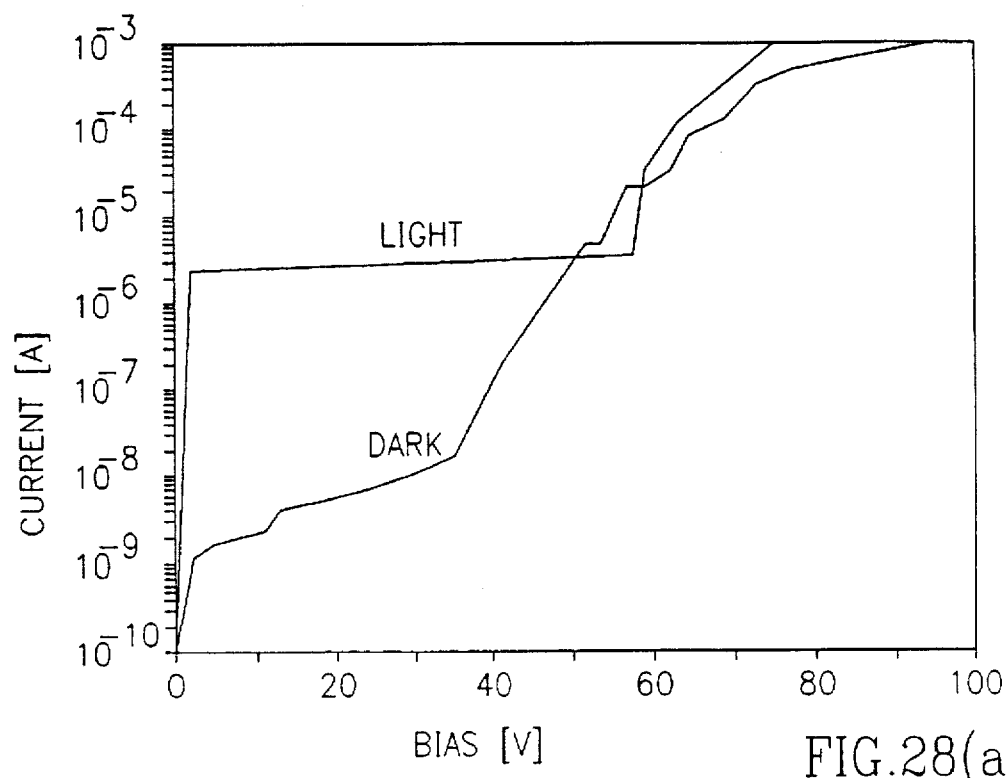
FIG. 28a shows experimental reverse I-V characteristics of diode $D_1$ (Schottky diode with area $A_1$=3×3 mm$^2$) without light irradiation ("dark") and with light irradiation ("light")
Figure 28B:
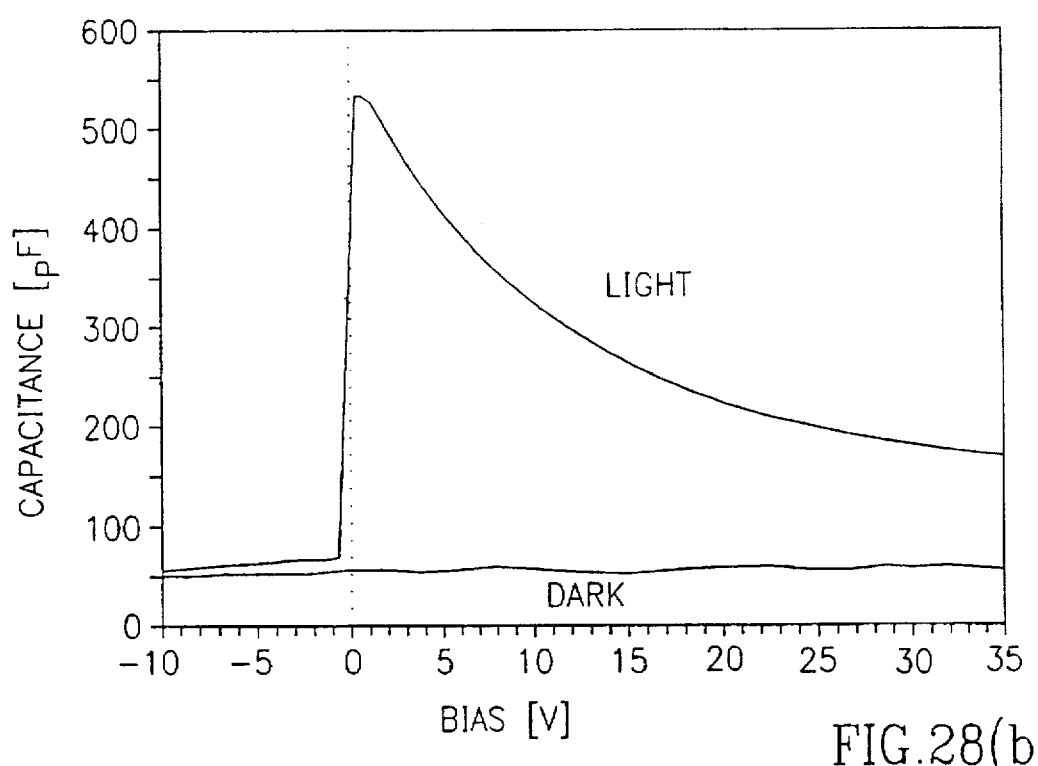
FIG. 28b shows experimental C-V characteristics of an integrated LCC under illumination ("light") and without it ("dark"); in this integrated variant a Schottky diode $D_1$ and PiN diode $D_2$ are fabricated on the same single-crystal GaAs substrate.
Figure 52A:
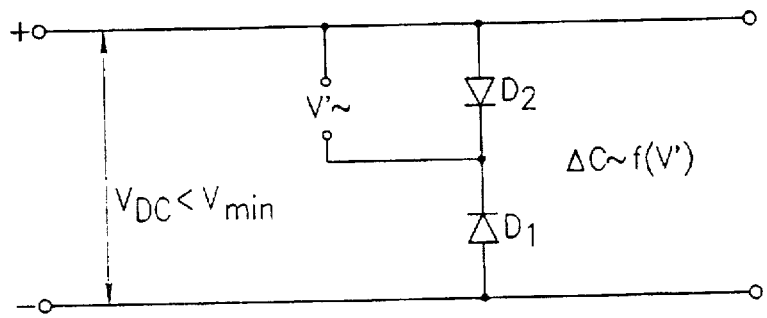
FIG. 52 depicts the control of capacitance through the control of the charge in diode $D_2$ using a separate current source.
Figure 52B:
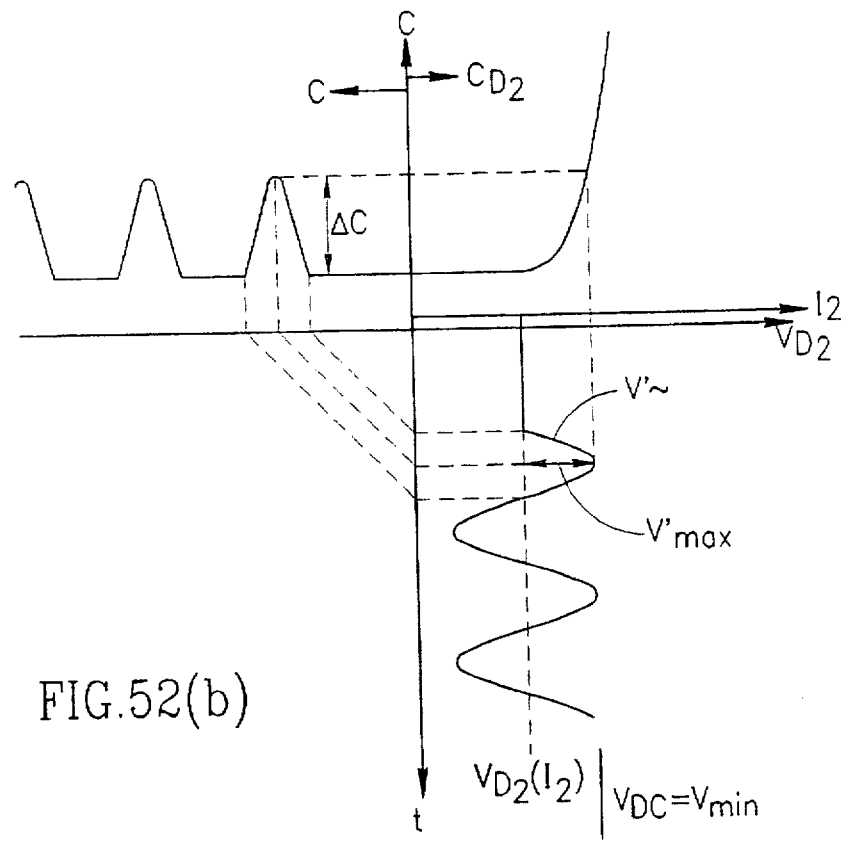

In an experimental GaAs LCC the ΔC/ΔD, V value reaches 2000 pF/V (FIG. 28c). In the construction demonstrated in FIG. 51b, a photodiode, photoresistor, and the like, can be used as the receiver of radiation. The criterion for diode $D_2$ to be used as a receiver is that the current through the diode without irradiation has to be below $I_{min}$, while under irradiation it must reach $I_{max}$ at some defined intensity $H_{max}$. It is also possible to control the capacitance by controlling the charge in diode $D_2$ using a separate current source V', as shown in FIG. 52. ΔC~V'; $\Delta C_{max} = (C_{max} - C_{min}) \cong \Delta V'_{max}$. The maximum frequency will be determined by the relaxation time of the diffusion capacitance ($\tau_d$) of diode $D_2$, and is in the range of 5–20 MHz.

For power electronics applications the preferred embodiments of controlled capacitors appear to be the light controlled capacitors. The main factors determining the usefulness of these capacitors in power electronics are power and voltage. The maximum of average power is given by Equations (62).

For GaAs PiN diodes, $f_{max} = 5$–20 MHz, and for $f_{max} = 5$ MHz one obtains:

$$P_{av,max} \cong 10^6 \Delta C \times V^2 \quad (63)$$

One can use converters as an example of a power system and separate all converters into three groups, first by operation voltage, and then by converted power.

In the case of low-voltage (up to 50 V) and low-power (up to 5 W) applications, the ΔC value obtained from Equation (63) for 5 W and 50 V is ΔC=2000 pF. For this voltage/power range the recommended design is the integrated one (FIG. 29). The area of such a structure will be about 0.3–0.5 cm$^2$. The hybrid construction of a GaAs Schottky diode with a reverse voltage above 50 V in series with a PiN diode (FIG. 43) is also a candidate.

For intermediate power (10–100 W), the area of controlled capacitors in this power range has to be between 1–10 cm$^2$. Intermediate power converters can be fabricated using a parallel connection of structures with areas of 0.3–0.5 cm$^2$ in an integrated or in a hybrid design (FIGS. 38, 47).

For high power (above 100 W) applications the application of low-voltage capacitors is not advantageous from an economic point of view.

In the case of intermediate-voltage (50–200 V) and low-power (up to 10 W) applications, a hybrid construction, composed of a high-voltage (up to 200 V) Schottky diode and a PiN diode, or of two PiN diodes with different areas and different thicknesses of i-region is the most advantageous. For an applied voltage of 200 V and 10 W, Equation

(63) gives ΔC=250 pF. For a "two PiN diode" design one can calculate the parameters of diode $D_1$ and see that to obtain the reverse voltage of 200 V, an i-region of about 5 μm is needed. Assuming the "zero" capacitance of such a diode is about 500 pF, one obtains for a bias of 200 V ΔC≅250 pF and an area of about 0.25 cm², i.e., the capacitor needed for 10 W power conversion will have an area of about 5×5 mm.

For intermediate power (10–200 W) capacitors can be made by parallel connection of an appropriate number of low-power capacitors. For example, for 200 W conversion a parallel connection of about 20 10 W capacitors is required.

For conversion of power above 200 W the application of capacitors of this voltage range is not advantageous at this time.

In the case of high-voltage (200–1000 V) and intermediate-power (about 200 W) applications, for example 1000 V, 200 W, the ΔC≅200 pF. Such a controlled capacitor can be realized through the connection of two PiN diodes, with diode $D_1$ parameters of $W_1$≅20 μm (required for reverse bias of 1000 V) and $A_1$≅0.5 cm².

For high power (1 kW and above) applications converters can be made by parallel connection of hybrid capacitors designed for 200 W. For example, for conversion of 10 KW, a about 50 elements have to be connected, each with an area of 0.5 cm². The total area of such a capacitor will be about 25 cm², rather small for this power conversion.

From a "specific power" point of view, that is, for the maximum power converted by one cm² of area, the most advantageous controlled capacitors are high voltage capacitors, because the increase of applied voltage increases the converted power significantly but does not require a significant increase in the area. For example, a capacitor designed for 2KV has about the same dimensions as a 1KV controlled capacitor, but the converted power can reach about 40KW as compared to 10 kW.

While the invention has been described with respect to a limited number of embodiments, it will be appreciated that many variations, modifications and other applications of the invention may be made.

What is claimed is:

1. A current-controlled capacitor system, comprising:
   (a) a capacitor element; and
   (b) a diode element in series with said capacitor element, said diode element being a forward-biased GaAs PiN diode having a carrier concentration in the i-region of less than about $10^{12}$ cm$^{-3}$, the system being further characterized in that:
      (o) said forward-biased diode element conducts a forward current which acts to control the forward-bias diffusion capacitance of said diode element;
      (i) said diode element has a capacitance which is less than the capacitance of said capacitor element when said diode element is under zero bias;
      (ii) said diffusion capacitance of said diode element is controlled by varying said forward current through said diode element;
      (iii) said forward current acting to control said diffusion capacitance of said diode element is selected such that the total capacitance, Cmin, of the current-controlled capacitor system is 1.1 times the zero-bias depletion capacitance, $C_j(0)$, of said diode element at some minimum value of forward current, $I_{min}$; and,
      (iv) the total capacitance, Cmax, of the current-controlled capacitor system is 0.9 times the capacitance, $C_1$, of said capacitor element at some greater value of forward current, $I_{max}$;
   wherein said capacitor element is a reverse-biased diode, having reverse-bias-voltage-dependent junction depletion capacitance, said reverse-biased diode thus serving the function of said capacitor element;
   wherein said reverse-biased diode is a GaAs Schottky diode with contact to the N-layer which includes windows in said Schottky contact and said diode element is a GaAs P⁺PiN diode, said reverse-biased diode and said diode element being integrally formed in a single crystal.

2. A current-controlled capacitor system, comprising:
   (a) a capacitor element; and
   (b) a diode element in series with said capacitor element, said diode element being a forward-biased GaAs PiN diode having a carrier concentration in the i-region of less than about $10^{12}$ cm$^{-3}$, the system being further characterized in that:
      (o) said forward-biased diode element conducts a forward current which acts to control the forward-bias diffusion capacitance of said diode element;
      (i) said diode element has a capacitance which is less than the capacitance of said capacitor element when said diode element is under zero bias;
      (ii) said diffusion capacitance of said diode element is controlled by varying said forward current through said diode element;
      (iii) said forward current acting to control said diffusion capacitance of said diode element is selected such that the total capacitance, Cmin, of the current-controlled capacitor system is 1.1 times the zero-bias depletion capacitance, $C_j(0)$, of said diode element at some minimum value of forward current, $I_{min}$; and,
      (iv) the total capacitance, Cmax, of the current-controlled capacitor system is 0.9 times the capacitance, $C_1$, of said capacitor element at some greater value of forward current, $I_{max}$;
   wherein said capacitor element is a reverse-biased diode, having reverse-bias-voltage-dependent junction depletion capacitance, said reverse-biased diode thus serving the function of said capacitor element;
   wherein said reverse-biased diode is a PN diode with contact to the P-layer which includes windows into said contact and into said P-layer down to said adjoining N-layer, and said diode element is a GaAs P⁺PiN diode, said reverse-biased diode and said diode element being integrally formed in a single crystal.

3. A current-controlled capacitor system, comprising:
   (a) a capacitor element; and
   (b) a diode element in series with said capacitor element, said diode element being a forward-biased GaAs PiN diode having a carrier concentration in the i-region of less than about $10^{12}$ cm$^{-3}$, the system being further characterized in that:
      (o) said forward-biased diode element conducts a forward current which acts to control the forward-bias diffusion capacitance of said diode element;
      (i) said diode element has a capacitance which is less than the capacitance of said capacitor element when said diode element is under zero bias;
      (ii) said diffusion capacitance of said diode element is controlled by varying said forward current through said diode element;
      (iii) said forward current acting to control said diffusion capacitance of said diode element is selected such that the total capacitance, Cmin, of the current-controlled capacitor system is 1.1 times the zero-bias depletion capacitance, $C_j(0)$, of said diode element at some minimum value of forward current, $I_{min}$; and, (iv) the total capacitance, Cmax, of the current-controlled capacitor system is 0.9 times the capacitance, $C_1$, of said capacitor element at some greater value of forward current, $I_{max}$;

wherein said capacitor element is a reverse-biased diode, having reverse-bias-voltage-dependent junction depletion capacitance, said reverse-biased diode thus serving the function of said capacitor element;

wherein said diode element is a GaAs PiN structure grown on a $N^+$ substrate and having an ohmic contact to the N-layer, said reverse-biased diode being the $N^+P$ junction, where said $N^+$ portion of said $N^+P$ junction is said $N^+$ substrate, with said reverse-biased diode and said diode element being integrally formed in a single crystal.

4. A current-controlled capacitor system, comprising:
(a) a capacitor element; and
(b) a diode element in series with said capacitor element, said diode element being a forward-biased GaAs PiN diode having a carrier concentration in the i-region of less than about $10^{12}$ cm$^{-3}$, the system being further characterized in that:
(o) said forward-biased diode element conducts a forward current which acts to control the forward-bias diffusion capacitance of said diode element;
(i) said diode element has a capacitance which is less than the capacitance of said capacitor element when said diode element is under zero bias;
(ii) said diffusion capacitance of said diode element is controlled by varying said forward current through said diode element;
(iii) said forward current acting to control said diffusion capacitance of said diode element is selected such that the total capacitance, Cmin, of the current-controlled capacitor system is 1.1 times the zero-bias depletion capacitance, $C_j(0)$, of said diode element at some minimum value of forward current, $I_{min}$; and,
(iv) the total capacitance, Cmax, of the current-controlled capacitor system is 0.9 times the capacitance, $C_1$, of said capacitor element at some greater value of forward current, $I_{max}$;

wherein said capacitor element is a reverse-biased diode, having reverse-bias-voltage-dependent junction depletion capacitance, said reverse-biased diode thus serving the function of said capacitor element;

wherein said diode element is a GaAs PiN structure grown on an $N^+$ substrate and having a Schottky barrier with the N-layer, said reverse-biased diode being the $N^+P$ junction and Schottky barrier, with said reverse-biased diode and said diode element being integrally formed in a single crystal.

5. A current-controlled capacitor system, comprising:
(a) a capacitor element; and
(b) a diode element in series with said capacitor element, said diode element being a forward-biased GaAs PiN diode having a carrier concentration in the i-region of less than about $10^{12}$ cm$^{-3}$, the system being further characterized in that:
(o) said forward-biased diode element conducts a forward current which acts to control the forward-bias diffusion capacitance of said diode element;
(i) said diode element has a capacitance which is less than the capacitance of said capacitor element when said diode element is under zero bias;
(ii) said diffusion capacitance of said diode element is controlled by varying said forward current through said diode element;
(iii) said forward current acting to control said diffusion capacitance of said diode element is selected such that the total capacitance, Cmin, of the current-controlled capacitor system is 1.1 times the zero-bias depletion capacitance, $C_j(0)$, of said diode element at some minimum value of forward current, $I_{min}$; and,
(iv) the total capacitance, Cmax, of the current-controlled capacitor system is 0.9 times the capacitance, $C_1$, of said capacitor element at some greater value of forward current, $I_{max}$;

wherein said capacitor element is a reverse-biased diode, having reverse-bias-voltage-dependent junction depletion capacitance, said reverse-biased diode thus serving the function of the capacitor element;

wherein a plurality of systems wherein said reverse-biased diode is a GaAs Schottky diode with contact to the N-layer which includes windows in said Schottky contact and said diode element is a GaAs $P^+PiN$ diode, said reverse-biased diode and said diode element being integrally formed in a single crystal are grown on a single $P^+$ substrate so as to be separated from each other by etching down to the P-layer, so as to form an integrated matrix of controlled capacitors.

6. A current-controlled capacitor system, comprising:
(a) a capacitor element; and
(b) a diode element in series with said capacitor element, said diode element being a forward-biased GaAs PiN diode having a carrier concentration in the i-region of less than about $10^{12}$ cm$^{-3}$, the system being further characterized in that:
(o) said forward-biased diode element conducts a forward current which acts to control the forward-bias diffusion capacitance of said diode element;
(i) said diode element has a capacitance which is less than the capacitance of said capacitor element when said diode element is under zero bias;
(ii) said diffusion capacitance of said diode element is controlled by varying said forward current through said diode element;
(iii) said forward current acting to control said diffusion capacitance of said diode element is selected such that the total capacitance, Cmin, of the current-controlled capacitor system is 1.1 times the zero-bias depletion capacitance, $C_j(0)$, of said diode element at some minimum value of forward current, $I_{min}$; and,
(iv) the total capacitance, Cmax, of the current-controlled capacitor system is 0.9 times the capacitance, $C_1$, of said capacitor element at some greater value of forward current, $I_{max}$;

wherein said capacitor element is a reverse-biased diode, having reverse-bias-voltage-dependent junction depletion capacitance, said reverse-biased diode thus serving the function of said capacitor element;

wherein said reverse-biased diode is a PN diode with contact to the P-layer which includes windows into said contact and into said P-layer down to said adjoining N-layer, and said diode element is a GaAs $P^+PiN$ diode, said reverse-biased diode and said diode element being integrally formed in a single crystal are grown on a single $P^+$ substrate so as to be separated from each other by etching down to the P-layer of said $P^+PiN$ diode, so as to form an integrated matrix of controlled capacitors.

7. A current-controlled capacitor system, comprising:
a capacitor element; and (b) a diode element in series with said capacitor element, said diode element being a forward-biased GaAs Schottky diode, the system being further characterized in that:
   (o) said forward-biased diode element conducts a forward current which acts to control the forward-bias diffusion capacitance of said diode element;
   (i) said diode element has a capacitance which is less than the capacitance of said capacitor element when said diode element is under zero bias;
   (ii) said diffusion capacitance of said diode element is controlled by varying said forward current through said diode element;
   (iii) said forward current acting to control said diffusion capacitance of said diode element is selected such that the total capacitance, Cmin, of the current-controlled capacitor system is 1.1 times the zero-bias depletion capacitance, $C_d(0)$, of said diode element at some minimum value of forward current, $I_{min}$; and,
   (iv) the total capacitance, Cmax, of the current-controlled capacitor system is 0.9 times the capacitance, $C_1$, of said capacitor element at some greater value of forward current, $I_{max}$;
wherein said capacitor element is a reverse-biased diode, having reverse-bias-voltage-dependent junction depletion capacitance, said reverse-biased diode thus serving the function of said capacitor element;
wherein said reverse-biased diode is a GaAs P⁺PiN diode, said reverse-biased diode being fabricated by growing a GaAs PiN structure on a P⁺ substrate, and wherein said diode element is a Schottky barrier to the N-layer, the cross sectional area of said Schottky barrier being smaller than that of the P⁺PiN diode GaAs.

8. A system as in claim 7 wherein said reverse-biased diode is a GaAs P⁺PiN diode with an ohmic contact to the N-layer which includes windows in said ohmic contact and in said N-layer down to the i-layer.

9. A current-controlled capacitor system, comprising:
   (a) a capacitor element; and
   (b) a diode element in series with said capacitor element, said diode element being a forward-biased GaAs Schottky diode, the system being further characterized in that:
      (o) said forward-biased diode element conducts a forward current which acts to control the forward-bias diffusion capacitance of said diode element;
      (i) said diode element has a capacitance which is less than the capacitance of said capacitor element when said diode element is under zero bias;
      (ii) said diffusion capacitance of said diode element is controlled by varying said forward current through said diode element;
      (iii) said forward current acting to control said diffusion capacitance of said diode element is selected such that the total capacitance, Cmin, of the current-controlled capacitor system is 1.1 times the zero-bias depletion capacitance, $C_d(0)$, of said diode element at some minimum value of forward current, $I_{min}$; and,
      (iv) the total capacitance, Cmax, of the current-controlled capacitor system is 0.9 times the capacitance, $C_1$, of said capacitor element at some greater value of forward current, $I_{max}$;

wherein said capacitor element is a reverse-biased diode, having reverse-bias-voltage-dependent junction depletion capacitance, said reverse-biased diode thus serving the function of said capacitor element;

wherein said reverse-biased diode is a GaAs P⁺PiN diode, said reverse-biased diode being fabricated by growing a GaAs PiN structure on a P⁺ substrate, and wherein said diode element is a Schottky barrier to the N-layer, the cross sectional area of said Schottky barrier being smaller than that of the P⁺PiN diode, wherein a plurality of structures are grown on a single P⁺ substrate and are separated from each other by etching down to the i-layer of the P⁺PiN structure.

10. A system as in claim 9 wherein said reverse-biased diode GaAs P⁺PiN diode has an ohmic contact to the N-layer which includes windows in said ohmic contact and in said N-layer down to the i-layer.

11. A current-controlled capacitor system, comprising:
   (a) a capacitor element; and
   (b) a diode element in series with said capacitor element, said diode element being a forward-biased GaAs PiN diode having a carrier concentration in the i-region of less than about $10^{12}$ cm$^{-3}$, the system being further characterized in that:
      (o) said forward-biased diode element conducts a forward current which acts to control the forward-bias diffusion capacitance of said diode element;
      (i) said diode element has a capacitance which is less than the capacitance of said capacitor element when said diode element is under zero bias;
      (ii) said diffusion capacitance of said diode element is controlled by varying said forward current through said diode element;
      (iii) said forward current acting to control said diffusion capacitance of said diode element is selected such that the total capacitance, Cmin, of the current-controlled capacitor system is 1.1 times the zero-bias depletion capacitance, $C_d(0)$, of said diode element at some minimum value of forward current, $I_{min}$; and,
      (iv) the total capacitance, Cmax, of the current-controlled capacitor system is 0.9 times the capacitance, $C_1$, of said capacitor element at some greater value of forward current, $I_{max}$;

wherein said GaAs PiN diode element structure grown on a first surface of a GaAs substrate having first and second surfaces, and said capacitor element is a reverse-biased PiN diode, said reverse-biased PiN diode being formed on said second surface of said GaAs substrate, with said reverse-biased PiN diode and said diode element thereby being integrally formed in a single said GaAs substrate, on opposite surfaces of said single GaAs substrate.

12. A system as in claim 11 wherein said reverse-biased diode is a GaAs P⁺PiN diode with an ohmic contact to the N-layer which includes windows in said ohmic contact and in said N-layer down to the i-layer.

13. A system as in claim 4 wherein said Schottky barrier of said reverse-biased diode is transparent.

* * * * *